United States Patent
Hirayama et al.

(10) Patent No.: US 10,101,658 B2
(45) Date of Patent: Oct. 16, 2018

(54) RESIST COMPOSITION AND METHOD OF FORMING RESIST PATTERN

(71) Applicant: Tokyo Ohka Kogyo Co., Ltd., Kawawsaki-shi (JP)

(72) Inventors: Taku Hirayama, Kawasaki (JP); Daisuke Kawana, Kawasaki (JP); Shogo Matsumaru, Kawasaki (JP); Kenta Suzuki, Kawasaki (JP); Takashi Kamizono, Kawasaki (JP); Masahito Yahagi, Kawasaki (JP); Tatsuya Fujii, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/995,987

(22) Filed: Jan. 14, 2016

(65) Prior Publication Data
US 2016/0209745 A1    Jul. 21, 2016

(30) Foreign Application Priority Data

Jan. 16, 2015 (JP) ................. 2015-006694
Jan. 16, 2015 (JP) ................. 2015-006715
Jan. 16, 2015 (JP) ................. 2015-006716

(51) Int. Cl.
G03F 7/039 (2006.01)
G03F 7/004 (2006.01)
G03F 7/20 (2006.01)
G03F 7/32 (2006.01)

(52) U.S. Cl.
CPC .......... *G03F 7/0397* (2013.01); *G03F 7/0045* (2013.01); *G03F 7/2041* (2013.01); *G03F 7/322* (2013.01); *G03F 7/325* (2013.01)

(58) Field of Classification Search
None
See application file for complete search history.

(56) References Cited

U.S. PATENT DOCUMENTS

| | | | |
|---|---|---|---|
| 7,537,880 B2 | 5/2009 | Harada et al. | |
| 8,389,202 B2 | 3/2013 | Maruyama et al. | |
| 8,609,319 B2 | 12/2013 | Kimura et al. | |
| 9,023,584 B2 | 5/2015 | Maruyama | |
| 9,200,098 B2 | 12/2015 | Maruyama | |
| 2003/0008241 A1* | 1/2003 | Sato ............. | G03F 7/0045 430/287.1 |
| 2005/0064329 A1* | 3/2005 | Takahashi ...... | G03F 7/0045 430/270.1 |
| 2007/0275324 A1 | 11/2007 | Allen et al. | |
| 2009/0197204 A1 | 8/2009 | Shiono et al. | |
| 2009/0317743 A1 | 12/2009 | Shiono et al. | |
| 2010/0015552 A1* | 1/2010 | Kawaue ......... | C07C 309/09 430/281.1 |
| 2010/0129738 A1* | 5/2010 | Takemura ....... | C08F 220/30 430/5 |
| 2010/0167200 A1 | 7/2010 | Choi et al. | |
| 2010/0227274 A1 | 9/2010 | Hatakeyama et al. | |
| 2010/0310985 A1 | 12/2010 | Mori et al. | |
| 2010/0310987 A1* | 12/2010 | Maruyama ....... | C08F 220/18 430/270.1 |
| 2011/0117499 A1 | 5/2011 | Matsumiya et al. | |

(Continued)

FOREIGN PATENT DOCUMENTS

JP    2002-268223 A    9/2002
JP    2009-114381 A    5/2009

(Continued)

OTHER PUBLICATIONS

Office Action in U.S. Appl. No. 15/174,216, dated Jul. 20, 2017.
Final Office Action in U.S. Appl. No. 15/174,216, dated Nov. 1, 2017.
Office Action in U.S. Appl. No. 15/174,216, dated Mar. 15, 2018.
Shimizu corp, "pKa and Dissociation equilibrium", 3 pages(no date).

(Continued)

*Primary Examiner* — Sin J Lee
(74) *Attorney, Agent, or Firm* — Knobbe Martens Olson & Bear LLP

(57) ABSTRACT

A resist composition which generates acid upon exposure and exhibits changed solubility in a developing solution under action of acid, the resist composition including a base component (A) which exhibits changed solubility in a developing solution under action of acid and an acid generator (B) which generates acid upon exposure, the base component (A) including a resin component having a structural unit (a0) represented by general formula (a0-1) shown below, and the acid generator component (B) containing a compound having a cation moiety having an electron withdrawing group (wherein R represents a hydrogen atom, an alkyl group of 1 to 5 carbon atoms or a halogenated alkyl group of 1 to 5 carbon atoms; Ya represents a carbon atom; Xa represents an atomic group required to form an alicyclic hydrocarbon group with Ya; and $Ra^{01}$ represents an aromatic hydrocarbon group optionally having a substituent).

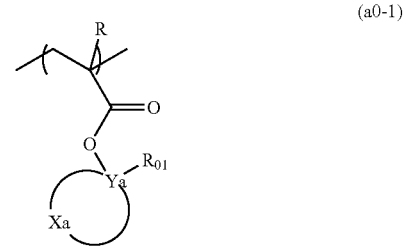

(a0-1)

20 Claims, No Drawings

(56) References Cited

U.S. PATENT DOCUMENTS

| | | | |
|---|---|---|---|
| 2012/0082935 A1 | 4/2012 | Kimura et al. | |
| 2012/0164578 A1 | 6/2012 | Kurosawa et al. | |
| 2012/0164582 A1 | 6/2012 | Maruyama | |
| 2012/0178024 A1 | 7/2012 | Maruyama et al. | |
| 2012/0258402 A1 | 10/2012 | Sato et al. | |
| 2013/0065180 A1 | 3/2013 | Kurosawa et al. | |
| 2013/0115554 A1* | 5/2013 | Takaki | C07C 233/92 430/283.1 |
| 2013/0143159 A1 | 6/2013 | Iwashita et al. | |
| 2013/0157201 A1 | 6/2013 | Takaki et al. | |
| 2013/0183621 A1 | 7/2013 | Ohashi et al. | |
| 2013/0260313 A1 | 10/2013 | Allen et al. | |
| 2013/0280658 A1 | 10/2013 | Maruyama | |
| 2014/0357896 A1 | 12/2014 | Suzuki et al. | |
| 2015/0268556 A1 | 9/2015 | Domon et al. | |
| 2016/0209745 A1 | 7/2016 | Hirayama et al. | |
| 2016/0363860 A1* | 12/2016 | Hirayama | G03F 7/0388 |
| 2016/0376233 A1* | 12/2016 | Yamazaki | G03F 7/039 430/270.1 |
| 2017/0059994 A1* | 3/2017 | Sato | G03F 7/322 |
| 2017/0369697 A1 | 12/2017 | Yahagi et al. | |
| 2017/0369698 A1 | 12/2017 | Suzuki et al. | |
| 2018/0024433 A1 | 1/2018 | Komuro et al. | |
| 2018/0067394 A1 | 3/2018 | Yamada et al. | |

FOREIGN PATENT DOCUMENTS

| | | |
|---|---|---|
| JP | 2010-002870 A | 1/2010 |
| JP | 2010-032994 A | 2/2010 |
| JP | 2010-277043 A | 12/2010 |
| JP | 2011-013569 A | 1/2011 |
| JP | 2011-128226 A | 6/2011 |
| JP | 2012-093741 A | 5/2012 |
| JP | 2012-220800 A | 11/2012 |
| JP | 2013-053196 A | 3/2013 |
| JP | 2013-080109 A | 5/2013 |
| JP | 2013-161060 A | 8/2013 |
| JP | 5692229 | 4/2015 |
| WO | WO 2002/092559 | 11/2002 |
| WO | WO 2002/092559 | 8/2004 |
| WO | WO 2008/066011 | 3/2010 |
| WO | WO 2010/095698 A1 | 8/2010 |
| WO | WO 2011/030737 A1 | 3/2011 |
| WO | WO 2011/040175 A1 | 4/2011 |
| WO | WO 2012/070548 A1 | 5/2012 |
| WO | WO 2013/031878 | 3/2013 |
| WO | WO 2013/042694 A1 | 3/2013 |
| WO | WO 2012/002470 | 8/2013 |

OTHER PUBLICATIONS

Office Action in Japanese Patent Application No. 2015-006694, dated Jul. 17, 2018.

Office Action in Japanese Patent Application No. 2015-006715, dated Jul. 24, 2018.

Office Action in Japanese Patent Application No. 2015-006716, dated Aug. 7, 2018.

* cited by examiner

RESIST COMPOSITION AND METHOD OF FORMING RESIST PATTERN

TECHNICAL FIELD

The present invention relates to a resist composition and a method of forming a resist pattern.

Priority is claimed on Japanese Patent Application Nos. 2015-006694, 2015-006715 and 2015-006716, filed Jan. 16, 2015, the contents of which are incorporated herein by reference.

DESCRIPTION OF RELATED ART

In lithography techniques, for example, a resist film composed of a resist material is formed on a substrate, and the resist film is subjected to selective exposure, followed by development, thereby forming a resist pattern having a predetermined shape on the resist film. A resist material in which the exposed portions of the resist film become soluble in a developing solution is called a positive-type, and a resist material in which the exposed portions of the resist film become insoluble in a developing solution is called a negative-type.

In recent years, in the production of semiconductor elements and liquid crystal display elements, advances in lithography techniques have led to rapid progress in the field of pattern miniaturization.

Typically, these miniaturization techniques involve shortening the wavelength (increasing the energy) of the exposure light source. Conventionally, ultraviolet radiation typified by g-line and i-line radiation has been used, but nowadays KrF excimer lasers and ArF excimer lasers are starting to be introduced in mass production. Furthermore, research is also being conducted into lithography techniques that use an exposure light source having a wavelength shorter (energy higher) than these excimer lasers, such as electron beam (EB), extreme ultraviolet radiation (EUV), and X ray.

In addition, currently, as the resist material in EUV lithography and EB lithography, chemically amplified resists proposed for KrF excimer laser and ArF excimer laser have been generally used since such chemically amplified resists exhibit excellent lithography properties, such as sensitivity to EUV and EB, and resolution sufficient to form a fine resist pattern as a target. In particular, chemically amplified resist containing an acrylic resin as the base material are known to be advantageous in such lithography properties.

One of the problems in EUV exposure is acid diffusion control. For controlling acid diffusion, the anion structure of the acid generator is generally changed. Acid generators having an anion structure with a short acid diffusion length are already applied.

For further controlling acid diffusion, methods in which polymeric compounds are variously changed have been employed.

For example, in Patent Literatures 1 to 4, there are described resist compositions in which a polymeric compound having a specific acid dissociable functional group is used to improve the reactivity to acid, thereby contributing to improvement of solubility in a developing solution. Moreover, a method in which the glass transition temperature (hereafter, referred to as "Tg") of a polymeric compound in a resist composition is raised has been employed.

DOCUMENTS OF RELATED ART

Patent Literature

[Patent Literature 1] WO2013/042694
[Patent Literature 2] Japanese Unexamined Patent Application, First Publication No. 2009-114381
[Patent Literature 3] Japanese Unexamined Patent Application, First Publication No. 2012-220800
[Patent Literature 4] WO2010/095698

SUMMARY OF THE INVENTION

For raising the Tg of a polymeric compound in a resist composition, structure containing an aromatic group, a norbornene group or an adamantyl group can be considered. However, in the case where a protection group or a structural unit having such structure is introduced, the hydrophobicity is increased, so as to cause decrease in the dissolution rate of the exposed portions. Further, due to the decrease in the solubility in a developing solution, the resolution and LWR are deteriorated.

In addition, there was still room for improvement in designing a polymeric compound in a resist composition, such as improving the acid diffusion control of the resist material.

The present invention has been developed in light of the circumstances described above, and has an object of providing a resist composition in which the polymeric compound in the resist composition has a predetermined design, so as to obtain good control of acid diffusion and excellent lithography properties; and a method of forming a resist pattern A first aspect of the present invention is a resist composition which generates acid upon exposure and exhibits changed solubility in a developing solution under action of acid, the resist composition including a base component (A) which exhibits changed solubility in a developing solution under action of acid and an acid generator (B) which generates acid upon exposure, the base component (A) including a resin component having a structural unit (a0) represented by general formula (a0-1) shown below, and the acid generator component (B) containing a compound having a cation moiety having an electron withdrawing group.

[Chemical Formula 1]

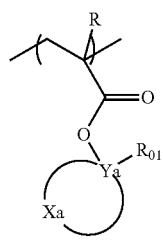

(a0-1)

In the formulae, R represents a hydrogen atom, an alkyl group of 1 to 5 carbon atoms or a halogenated alkyl group of 1 to 5 carbon atoms; Ya represents a carbon atom; Xa represents an atomic group required to form an alicyclic hydrocarbon group with Ya; and $Ra^{01}$ represents an aromatic hydrocarbon group optionally having a substituent.

A second aspect of the present invention is a method of forming a resist pattern, including: using a resist composition according to the first aspect to form a resist film on a substrate, subjecting the resist film to exposure, and subjecting the resist film to developing to form a resist pattern.

A third aspect of the present invention is a resist composition which generates acid upon exposure and exhibits changed solubility in a developing solution under action of acid, and which includes a base component (A') which exhibits changed solubility in a developing solution under action of acid and an acid diffusion control agent (D'), the base component (A') including a resin component containing a structural unit (a0) represented by general formula (a0-1) and a structural unit (a2') derived from an acrylate ester monomer having a log P value of less than 1.2, and the acid diffusion control agent (D') having an acid dissociation constant of 1.5 or more.

A fourth aspect of the present invention is a method of forming a resist pattern, including: using a resist composition according to the third aspect to form a resist film on a substrate, subjecting the resist film to exposure, and subjecting the resist film to developing to form a resist pattern.

A fifth aspect of the present invention is a resist composition which generates acid upon exposure and exhibits changed solubility in a developing solution under action of acid, and which includes a base component (A") which exhibits changed solubility in a developing solution under action of acid, the base component (A") including a resin component having a structural unit (a0) represented by general formula (a0-1) and a structural unit (a9) represented by general formula (a9-1) shown below.

[Chemical Formula 2]

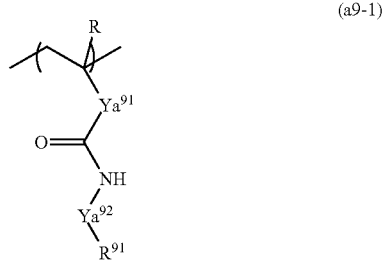

(a9-1)

In the formula, R is the same as defined above; $Ya^{91}$ represents a single bond or a divalent linking group; $R^{91}$ represents a hydrocarbon group optionally having a substituent; and $Ya^{92}$ represents a divalent linking group.

A sixth aspect of the present invention is a method of forming a resist pattern, including: using a resist composition according to the fifth aspect to form a resist film on a substrate, subjecting the resist film to exposure, and subjecting the resist film to developing to form a resist pattern.

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified.

The term "alkylene group" includes linear, branched or cyclic, divalent saturated hydrocarbon, unless otherwise specified. The same applies for the alkyl group within an alkoxy group.

A "halogenated alkyl group" is a group in which part or all of the hydrogen atoms of an alkyl group is substituted with a halogen atom. Examples of the halogen atom include a fluorine atom, a chlorine atom, a bromine atom and an iodine atom.

A "fluorinated alkyl group" or a "fluorinated alkylene group" is a group in which part or all of the hydrogen atoms of an alkyl group or an alkylene group have been substituted with a fluorine atom.

The term "structural unit" refers to a monomer unit that contributes to the formation of a polymeric compound (resin, polymer, copolymer).

A "structural unit derived from an acrylate ester" refers to a structural unit that is formed by the cleavage of the ethylenic double bond of an acrylate ester.

An "acrylate ester" refers to a compound in which the terminal hydrogen atom of the carboxy group of acrylic acid ($CH_2$=CH—COOH) has been substituted with an organic group.

The acrylate ester may have the hydrogen atom bonded to the carbon atom on the α-position substituted with a substituent. The substituent ($R^\alpha$) with which the hydrogen atom bonded to the carbon atom at the α-position is substituted is an atom other than the hydrogen atom or a group, and examples thereof include an alkyl group having from 1 to 5 carbon atoms, a halogenated alkyl group having from 1 to 5 carbon atoms, and a hydroxyalkyl group. A carbon atom on the α-position of an acrylate ester refers to the carbon atom bonded to the carbonyl group, unless specified otherwise.

Hereafter, an acrylate ester having the hydrogen atom bonded to the carbon atom on the α-position substituted with a substituent is sometimes referred to as "α-substituted acrylate ester". Further, acrylate esters and α-substituted acrylate esters are collectively referred to as "(α-substituted) acrylate ester".

A "structural unit derived from hydroxystyrene or a hydroxystyrene derivative" refers to a structural unit that is formed by the cleavage of the ethylenic double bond of hydroxystyrene or a hydroxystyrene derivative.

The term "hydroxystyrene derivative" includes compounds in which the hydrogen atom at the α-position of hydroxystyrene has been substituted with another substituent such as an alkyl group or a halogenated alkyl group; and derivatives thereof. Examples of the derivatives thereof include hydroxystyrene in which the hydrogen atom of the hydroxy group has been substituted with an organic group and may have the hydrogen atom on the α-position substituted with a substituent; and hydroxystyrene which has a substituent other than a hydroxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

As the substituent which substitutes the hydrogen atom on the α-position of hydroxystyrene, the same substituents as those described above for the substituent on the α-position of the aforementioned α-substituted acrylate ester can be mentioned.

A "structural unit derived from vinylbenzoic acid or a vinylbenzoic acid derivative" refers to a structural unit that is formed by the cleavage of the ethylenic double bond of vinylbenzoic acid or a vinylbenzoic acid derivative.

The term "vinylbenzoic acid derivative" includes compounds in which the hydrogen atom at the α-position of vinylbenzoic acid has been substituted with another substituent such as an alkyl group or a halogenated alkyl group; and derivatives thereof. Examples of the derivatives thereof include benzoic acid in which the hydrogen atom of the carboxy group has been substituted with an organic group and may have the hydrogen atom on the α-position substituted with a substituent; and benzoic acid which has a substituent other than a hydroxy group and a carboxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

The term "styrene" is a concept including styrene and compounds in which the hydrogen atom at the α-position of styrene is substituted with other substituent such as an alkyl group and a halogenated alkyl group.

A "structural unit derived from styrene" or "structural unit derived from a styrene derivative" refers to a structural unit that is formed by the cleavage of the ethylenic double bond of styrene or a styrene derivative.

As the alkyl group as a substituent on the α-position, a linear or branched alkyl group is preferable, and specific examples include alkyl groups of 1 to 5 carbon atoms, such as a methyl group, an ethyl group, a propyl group, an isopropyl group, an n-butyl group, an isobutyl group, a tert-butyl group, a pentyl group, an isopentyl group and a neopentyl group.

Specific examples of the halogenated alkyl group as the substituent on the α-position include groups in which part or all of the hydrogen atoms of the aforementioned "alkyl group as the substituent on the α-position" are substituted with halogen atoms. Examples of the halogen atom include a fluorine atom, a chlorine atom, a bromine atom and an iodine atom, and a fluorine atom is particularly desirable.

Specific examples of the hydroxyalkyl group as the substituent on the α-position include groups in which part or all of the hydrogen atoms of the aforementioned "alkyl group as the substituent on the α-position" are substituted with a hydroxy group. The number of hydroxy groups within the hydroxyalkyl group is preferably 1 to 5, and most preferably 1.

The case of describing "may have a substituent" includes both of the case where the hydrogen atom (—H) is substituted with a monovalent group and the case where the methylene group (—CH$_2$—) is substituted with a divalent group.

The term "exposure" is used as a general concept that includes irradiation with any form of radiation.

According to the present invention, there are provided a resist composition in which the polymeric compound in the resist composition has a predetermined design, so as to obtain good control of acid diffusion and excellent lithography properties; and a method of forming a resist pattern.

DETAILED DESCRIPTION OF THE INVENTION

<<First Aspect: Resist Composition>>

The resist composition according to a first aspect of the present invention generates acid upon exposure and exhibits changed solubility in a developing solution under action of acid, the resist composition including a base component (A) which exhibits changed solubility in a developing solution under action of acid and an acid generator (B) which generates acid upon exposure, the base component (A) including a resin component having a structural unit (a0) represented by general formula (a0-1) shown below, and the acid generator component (B) containing a compound having a cation moiety having an electron withdrawing group.

In the present embodiment, the resist composition contains a base component (A) (hereafter, referred to as "base component (A)") which exhibits changed solubility in a developing solution.

In the present embodiment, the component (A) may be constituted of a single polymeric compound, or constituted of a plurality of polymeric compounds.

Specifically, the component (A) may contain a polymeric compound (A1) having the structural unit (a0) and a polymeric compound (A2) having a structural unit (a9) described later.

When a resist film is formed using the resist composition and the formed resist film is subjected to a selective exposure, acid is generated at exposed portions, and the generated acid acts on the component (A) to change the solubility of the component (A) in a developing solution, whereas the solubility of the component (A) in a developing solution is not changed at unexposed portions, thereby generating difference in solubility in a developing solution between exposed portions and unexposed portions. Therefore, by subjecting the resist film to development, the exposed portions are dissolved and removed to form a positive-tone resist pattern in the case of a positive resist, whereas the unexposed portions are dissolved and removed to form a negative-tone resist pattern in the case of a negative resist.

In the present specification, a resist composition which forms a positive resist pattern by dissolving and removing the exposed portions is called a positive resist composition, and a resist composition which forms a negative resist pattern by dissolving and removing the unexposed portions is called a negative resist composition.

In the present embodiment, the resist composition may be either a positive resist composition or a negative resist composition.

Further, in the present embodiment, the resist composition may be applied to an alkali developing process using an alkali developing solution in the developing treatment, or a solvent developing process using a developing solution containing an organic solvent (organic developing solution) in the developing treatment, and preferably a solvent developing process.

In the present embodiment, the resist composition has a function of generating acid upon exposure, and in the resist composition, the component (A) may generate acid upon exposure, or an additive component other than the component (A) may generate acid upon exposure.

More specifically, in the present embodiment, the resist composition may be a resist composition (1) containing an acid generator component (B) which generates acid upon exposure (hereafter, referred to as "component (B)";

a resist composition (2) in which the component (A) is a component which generates acid upon exposure; or a resist composition (3) in which the component (A) is a component which generates acid upon exposure, and further containing an acid generator component (B).

That is, when the resist composition of the present invention is the aforementioned resist composition (2) or (3), the component (A) is a "base component which generates acid upon exposure and exhibits changed solubility in a developing solution under action of acid". In the case where the component (A) is a base component which generates acid upon exposure and exhibits changed solubility in a developing solution under action of acid, the component (A1) described later is preferably a polymeric compound which generates acid upon exposure and exhibits changed solubility in a developing solution under action of acid. As the polymeric compound, a resin having a structural unit which generates acid upon exposure can be used. As the structural unit which generates acid upon exposure, a conventional structural unit can be used.

In the present embodiment, it is particularly desirable that the resist composition is the aforementioned resist composition (1).

<Component (A)>

In the present invention, the term "base component" refers to an organic compound capable of forming a film, and is preferably an organic compound having a molecular weight of 500 or more. When the organic compound has a molecular weight of 500 or more, the film-forming ability is improved, and a photosensitive resin pattern of nano level can be easily formed.

The organic compound used as the base component is broadly classified into non-polymers and polymers.

In general, as a non-polymer, any of those which have a molecular weight in the range of 500 to less than 4,000 is used. Hereafter, a "low molecular weight compound" refers to a non-polymer having a molecular weight in the range of 500 to less than 4,000.

As a polymer, any of those which have a molecular weight of 1,000 or more is generally used. Hereafter, a "resin" refers to a polymer having a molecular weight of 1,000 or more.

As the molecular weight of the polymer, the weight average molecular weight in terms of the polystyrene equivalent value determined by gel permeation chromatography (GPC) is used.

As the component (A'), a resin, a low molecular weight compound, or a combination thereof may be used.

The component (A) may be a resin that exhibits increased solubility in a developing solution under action of acid or a resin that exhibits decreased solubility in a developing solution under action of acid.

In the present invention, the component (A) may be a component that generates acid upon exposure.

(Structural Unit (a0))

In the present embodiment, the component (A) contains a resin component having a structural unit (a0) represented by general formula (a0-1) shown below.

[Chemical Formula 3]

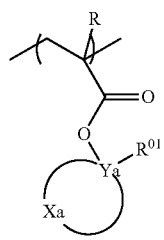

(a0-1)

In the formulae, R represents a hydrogen atom, an alkyl group of 1 to 5 carbon atoms or a halogenated alkyl group of 1 to 5 carbon atoms; Ya represents a carbon atom; Xa represents an atomic group required to form an alicyclic hydrocarbon group with Ya; and $Ra^{01}$ represents an aromatic hydrocarbon group optionally having a substituent.

In the aforementioned formula (a0-1), as the alkyl group of 1 to 5 carbon atoms for R, a linear or branched alkyl group of 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group and a neopentyl group. The halogenated alkyl group of 1 to 5 carbon atoms represented by R is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In general formula (a0-1), the number of carbon atoms of the alicyclic hydrocarbon group formed of Xa and Ya is not particularly limited, but is preferably 5 to 25, more preferably 5 to 20, and still more preferably 5 to 15.

The alicyclic hydrocarbon group may be monocyclic or polycyclic. Specific examples of the structure of the alicyclic portion include structures of formulae (Xa-1) to (Xa-50) shown below.

[Chemical Formula 4]

(Xa-1)

(Xa-2)

(Xa-3)

(Xa-4)

(Xa-5)

(Xa-6)

(Xa-7)

(Xa-8)

(Xa-9)

[Chemical Formula 5]

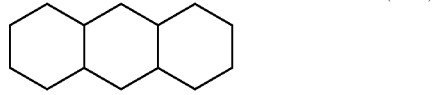
(Xa-10)

-continued
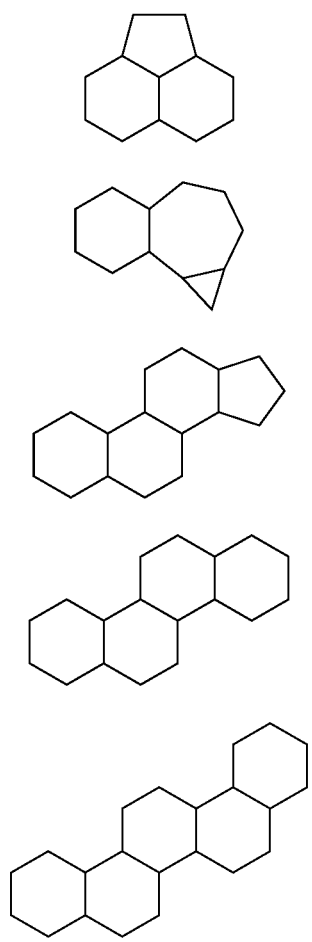
[Chemical Formula 6]
[Chemical Formula 7]
(Xa-11)
(Xa-12)
(Xa-13)
(Xa-14)
(Xa-15)
(Xa-16)
(Xa-17)
(Xa-18)
(Xa-19)
(Xa-20)
(Xa-21)
 (Xa-22)
 (Xa-23)
 (Xa-24)
 (Xa-25)
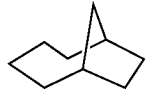 (Xa-26)
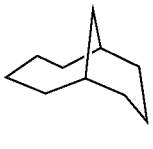 (Xa-27)
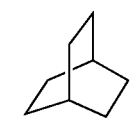 (Xa-28)
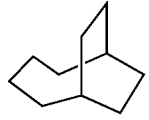 (Xa-29)
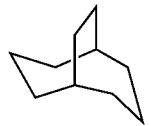 (Xa-30)
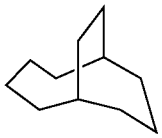 (Xa-31)
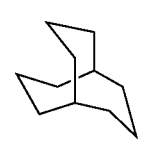 (Xa-32)

(Xa-33) 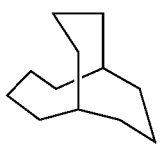

(Xa-34) 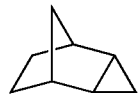

(Xa-35) 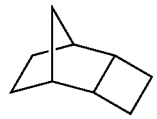

[Chemical Formula 8]

(Xa-36) 

(Xa-37) 

(Xa-38) 

(Xa-39) 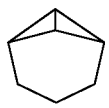

(Xa-40) 

(Xa-41) 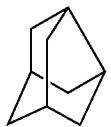

(Xa-42) 

(Xa-43) 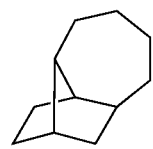

(Xa-44) 

(Xa-45) 

(Xa-46) 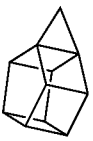

[Chemical Formula 9]

(Xa-47) 

(Xa-48) 

(Xa-49) 

(Xa-50) 

In particular, in general formula (a0-1), the alicyclic hydrocarbon group formed of Xa and Ya is preferably a group having a monocyclo, bicyclo, tricyclo or tetracyclo structure.

Specific examples of the alicyclic hydrocarbon group include cycloalkyl groups, such as a cyclopentyl group, a cyclohexyl group, a cycloheptyl group, a cyclooctyl group, a cyclodecyl group and cyclododecanyl group; an adamantyl group, a noradamantyl group, a decalin residue (decalinyl group), a tricyclodecyl group, tetracyclododecyl group, a norbornyl group, and a cedrol group.

Among these examples, cycloalkyl groups, such as a cyclopentyl group, a cyclohexyl group, a cycloheptyl group, a cyclooctyl group, a cyclodecyl group and cyclododecanyl group; an adamantyl group, a decalin residue, and a norbornyl group is preferable. In particular, a cycloalkyl group of 5 to 15 carbon atoms is preferable.

Further, the alicyclic hydrocarbon group may be substituted or unsubstituted. Specific examples of the substituent include a methyl group, an ethyl group, a propyl group, a hydroxy group, a carboxy group, a halogen atom (a fluorine atom, a bromine atom, or the like), an alkoxy group (a methoxy group, an ethoxy group, a propoxy group and a butoxy group), and an alkyloxycarbonyl group.

Examples of the aromatic hydrocarbon group optionally having a substituent for $Ra^{01}$ include groups derived from structures represented by formulae ($Ra^{01}$-1) to ($Ra^{01}$-3) shown below.

When $Ra^{01}$ is a group derived from ($Ra^{01}$-2) (i.e., a naphthyl group), the bonding position where Ya in general formula (a0-1) is bonded may be either the 1st position or the 2nd position.

Alternatively, when $Ra^{01}$ is a group derived from ($Ra^{01}$-3) (i.e., an anthryl group), the bonding position where Ya in general formula (a0-1) is bonded may be either the 1st position, the 2nd position or the 9th position.

Further, the aryl group may be substituted. Specific examples of the substituent include a methyl group, an ethyl group, a propyl group, a hydroxy group, a carboxy group, a halogen atom (a fluorine atom, a chlorine atom, a bromine atom, or the like), an alkoxy group (a methoxy group, an ethoxy group, a propoxy group and a butoxy group), and an alkyloxycarbonyl group.

[Chemical Formula 10]

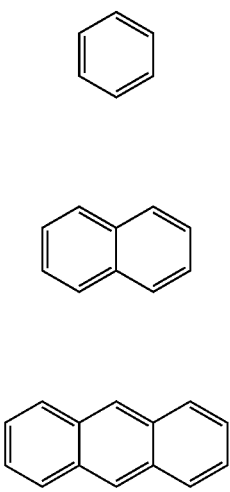

($Ra^{01}$-1)

($Ra^{01}$-2)

($Ra^{01}$-3)

[Chemical Formula 11]

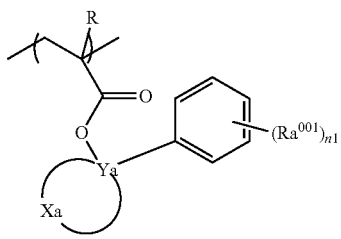

(a0-1-1)

In general formula (a0-1-1), R represents a hydrogen atom, an alkyl group of 1 to 5 carbon atoms or a halogenated alkyl group of 1 to 5 carbon atoms; $Ra^{01}$ represents an alkyl group of 1 to 4 carbon atoms; Ya represents a carbon atom; represents an atomic group required to form an alicyclic hydrocarbon group with Ya; and n1 represents an integer of 0 to 3.

In general formula (a0-1-1), examples of the alkyl group of 1 to 4 carbon atoms for $Ra^{001}$ include a methyl group, an ethyl group, an n-propyl group, an i-propyl group, an n-butyl group, a 2-methylpropyl group, a 1-methylpropyl group and a t-butyl group.

In general formula (a0-1-1), n1 represents an integer of 0 to 3, and preferably 0 or 1.

In general formula (a0-1-1), "the alicyclic hydrocarbon group formed of Xa and Ya" is the same as defined for "the alicyclic hydrocarbon group formed of Xa and Ya" in general formula (a0-1).

[Chemical Formula 12]

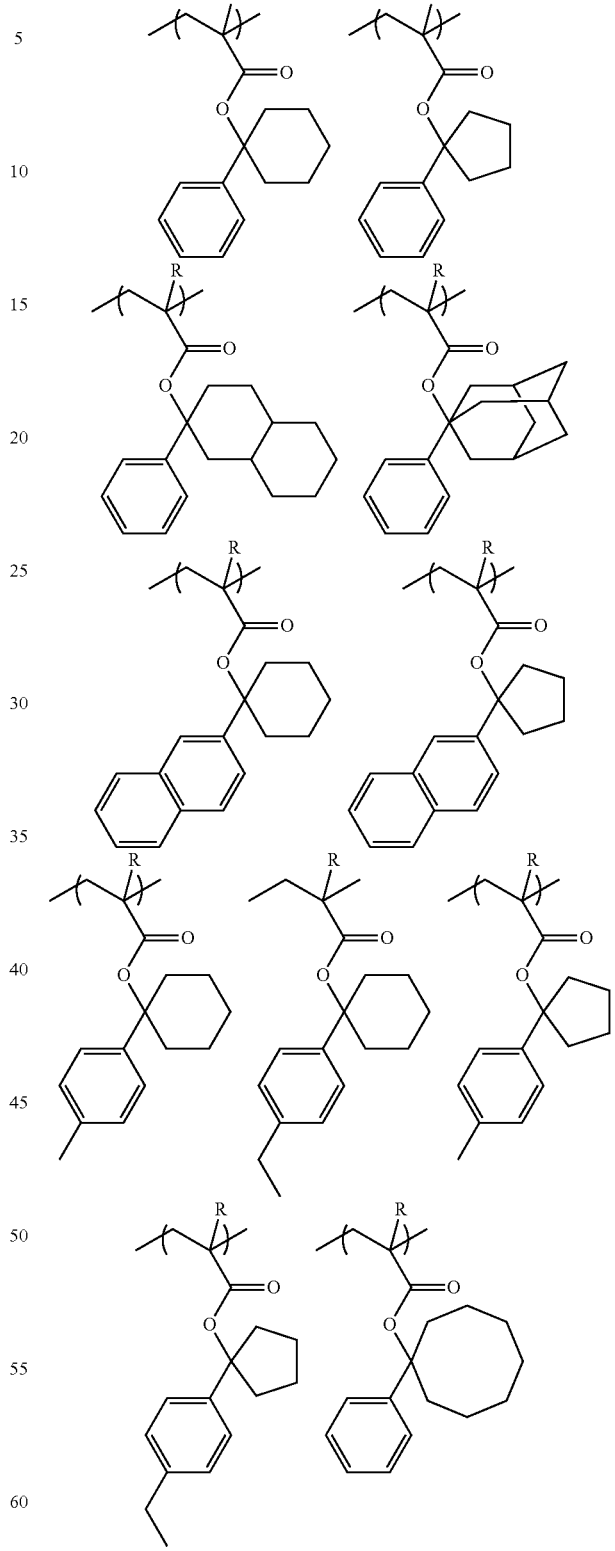

In the component (A), the amount of the structural unit (a0) based on the combined total of all structural units constituting the component (A) is preferably 50 to 80 mol %, more preferably 10 to 75 mol %, and still more preferably 10 to 70 mol %. By ensuring the lower limit, various lithography properties such as sensitivity, resolution and LWR are improved. On the other hand, when the amount of the structural unit (a0) is no more than the upper limit of the above-mentioned range, a good balance can be achieved with the other structural units.

In the present embodiment, the component (A) preferably has a structural unit (a9).

In the present embodiment, for example, the component (A) may consist of a polymeric compound (A0) (hereafter, referred to as "component (A0)") having the structural unit (a0) and the structural unit (a9). Alternatively, the component (A) may consist of a polymeric compound (A1) (hereafter, referred to as "component (A1)") having the structural unit (a0) and a polymeric compound (A2) (hereafter, referred to as "component (A2)") having the structural unit (a9).

(Structural Unit (a9))

As the structural unit (a9), a structural unit represented by general formula (a9-1) shown below is preferable.

[Chemical Formula 13]

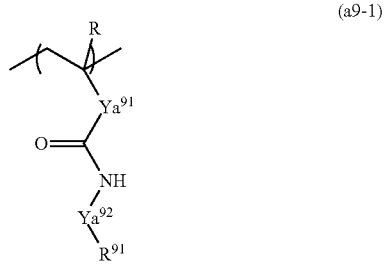

(a9-1)

In the formula, R is the same as defined above; $Ya^{91}$ represents a single bond or a divalent linking group; $R^{91}$ represents a hydrocarbon group optionally having a substituent; and $Ya^{92}$ represents a divalent linking group.

In general formula (a9-1), the divalent linking group for $Ya^{91}$ is the same as defined for the divalent linking group for $Ya^{21}$ in general formula (a2-1) described later. $Ya^{91}$ is preferably a single bond.

In general formula (a9-1), the divalent linking group for $Ya^{92}$<f3, like the divalent linking group for $Ya^{91}$, is the same as defined for the divalent linking group for $Ya^{21}$ in general formula (a2-1). Among these examples, as the divalent linking group for $Ya^{92}$ in general formula (a9-1), as the divalent hydrocarbon group optionally having a substituent, a linear or branched aliphatic hydrocarbon group has 1 to 10 carbon atoms, more preferably 1 to 6, still more preferably 1 to 4, and most preferably 1 to 3.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, branched alkylene groups are preferred, and specific examples include various alkylalkylene groups, including alkylmethylene groups such as —CH($CH_3$)—, —CH($CH_2CH_3$)—, —C($CH_3)_2$—, —C($CH_3$)($CH_2CH_3$)—, —C($CH_3$)($CH_2CH_2CH_3$)—, and —C($CH_2CH_3)_2$—; alkylethylene groups such as —CH($CH_3$)$CH_2$—, —CH($CH_3$)CH($CH_3$)—, —C($CH_3)_2CH_2$—, —CH($CH_2CH_3$)$CH_2$—, and —C($CH_2CH_3)_2$—$CH_2$—; alkyltrimethylene groups such as —CH($CH_3$)$CH_2CH_2$—, and —$CH_2$CH($CH_3$)$CH_2$—; and alkyltetramethylene groups such as —CH($CH_3$)$CH_2CH_2CH_2$—, and —$CH_2$CH($CH_3$)$CH_2CH_2$—. As the alkyl group within the alkylalkylene group, a linear alkyl group of 1 to 5 carbon atoms is preferable.

In formula (a9-1), in the case where $Ya^{92}$ represents a divalent linking group containing a hetero atom, examples of the linking group include —O—, —C(=O)—O—, —C(=O)—, —O—C(=O)—O—, —C(=O)—NH—, —NH—, —NH—C(=NH)— (wherein H may be substituted with a substituent such as an alkyl group or an acyl group), —S—, —S(=O)$_2$—, —S(=O)$_2$—O—, C(=S), a group represented by general formula —$Y^{21}$—O—$Y^{22}$—, —$Y^{21}$—O—, —$Y^{21}$—C(=O)—O—, —C(=O)—O—$Y^{21}$, —[$Y^{21}$—C(=O)—O]$_{m'}$—$Y^{22}$— or —$Y^{21}$—O—C(=O)—$Y^{22}$— [in the formulae, $Y^{21}$ and $Y^{22}$ each independently represents a divalent hydrocarbon group which may have a substituent, and O represents an oxygen atom; and m' represents an integer of 0 to 3. Among these examples, —C(=O)— and —C(=S)— are preferable.

In general formula (a9-1), examples of the hydrocarbon group for $R^{91}$ include an alkyl group, a monovalent alicyclic hydrocarbon group, an aryl group and an aralkyl group.

The alkyl group for $R^{91}$ preferably has 1 to 8 carbon atoms, more preferably 1 to 6 carbon atoms, and still more preferably 1 to 4 carbon atoms. The alkyl group may be linear or branched. Specific examples of preferable alkyl groups include a methyl group, an ethyl group, a propyl group, a butyl group, a hexyl group and an octyl group.

The monovalent alicyclic hydrocarbon group for $R^{91}$ preferably has 3 to 20 carbon atoms, and more preferably 3 to 12 carbon atoms. The monovalent alicyclic hydrocarbon group may be polycyclic or monocyclic. As the monocyclic alicyclic hydrocarbon group, a group in which one or more hydrogen atoms have been removed from a monocycloalkane is preferable. The monocycloalkane preferably has 3 to 6 carbon atoms, and specific examples thereof include cyclobutane, cyclopentane and cyclohexane. As the polycyclic alicyclic hydrocarbon group, a group in which one or more hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The aryl group for $R^{91}$ preferably has 6 to 18 carbon atoms, and more preferably 6 to 10 carbon atoms. Specifically, a phenyl group is particularly desirable.

As a preferable examples of the aralkyl group for $R^{91}$, a group in which an alkylene group of 1 to 8 carbon atoms has been bonded to the aforementioned "aryl group for $R^{91}$" can be mentioned. An aralkyl group in which an alkylene group of 1 to 6 carbon atoms has been bonded to the aforementioned "aryl group for $R^{91}$" is more preferable, and an aralkyl group in which an alkylene group of 1 to 4 carbon atoms has been bonded to the aforementioned "aryl group for $R^{91}$" is most preferable.

The hydrocarbon group for $R^{91}$ preferably has part or all of the hydrogen atoms within the hydrocarbon group substituted with fluorine, and the hydrocarbon group more preferably has 30 to 100% of the hydrogen atoms substituted with fluorine. Among these, a perfluoroalkyl group in which all of the hydrogen atoms within the alkyl group have been substituted with fluorine atoms is particularly desirable.

The hydrocarbon group for $R^{91}$ may have a substituent. Examples of the substituent include a halogen atom, an oxo group (=O), a hydroxy group (—OH), an amino group (—$NH_2$) and —$SO_2$—$NH_2$. Further, part of the carbon atoms constituting the hydrocarbon group may be substituted with a substituent containing a hetero atom. Examples of the substituent containing a hetero atom include —O—, —NH—, —N=, —C(=O)—O—, —S—, —S(=O)$_2$— and —S(=O)$_2$—O—.

As the hydrocarbon group for R$^{91}$, examples of the hydrocarbon group having a substituent include lactone-containing cyclic groups represented by the aforementioned general formulae (a2-r-1), (a2-r-3) to (a2-r-7), and general formulae (a2-r-2-1) shown below.

[Chemical Formula 14]

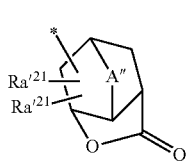

(a2-r-2-1)

In the formulae, each Ra'$^{21}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom or an alkyl group; and A" represents an oxygen atom, a sulfur atom or an alkylene group of 1 to 5 carbon atoms which may contain an oxygen atom or a sulfur atom.

In general formula (a2-r-2-1), Ra'$^{21}$, R" and A" are the same as defined above.

Specific examples of groups represented by general formula (a2-r-2-1) are shown below.

[Chemical Formula 15]

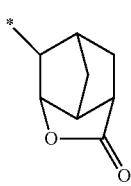

(r-lc-2-1)

(r-lc-2-2)

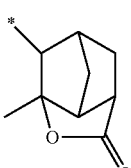

(r-lc-2-3)

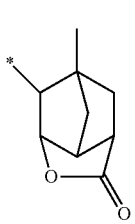

(r-lc-2-4)

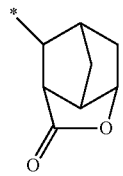

(r-lc-2-5)

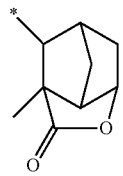

(r-lc-2-6)

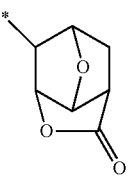

(r-lc-2-7)

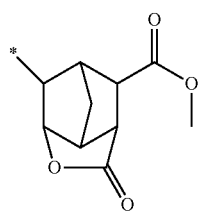

(r-lc-2-8)

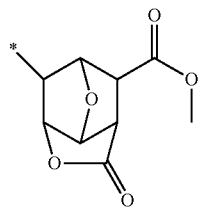

(r-lc-2-9)

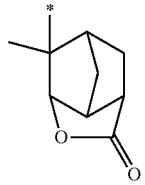

(r-lc-2-10)

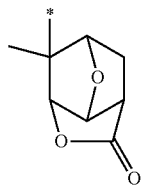

(r-lc-2-11)

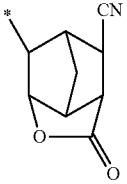

(r-lc-2-12)

-continued

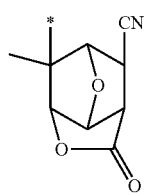
(r-lc-2-13)

Further, as $R^{91}$, examples of the hydrocarbon group having a substituent include —$SO_2$— containing cyclic groups represented by general formulae (a5-r-1) to (a5-r-4); and substituted aryl groups and monocyclic heterocyclic groups represented by chemical formulae shown below.

[Chemical Formula 16]

(r-ar-1)

(r-ar-2)
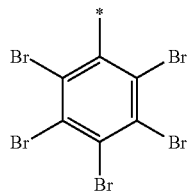

(r-ar-3)
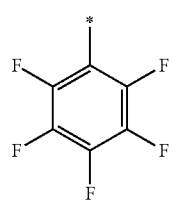

(r-ar-4)
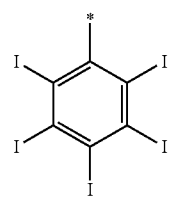

(r-ar-5)
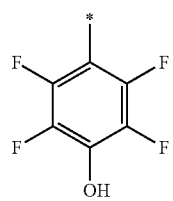

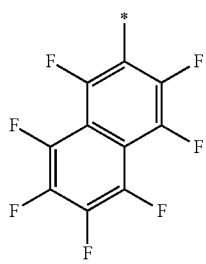
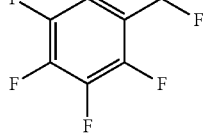

-continued (r-ar-6)
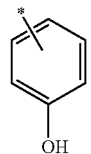

(r-ar-7)
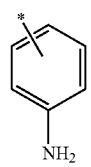

(r-ar-8)

(r-hr-1)
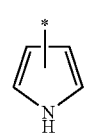

(r-hr-2)
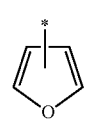

(r-hr-3)
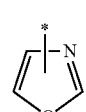

(r-hr-4)
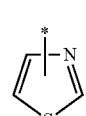

(r-hr-5)
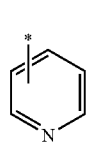

(r-hr-6)
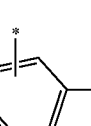
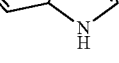

(r-hr-7)

(r-hr-8)
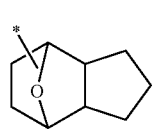

-continued (r-hr-9)

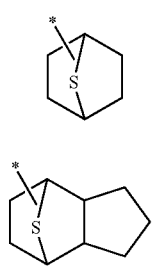

(r-hr-10)

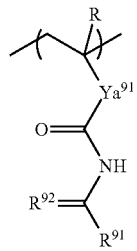

As the structural unit represented by general formula (a9-1) above, a structural unit represented by general formula (a9-1-1) shown below is preferable.

[Chemical Formula 17]

(a9-1-1)

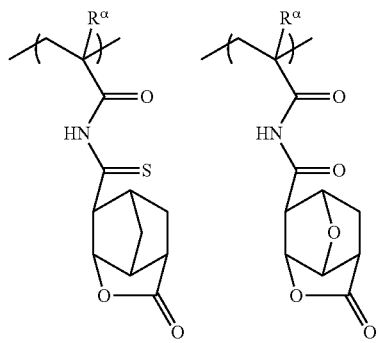

In the formula, R is the same as defined above; $Ya^{91}$ represents a single bond or a divalent linking group; $R^{91}$ represents a hydrocarbon group optionally having a substituent; and $Ya^{92}$ represents an oxygen atom or a sulfur atom.

In general formula (a9-1-1), $Ya^{91}$, $R^{91}$ and R are the same as defined above.

$R^{92}$ represents an oxygen atom or a sulfur atom.

Specific examples of structural units represented by general formula (a9-1) or (a9-1-1) are shown below. In the following formulae, $R^\alpha$ represents a hydrogen atom, a methyl group or a trifluoromethyl group.

[Chemical Formula 18]

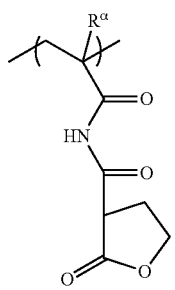 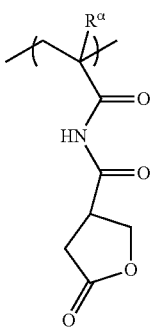 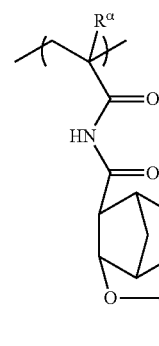

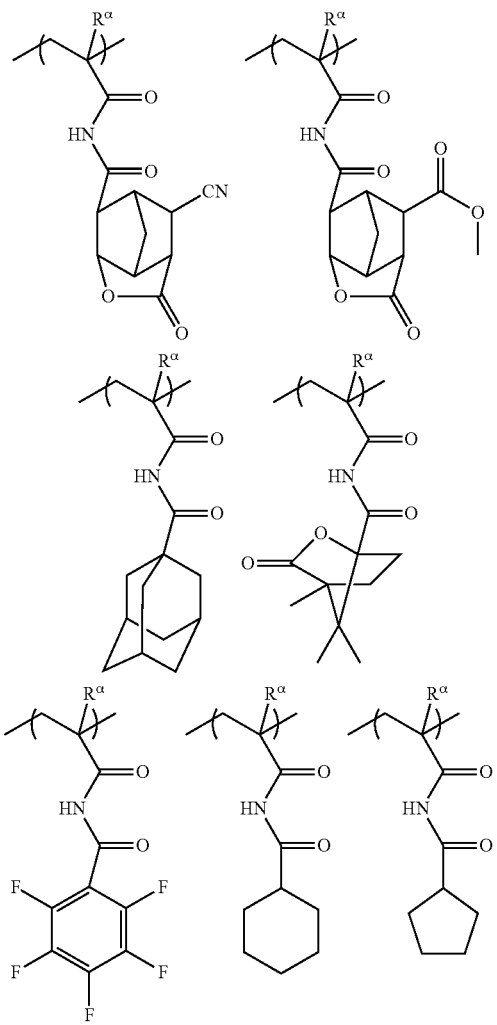

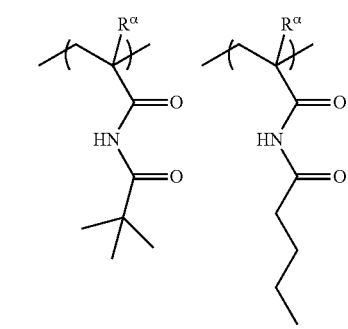

-continued

[Chemical Formula 19]

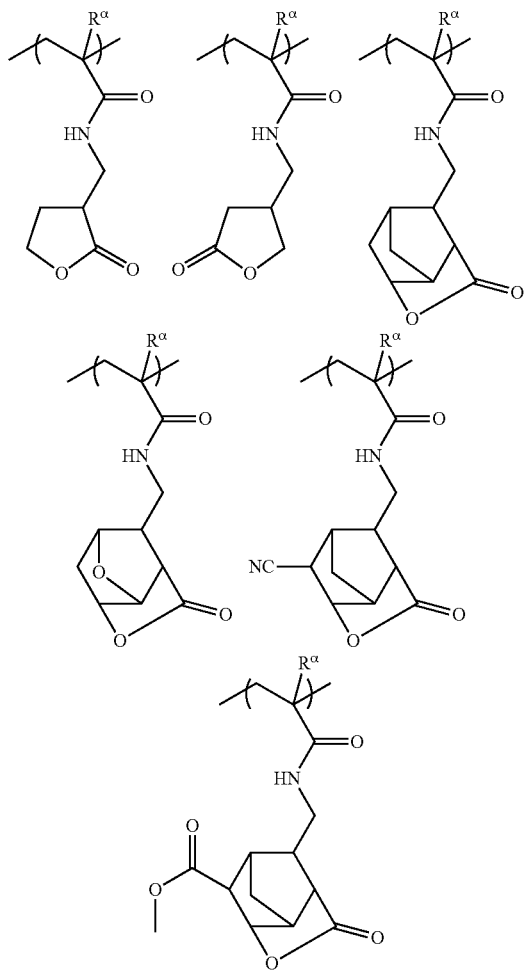

[Chemical Formula 20]

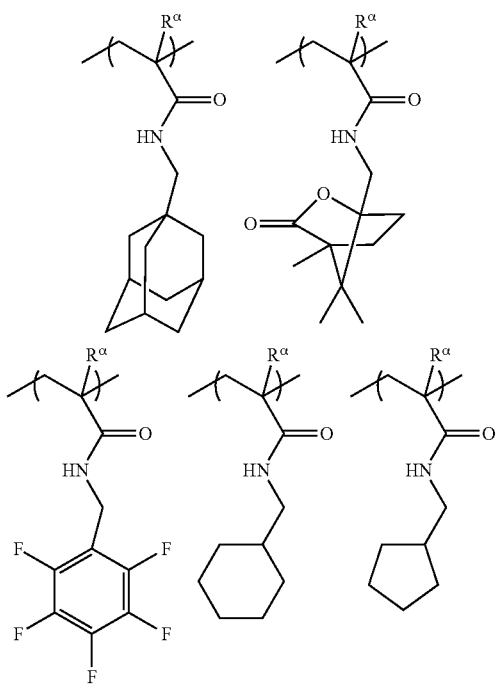

-continued

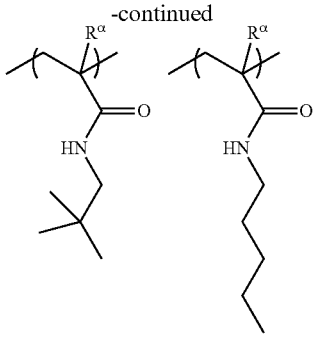

As the structural unit (a9) contained in the component (A), 1 kind of structural unit may be used, or 2 or more kinds may be used.

When the component (A) contains the structural unit (a9), the amount of the structural unit (a9) based on the combined total of all structural units constituting the component (A) is preferably 1 to 40 mol %, more preferably 3 to 30 mol %, and most preferably 10 to 30 mol %. When the amount of the structural unit (a9) is at least as large as the lower limit of the above-mentioned range, various lithography properties such as development properties and EL margin are improved. On the other hand, when the amount of the structural unit (a9) is no more than the upper limit of the above-mentioned range, a good balance can be reliably achieved with the other structural units.

In the present embodiment, the component (A) preferably has a structural unit (st) (hereafter, referred to as "structural unit (st)") derived from styrene or hydroxystyrene.

In the present embodiment, the component (A1) preferably has a structural unit (st).

The term "hydroxystyrene" includes hydroxystyrene and compounds in which the hydrogen atom bonded to the carbon atom on the α-position of hydroxystyrene is substituted with another substituent such as a halogen atom, an alkyl group or a halogenated alkyl group; and derivatives thereof (preferably compounds having the aforementioned substituent bonded to the benzene ring). The number of hydroxy groups bonded to the benzene ring of hydroxystyrene is preferably 1 to 3, and most preferably 1. Here, the α-position (carbon atom on the α-position) of hydroxystyrene refers to the carbon atom having the benzene ring bonded thereto, unless specified otherwise.

A "structural unit derived from a hydroxystyrene" refers to a structural unit that is formed by the cleavage of the ethylenic double bond of a hydroxystyrene.

Examples of the structural unit (st) include a structural unit (st1) represented by general formula (I) shown below or a structural unit (st2) represented by general formula (II) shown below.

[Chemical Formula 21]

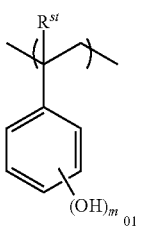

(I)

In the formula, $R^{st}$ represents a hydrogen atom or a methyl group; and $m_{01}$ represents an integer of 1 to 3.

[Chemical Formula 22]

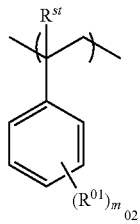

(II)

In the formula, $R^{st}$ represents a hydrogen atom or a methyl group; $R^{01}$ represents an alkyl group of 1 to 5 carbon atoms; and $m_{02}$ represents 0 or an integer of 1 to 3.

In the structural unit (st1) represented by general formula (I), $R^{st}$ represents a hydrogen atom or a methyl group, and is preferably a hydrogen atom.

$m_{01}$ represents an integer of 1 to 3. Among these, $m_{01}$ is preferably 1.

The bonding position of the hydroxy group may be any of o-position, m-position or p-position, but in terms of availability and low cost, m is preferably 1, and the hydroxy group is bonded to the p-position. In the case where $m_{01}$ is 2 or 3, a desired combination of the bonding positions can be used.

In the structural unit (st2) represented by general formula (II), $R^{st}$ represents a hydrogen atom or a methyl group, and is preferably a hydrogen atom.

$R^{01}$ represents a linear or branched alkyl group of 1 to 5 carbon atoms, and examples thereof include a methyl group, an ethyl group, a propyl group, an isopropyl group, an n-butyl group, an isobutyl group, a tert-butyl group, a pentyl group, an isopentyl group, and a neopentyl group. A methyl group or an ethyl group is industrially preferable.

$m_{02}$ represents 0 or an integer of 1 to 3. Among these, $m_{02}$ is preferably 0 or 1, and most preferably 0 from industrial viewpoint.

In the case where $m_{02}$ is 1, the bonding position of R1 may be any of o-position, m-position or p-position. Alternatively, in the case where $m_{02}$ is 2 or 3, a desired combination of the bonding positions can be used.

As the structural unit (st) contained in the component (A), 1 kind of structural unit may be used, or 2 or more kinds may be used.

When the component (A) includes the structural unit (st), the amount of the structural unit (st) based on the combined total of all structural units constituting the component (A) is preferably 1 to 50 mol %, and more preferably 10 to 40 mol %. When the amount of the structural unit (st) is at least as large as the lower limit of the above-mentioned range, various lithography properties such as development properties and EL margin are improved. On the other hand, when the amount of the structural unit (st) is no more than the upper limit of the above-mentioned range, a good balance can be reliably achieved with the other structural units.

In the present embodiment, the component (A) preferably has a structural unit containing an acid decomposable group which exhibits increased polarity by the action of acid (hereafter, referred to as "structural unit (a1)"), a structural unit derived from an acrylate ester containing a —$SO_2$— containing cyclic group (hereafter, referred to as "structural unit (a2)"), a structural unit containing a polar group-containing aliphatic hydrocarbon group (hereafter, referred to as "structural unit (a3)"), a structural unit containing an acid non-dissociable cyclic group (hereafter, referred to as "structural unit (a4)"), a structural unit containing a lactone-containing cyclic group or a carbonate containing cyclic group (hereafter, referred to as "structural unit (a5)").

(Structural Unit (a1))

The structural unit (a1) is a structural unit containing an acid decomposable group that exhibits increased polarity by the action of acid.

The term "acid decomposable group" refers to a group in which at least a part of the bond within the structure thereof is cleaved by the action of an acid.

Examples of acid decomposable groups which exhibit increased polarity by the action of an acid include groups which are decomposed by the action of an acid to form a polar group.

Examples of the polar group include a carboxy group, a hydroxy group, an amino group and a sulfo group (—$SO_3H$). Among these, a polar group containing —OH in the structure thereof (hereafter, referred to as "OH-containing polar group") is preferable, a carboxy group or a hydroxy group is more preferable, and a carboxy group is particularly desirable.

More specifically, as an example of an acid decomposable group, a group in which the aforementioned polar group has been protected with an acid dissociable group (such as a group in which the hydrogen atom of the OH-containing polar group has been protected with an acid dissociable group) can be given.

Here, the "acid dissociable group" includes:

(i) a group in which the bond between the acid dissociable group and the adjacent atom is cleaved by the action of acid; and (ii) a group in which one of the bonds is cleaved by the action of acid, and then a decarboxylation reaction occurs, thereby cleaving the bond between the acid dissociable group and the adjacent atom.

It is necessary that the acid dissociable group that constitutes the acid decomposable group is a group which exhibits a lower polarity than the polar group generated by the dissociation of the acid dissociable group. Thus, when the acid dissociable group is dissociated by the action of acid, a polar group exhibiting a higher polarity than that of the acid dissociable group is generated, thereby increasing the polarity. As a result, the polarity of the entire component (A1) is increased. By the increase in the polarity, the solubility in an alkali developing solution changes and, the solubility in an organic developing solution is relatively decreased.

The acid dissociable group is not particularly limited, and any of the groups that have been conventionally proposed as acid dissociable groups for the base resins of chemically amplified resists can be used.

Examples of the acid dissociable group for protecting the carboxy group or hydroxy group as a polar group include the acid dissociable group represented by general formula (a1-r-1) shown below (hereafter, for the sake of convenience, sometimes referred to as "acetal-type acid dissociable group").

[Chemical Formula 23]

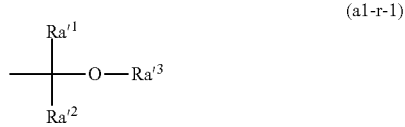

(a1-r-1)

In the formula, $Ra'^1$ and $Ra'^2$ represents a hydrogen atom or an alkyl group; and $Ra'^3$ represents a hydrocarbon group, provided that $Ra'^3$ may be bonded to $Ra'^1$ or $Ra'^2$.

In formula (a1-r-1), as the lower alkyl group for $Ra'^1$ and $Ra'^2$, the same lower alkyl groups as those described above the alkyl groups as the substituent which may be bonded to the carbon atom on the α-position of the aforementioned α-substituted alkylester can be used, although a methyl group or ethyl group is preferable, and a methyl group is particularly desirable.

The hydrocarbon group for $Ra'^3$ is preferably an alkyl group of 1 to 20 carbon atoms, more preferably an alkyl group of 1 to 10 carbon atoms, and still more preferably a linear or branched alkyl group. Specific examples thereof include a methyl group, an ethyl group, a propyl group, an isopropyl group, an n-butyl group, an isobutyl group, a tert-butyl group, a pentyl group, an isopentyl group, a neopentyl group, a 1,1-dimethylethyl group, a 1,1-diethylpropyl group, a 2,2-dimethylpropyl group and a 2,2-dimethylbutyl group.

In the case where $Ra'^3$ represents a cyclic hydrocarbon group, the cyclic hydrocarbon group may be aliphatic or aromatic, and may be polycyclic or monocyclic. As the monocyclic aliphatic hydrocarbon group, a group in which 1 hydrogen atom has been removed from a monocycloalkane is preferable. The monocycloalkane preferably has 3 to 8 carbon atoms, and specific examples thereof include cyclopentane, cyclohexane and cyclooctane. As the polycyclic group, a group in which 1 hydrogen atom has been removed from a polycycloalkane is preferable, and the polycyclic group preferably has 7 to 12 carbon atoms. Examples of the polycycloalkane include adamantane, norbornane, isobornane, tricyclodecane and tetracyclododecane.

In the case where the hydrocarbon group is an aromatic hydrocarbon group, examples of the aromatic ring contained in the aromatic hydrocarbon group include aromatic hydrocarbon rings, such as benzene, biphenyl, fluorene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hydrocarbon group include a group in which 1 hydrogen atom has been removed from the aforementioned aromatic hydrocarbon ring (aryl group); and a group in which 1 hydrogen atom of the aforementioned aryl group has been substituted with an alkylene group (an arylalkyl group such as a benzyl group, a phenethyl group, a 1-naphthylmethyl group, a 2-naphthylmethyl group, a 1-naphthylethyl group or a 2-naphthylethyl group). The alkylene group (alkyl chain within the arylalkyl group) preferably has 1 to 4 carbon atom, more preferably 1 or 2, and most preferably 1.

In the case where $Ra'^3$ is bonded to $Ra'^1$ or $Ra'^2$ to form a ring, the cyclic group is preferably a 4 to 7-membered ring, and more preferably a 4 to 6-membered ring. Specific examples of the cyclic group include tetrahydropyranyl group and tetrahydrofuranyl group.

Examples of the acid dissociable group for protecting the carboxy group as a polar group include the acid dissociable group represented by general formula (a1-r-2) shown below (hereafter, with respect to the acid dissociable group represented by the following formula (a1-r-2), the acid dissociable group constituted of alkyl groups is referred to as "tertiary ester-type acid dissociable group").

[Chemical Formula 24]

(a1-r-2)

In the formula, $Ra'^4$ to $Ra'^6$ each independently represents a hydrocarbon group, provided that $Ra'^5$ and $Ra'^6$ may be mutually bonded to form a ring.

As the hydrocarbon group for $Ra'^4$ to $Ra'^6$, the same groups as those described above for $Ra'^3$ can be mentioned. $Ra'^4$ is preferably an alkyl group having from 1 to 5 carbon atoms. In the case where $Ra'^5$ and $Ra'^6$ are mutually bonded to form a ring, a group represented by general formula (a1-r2-1) shown below can be mentioned.

On the other hand, in the case where $Ra'^4$ to $Ra'^6$ are not mutually bonded and independently represent a hydrocarbon group, the group represented by general formula (a1-r2-2) shown below can be mentioned.

[Chemical Formula 25]

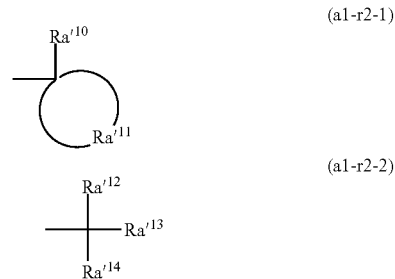

(a1-r2-1)

(a1-r2-2)

In the formulae, $Ra'^{10}$ represents an alkyl group of 1 to 10 carbon atoms; $Ra'^{11}$ is a group which forms an aliphatic cyclic group together with a carbon atom having $Ra'^{10}$ bonded thereto; and $Ra'^{12}$ to $Ra'^{14}$ each independently represents a hydrocarbon group.

In the formula (a1-r2-1), as the alkyl group of 1 to 10 carbon atoms for $Ra'^{10}$, the same groups as described above for the linear or branched alkyl group for $Ra'^3$ in the formula (a1-r-1) are preferable. In the formula (a1-r2-1), as the aliphatic cyclic group which is formed by $Ra'^{11}$, the same groups as those described above for the cyclic alkyl group for $Ra'^3$ in the formula (a1-r-1) are preferable.

In the formula (a1-r2-2), it is preferable that $Ra'^{12}$ and $Ra'^{14}$ each independently represents an alkyl group or 1 to 10 carbon atoms, and it is more preferable that the alkyl group is the same group as the described above for the linear or branched alkyl group for $Ra'^3$ in the formula (a1-r-1), it is still more preferable that the alkyl group is a linear alkyl group of 1 to 5 carbon atoms, and it is particularly preferable that the alkyl group is a methyl group or an ethyl group.

In the formula (a1-r2-2), it is preferable that Ra$^{13}$ is the same group as described above for the linear, branched or cyclic alkyl group for Ra$^{13}$ in the formula (a1-r-1).

Among these, the same cyclic alkyl group as those describe above for Ra$^{13}$ is more preferable.

Specific examples of the formula (a1-r2-1) are shown below. In the formulae shown below, "*" represents a valence bond.

[Chemical Formula 26]

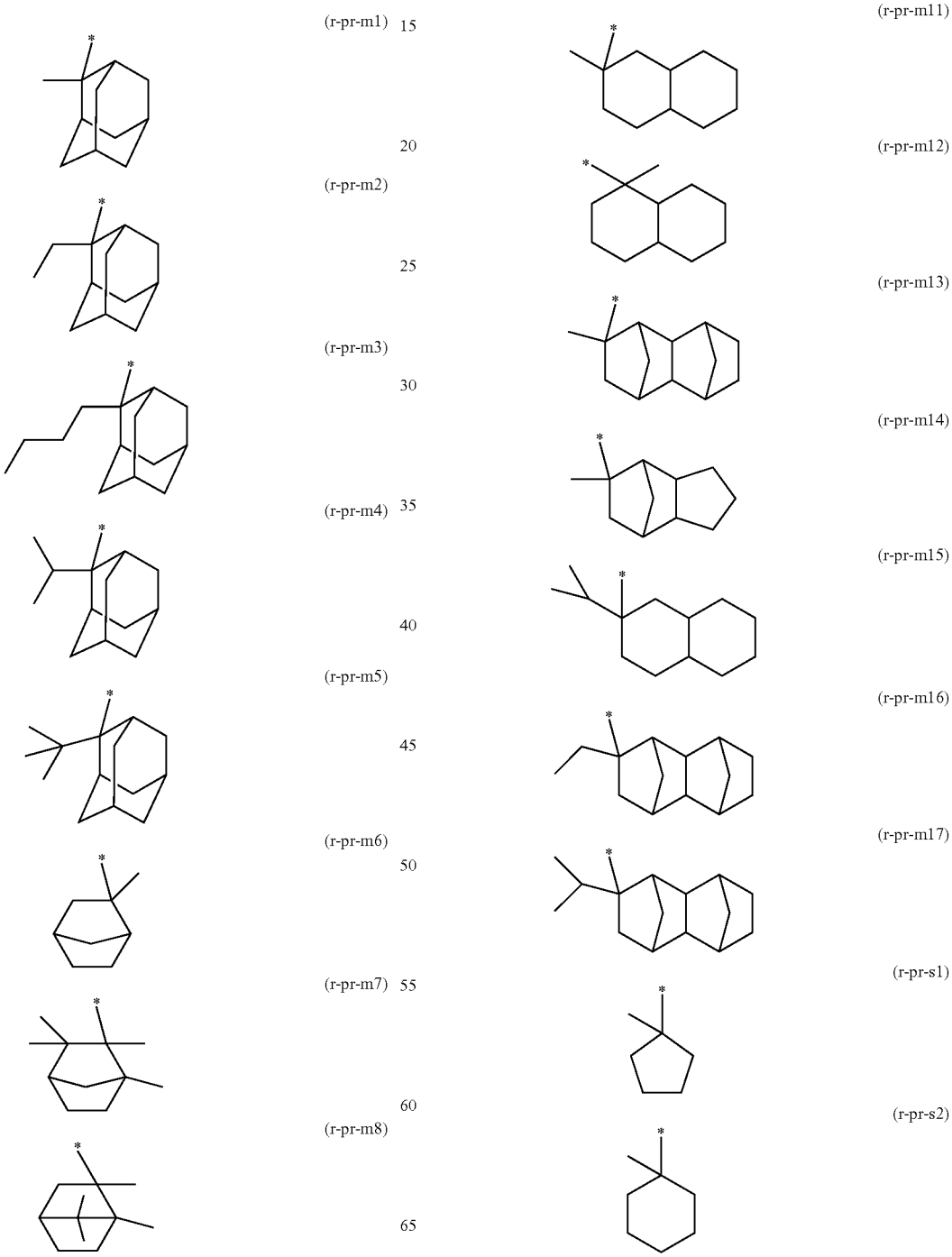

-continued
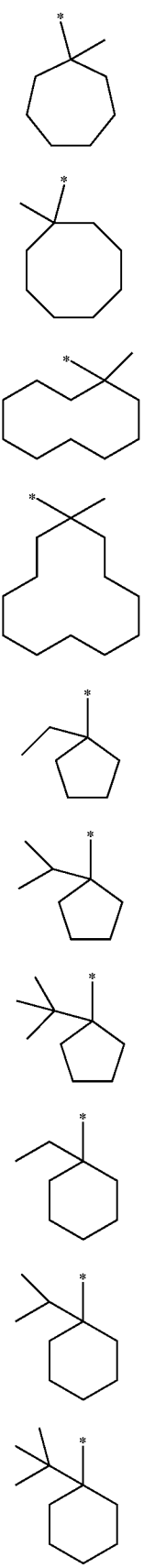
(r-pr-s3)
(r-pr-s4)
(r-pr-s5)
(r-pr-s6)
(r-pr-s7)
(r-pr-s8)
(r-pr-s9)
(r-pr-s10)
(r-pr-s11)
(r-pr-s12)
-continued
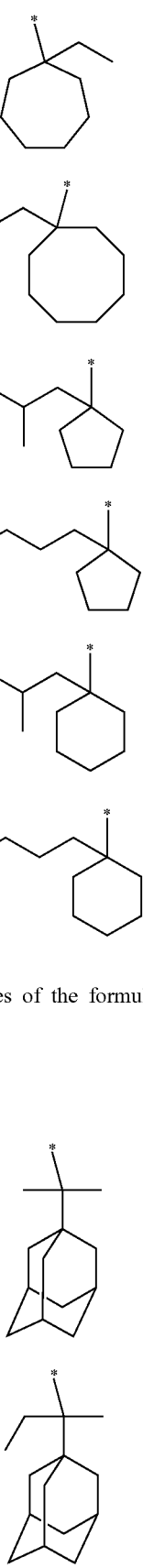
(r-pr-s13)
(r-pr-s14)
(r-pr-s15)
(r-pr-s16)
(r-pr-s17)
(r-pr-s18)
Specific examples of the formula (a1-r2-2) are shown below.
[Chemical Formula 27]
(r-pr-cm1)
(r-pr-cm2)

(r-pr-cm3)
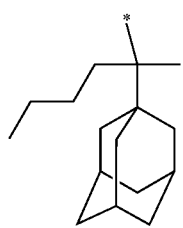
(r-pr-cm4)
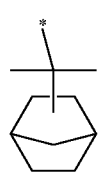
(r-pr-cm5)
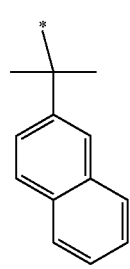
(r-pr-cm6)
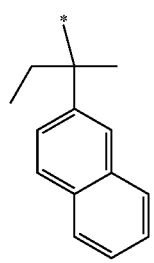
(r-pr-cm7)
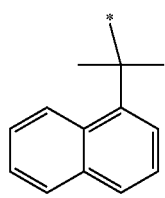
(r-pr-cm8)
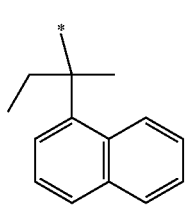
(r-pr-cs1)
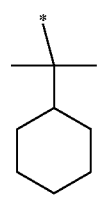
(r-pr-cs2)
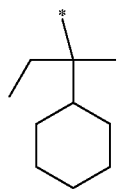
(r-pr-cs3)
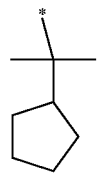
(r-pr-cs4)
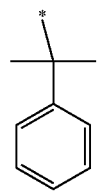
(r-pr-cs5)
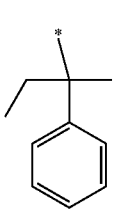
(r-pr-c1)
(r-pr-c2)
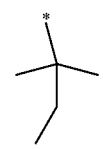
(r-pr-c3)
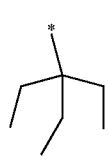
Examples of the acid dissociable group for protecting a hydroxy group as a polar group include the acid dissociable group represented by general formula (a1-r-3) shown below (hereafter, referred to as "tertiary alkyloxycarbonyl-type acid dissociable group").
[Chemical Formula 28]
(a1-r-3)
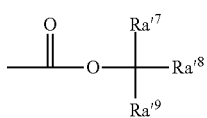

In the formula, $Ra'^7$ to $Ra'^9$ each independently represents an alkyl group.

In the formula (a1-r-3), $Ra'^7$ to $Ra'^9$ is preferably an alkyl group of 1 to 5 carbon atoms, and more preferably an alkyl group of 1 to 3 carbon atoms.

Further, the total number of carbon atoms within the alkyl group is preferably 3 to 7, more preferably 3 to 5, and most preferably 3 or 4.

Examples of the structural unit (a1) include a structural unit derived from an acrylate ester which may have the hydrogen atom bonded to the carbon atom on the α-position substituted with a substituent and contains an acid decomposable group which exhibits increased polarity by the action of acid; a structural unit derived from hydroxystyrene or a hydroxystyrene derivative in which at least a part of the hydrogen atom of the hydroxy group is protected with a substituent containing an acid decomposable group; and a structural unit derived from vinylbenzoic acid or a vinylbenzoic acid derivative in which at least a part of the hydrogen atom within —C(=O)—OH is protected with a substituent containing an acid decomposable group.

As the structural unit (a1), a structural unit derived from an acrylate ester which may have the hydrogen atom bonded to the carbon atom on the α-position substituted with a substituent is preferable.

As the structural unit (a1), structural units represented by general formula (a1-1) or (a1-2) shown below are preferable.

[Chemical Formula 29]

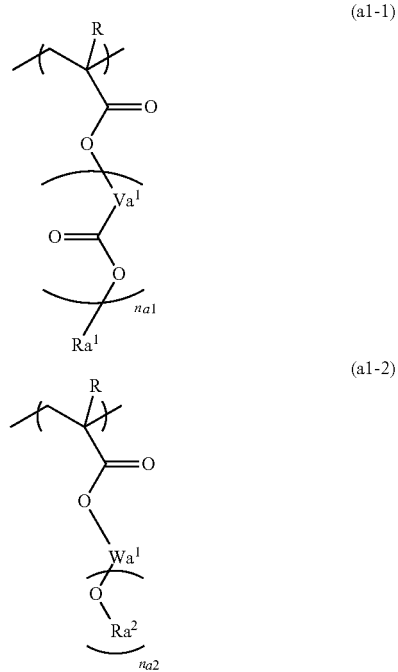

(a1-1)

(a1-2)

In the formulae, R represents a hydrogen atom, an alkyl group of 1 to 5 carbon atoms or a halogenated alkyl group of 1 to 5 carbon atoms; $Va^1$ represents a divalent hydrocarbon group which may have an ether bond, an urethane bond or an amide bond; $n_{a1}$ represents an integer of 0 to 2;

$Ra^1$ represents an acid dissociable group represented by the aforementioned formula (a1-r-1) or (a1-r-2);

$Wa^1$ represents a hydrocarbon group having a valency of $n_{a2}+1$; $n_{a2}$ represents an integer of 1 to 3; and $Ra^2$ represents an acid dissociable group represented by the aforementioned formula (a1-r-1) or (a1-r-3).

In general formula (a1-1), as the alkyl group of 1 to 5 carbon atoms for R, a linear or branched alkyl group of 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group and a neopentyl group. The halogenated alkyl group of 1 to 5 carbon atoms represented by R is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

The hydrocarbon group for $Va^1$ may be either an aliphatic hydrocarbon group or an aromatic hydrocarbon group. An "aliphatic hydrocarbon group" refers to a hydrocarbon group that has no aromaticity. The aliphatic hydrocarbon group as the divalent hydrocarbon group for $Va^1$ may be either saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

Further, as the group for $Va^1$, a group in which the aforementioned divalent hydrocarbon group has been bonded via an ether bond, urethane bond or amide bond can be mentioned.

The linear or branched aliphatic hydrocarbon group preferably has 1 to 10 carbon atoms, more preferably 1 to 6, still more preferably 1 to 4, and most preferably 1 to 3.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, branched alkylene groups are preferred, and specific examples include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

As examples of the hydrocarbon group containing a ring in the structure thereof, an alicyclic hydrocarbon group (a group in which two hydrogen atoms have been removed from an aliphatic hydrocarbon ring), a group in which the alicyclic hydrocarbon group is bonded to the terminal of the aforementioned chain-like aliphatic hydrocarbon group, and a group in which the alicyclic group is interposed within the aforementioned linear or branched aliphatic hydrocarbon group, can be given. As the linear or branched aliphatic hydrocarbon group, the same groups as those described above can be used.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic aliphatic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane. As the polycyclic group, a group in which two hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The aromatic hydrocarbon group is a hydrocarbon group having an aromatic ring.

The aromatic hydrocarbon group as the divalent hydrocarbon group for $Va^1$ preferably has 3 to 30 carbon atoms, more preferably 5 to 30, still more preferably 5 to 20, still more preferably 6 to 15, and most preferably 6 to 10. Here, the number of carbon atoms within a substituent(s) is not included in the number of carbon atoms of the aromatic hydrocarbon group.

Examples of the aromatic ring contained in the aromatic hydrocarbon group include aromatic hydrocarbon rings, such as benzene, biphenyl, fluorene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hydrocarbon group include a group in which two hydrogen atoms have been removed from the aforementioned aromatic hydrocarbon ring (arylene group); and a group in which one hydrogen atom has been removed from the aforementioned aromatic hydrocarbon ring (aryl group) and one hydrogen atom has been substituted with an alkylene group (such as a benzyl group, a phenethyl group, a 1-naphthylmethyl group, a 2-naphthylmethyl group, a 1-naphthylethyl group, or a 2-naphthylethyl group). The alkylene group (alkyl chain within the arylalkyl group) preferably has 1 to 4 carbon atom, more preferably 1 or 2, and most preferably 1.

In the aforementioned formula (a1-2), the hydrocarbon group for $Wa^1$ having a valency of $n_{a2}+1$ may be either an aliphatic hydrocarbon group or an aromatic hydrocarbon group. The aliphatic cyclic group refers to a hydrocarbon group that has no aromaticity, and may be either saturated or unsaturated, but is preferably saturated. Examples of the aliphatic hydrocarbon group include a linear or branched aliphatic hydrocarbon group, an aliphatic hydrocarbon group containing a ring in the structure thereof, and a combination of the linear or branched aliphatic hydrocarbon group and the aliphatic hydrocarbon group containing a ring in the structure thereof. As the specific examples thereof, the same groups as those described above for $Va^1$ in the aforementioned formula (a1-1) can be mentioned.

The valency of $n_{a2}+1$ is preferably divalent, trivalent or tetravalent, and divalent or trivalent is more preferable.

As the structural unit (a1-2), a structural unit represented by general formula (a1-2-01) shown below is particularly desirable.

[Chemical Formula 30]

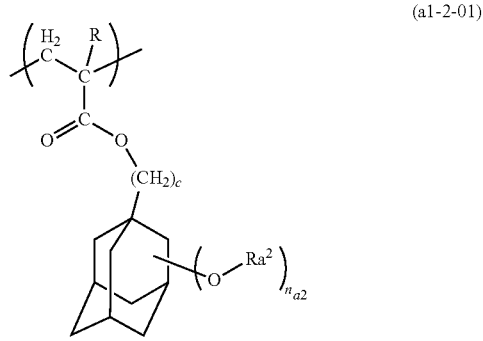

(a1-2-01)

In the formula (a1-2-01), $Ra^e$ represents an acid dissociable group represented by the aforementioned formula (a1-r-1) or (a1-r-3); $n_{a2}$ is an integer of 1 to 3, preferably 1 or 2, and more preferably 1; c is an integer of 0 to 3, preferably 0 or 1, and more preferably 1; R is the same as defined above.

Specific examples of the structural units (a1-1) and (a1-2) are shown below. In the formulae shown below, $R^\alpha$ represents a hydrogen atom, a methyl group or a trifluoromethyl group.

[Chemical Formula 31]

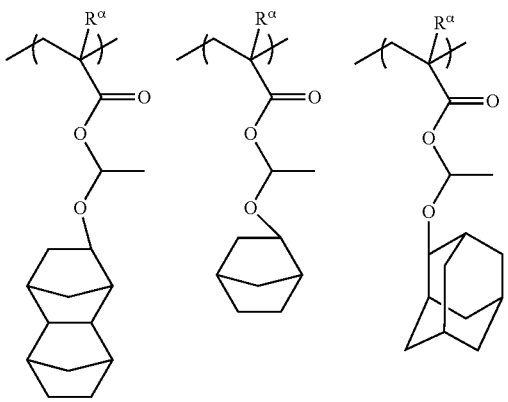

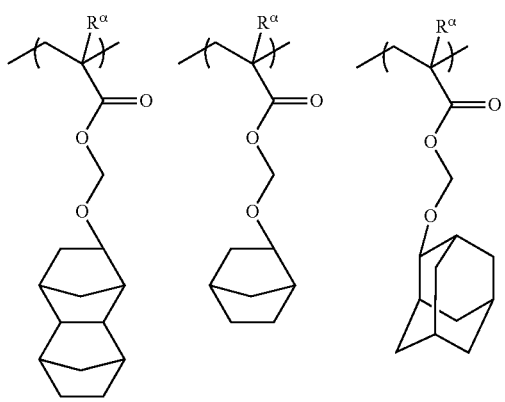

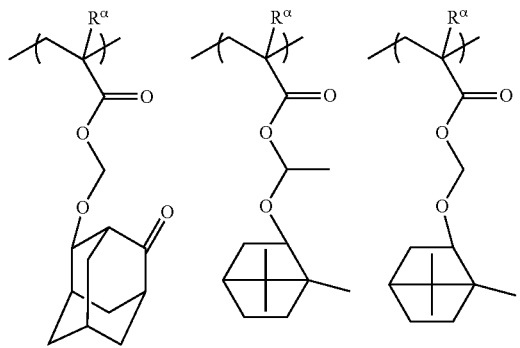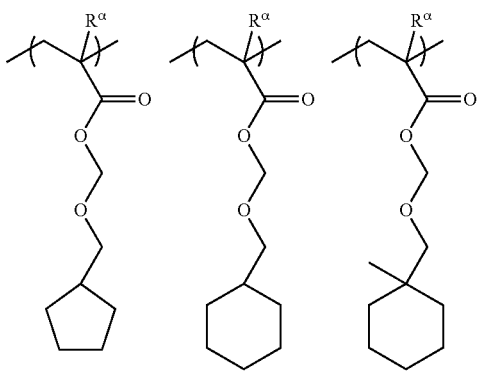
[Chemical Formula 32]
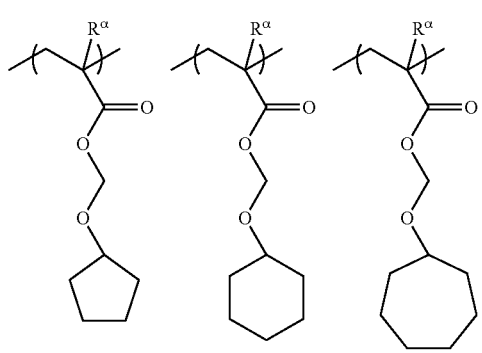
[Chemical Formula 33]
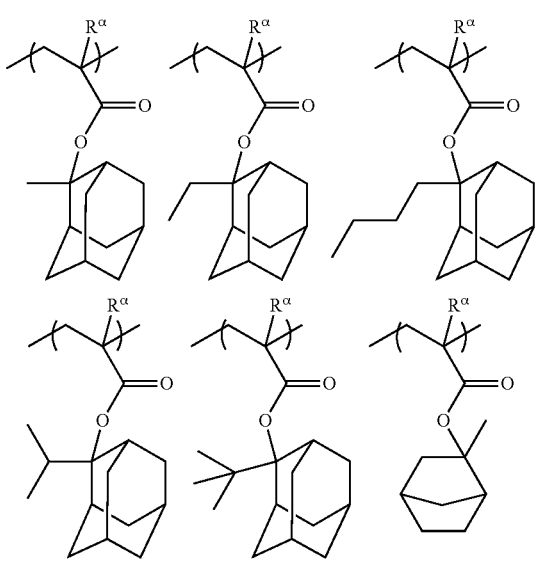

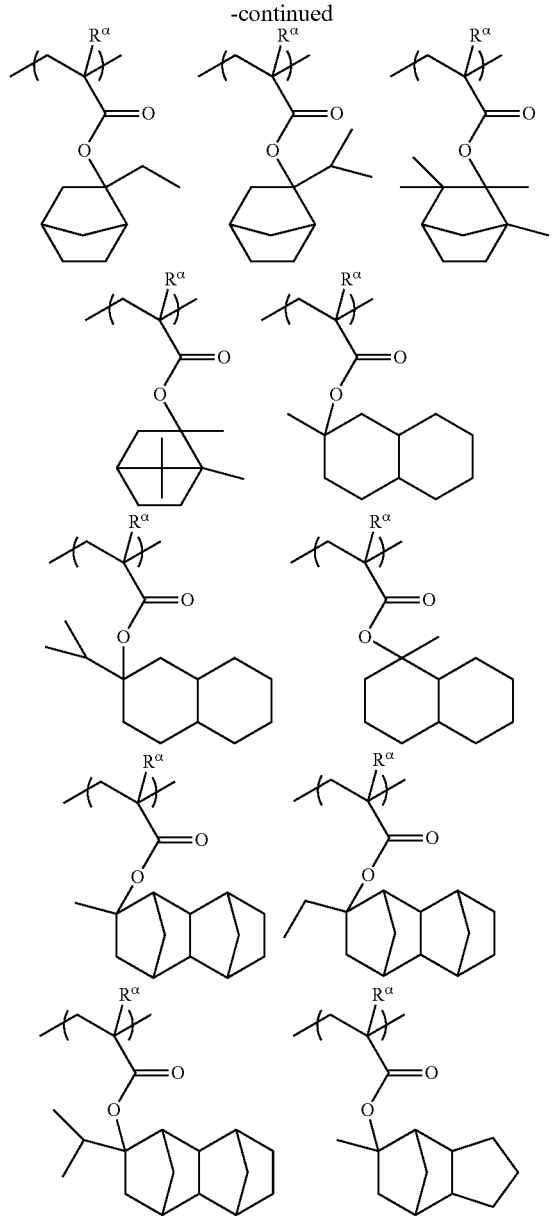
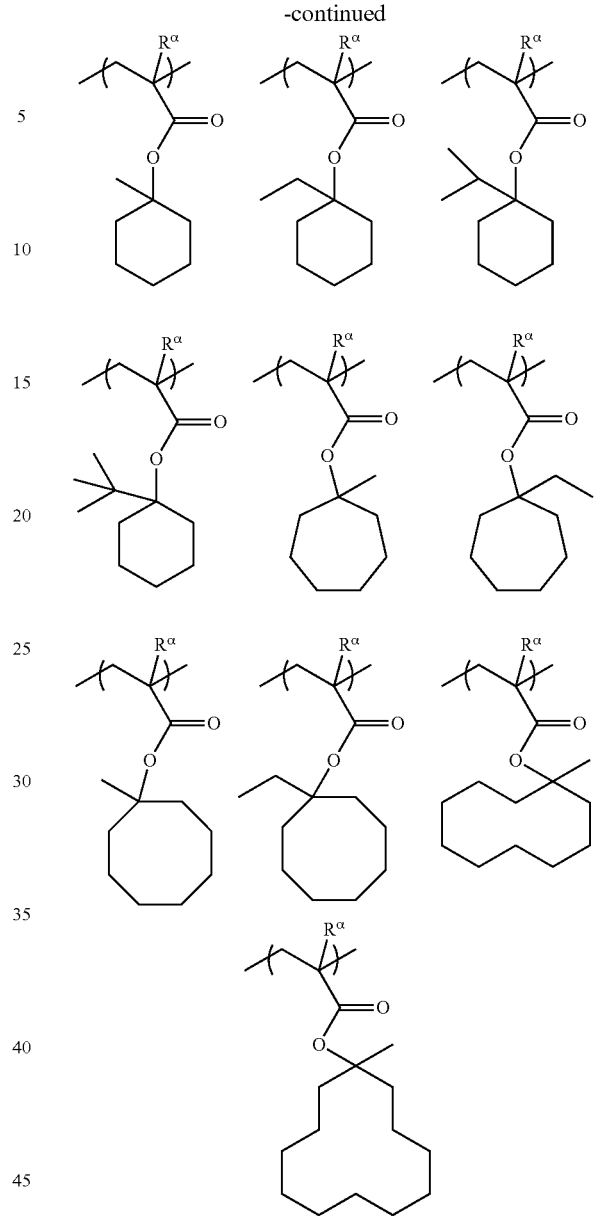
[Chemical Formula 34]
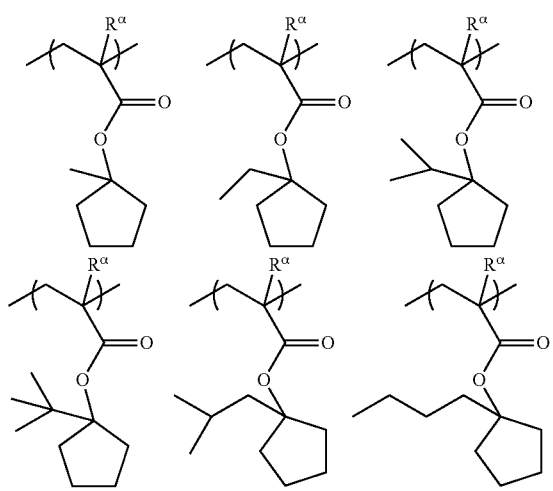
[Chemical Formula 35]
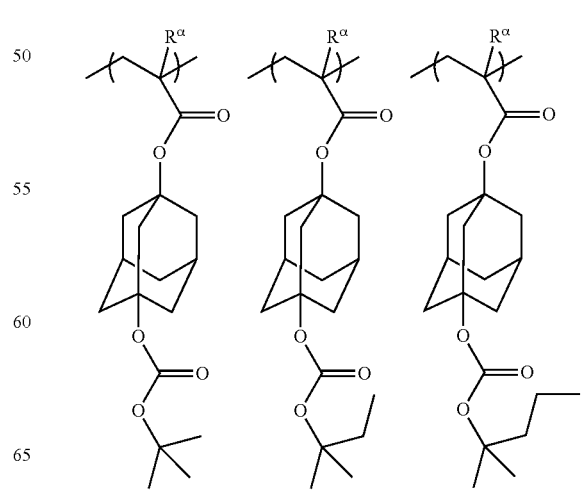

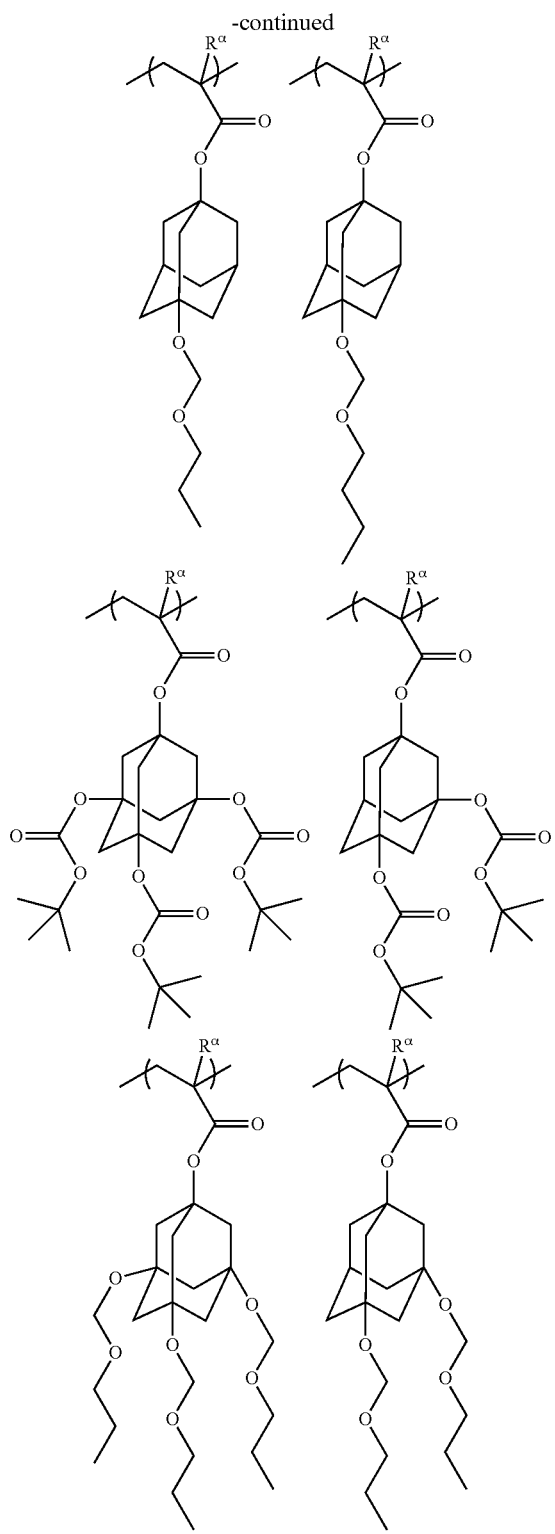

In the component (A), the amount of the structural unit (a1) based on the combined total of all structural units constituting the component (A) is preferably 1 to 60 mol %, more preferably 5 to 50 mol %, and still more preferably 10 to 40 mol %. By ensuring the lower limit, various lithography properties such as sensitivity, resolution and LWR are improved. On the other hand, when the amount of the structural unit (a1) is no more than the upper limit of the above-mentioned range, a good balance can be achieved with the other structural units.

(Structural Unit (a2))

The structural unit (a2) is a structural unit containing an —$SO_2$— containing cyclic group, a lactone-containing cyclic group or a carbonate-containing cyclic group.

When the component (A1) is used for forming a resist film, the structural unit (a2) containing an —$SO_2$— containing cyclic group, a lactone-containing cyclic group or a carbonate-containing cyclic group is effective in improving the adhesion between the resist film and the substrate.

In the present invention, the component (A1) preferably has a structural unit (a2).

The aforementioned structural unit (a1) which contains an —$SO_2$— containing cyclic group, a lactone-containing cyclic group or a carbonate-containing cyclic group falls under the definition of the structural unit (a2); however, such a structural unit is regarded as a structural unit (a1), and does not fall under the definition of the structural unit (a2).

The structural unit (a2) is preferably a structural unit represented by general formula (a2-1) shown below.

[Chemical Formula 36]

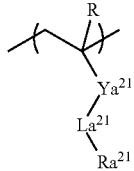

(a2-1)

In the formula, R represents a hydrogen atom, an alkyl group of 1 to 5 carbon atoms, a halogenated alkyl group of 1 to 5 carbon atoms, a hydroxyalkyl group, an alkoxy group; $Ya^{21}$ represents a single bond or a divalent linking group; $La^{21}$ represents —O—, —COO—, —CON(R')—, —OCO—, —CONHCO— or —CONHCS—; and R' represents a hydrogen atom or a methyl group, provided that, when $La^{21}$ represents —O—, $Ya^{21}$ does not represents —CO—; and $Ra^{21}$ represents an —$SO_2$— containing cyclic group, a lactone-containing cyclic group or a carbonate-containing cyclic group.

The divalent linking group for $Ya^{21}$ is not particularly limited, and preferable examples thereof include a divalent hydrocarbon group which may have a substituent and a divalent linking group containing a hetero atom.

(Divalent Hydrocarbon Group which May have a Substituent)

The hydrocarbon group as a divalent linking group may be either an aliphatic hydrocarbon group or an aromatic hydrocarbon group.

An "aliphatic hydrocarbon group" refers to a hydrocarbon group that has no aromaticity. The aliphatic hydrocarbon group may be saturated or unsaturated. In general, the aliphatic hydrocarbon group is preferably saturated.

Examples of the aliphatic hydrocarbon group include a linear or branched aliphatic hydrocarbon group, and an aliphatic hydrocarbon group containing a ring in the structure thereof. Specifically, groups exemplified above for $Va^1$ in the aforementioned formula (a1-1) ca be mentioned.

The linear or branched aliphatic hydrocarbon group may or may not have a substituent. Examples of the substituent include a fluorine atom, a fluorinated alkyl group of 1 to 5 carbon atoms, and a carbonyl group.

As examples of the hydrocarbon group containing a ring in the structure thereof, a cyclic aliphatic hydrocarbon group containing a hetero atom in the ring structure thereof and may have a substituent (a group in which two hydrogen atoms have been removed from an aliphatic hydrocarbon ring), a group in which the cyclic aliphatic hydrocarbon group is bonded to the terminal of the aforementioned chain-like aliphatic hydrocarbon group, and a group in which the cyclic aliphatic group is interposed within the aforementioned linear or branched aliphatic hydrocarbon group, can be given. As the linear or branched aliphatic hydrocarbon group, the same groups as those described above can be used.

The cyclic aliphatic hydrocarbon group preferably has 3 to 20 carbon atoms, and more preferably 3 to 12 carbon atoms.

Specific examples of the cyclic aliphatic hydrocarbon group include the same group as exemplified above for $Va^1$ in the aforementioned formula (a1-1).

The cyclic aliphatic hydrocarbon group may or may not have a substituent. Examples of the substituent include an alkyl group, an alkoxy group, a halogen atom, a halogenated alkyl group, a hydroxyl group and a carbonyl group.

The alkyl group as the substituent is preferably an alkyl group of 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

The cyclic aliphatic hydrocarbon group may have part of the carbon atoms constituting the ring structure thereof substituted with a substituent containing a hetero atom. As the substituent containing a hetero atom, —O—, —C(=O)—O—, —S—, —S(=O)$_2$— or —S(=O)$_2$—O— is preferable.

Specific examples of the aromatic hydrocarbon group as a divalent hydrocarbon group include the same group as exemplified above for $Va^1$ in the aforementioned formula (a1-1).

With respect to the aromatic hydrocarbon group, the hydrogen atom within the aromatic hydrocarbon group may be substituted with a substituent. For example, the hydrogen atom bonded to the aromatic ring within the aromatic hydrocarbon group may be substituted with a substituent. Examples of substituents include an alkyl group, an alkoxy group, a halogen atom, a halogenated alkyl group, and a hydroxyl group.

The alkyl group as the substituent is preferably an alkyl group of 1 to 5 carbon atoms, and a methyl group, an ethyl group, a propyl group, an n-butyl group or a tert-butyl group is particularly desirable.

As the alkoxy group, the halogen atom and the halogenated alkyl group for the substituent, the same groups as the aforementioned substituent groups for substituting a hydrogen atom within the cyclic aliphatic hydrocarbon group can be used.

(Divalent Linking Group Containing a Hetero Atom)

With respect to a divalent linking group containing a hetero atom, a hetero atom is an atom other than carbon and hydrogen, and examples thereof include an oxygen atom, a nitrogen atom, a sulfur atom and a halogen atom.

In the case where $Ya^{21}$ represents a divalent linking group containing a hetero atom, preferable examples of the linking group include —O—, —C(=O)—O—, —C(=O)—, —O—C(=O)—O—, —C(=O)—NH—, —NH—, —NH—C(=NH)— (wherein H may be substituted with a substituent such as an alkyl group or an acyl group), —S—, —S(=O)$_2$—, —S(=O)$_2$—O—, a group represented by general formula —Y$^{21}$—O—Y$^{22}$—, —Y$^{21}$—O—, —Y$^{21}$—C(=O)—O—, —C(=O)—O—Y$^{21}$, —[Y$^{21}$—C(=O)—O]$_{m'}$—Y$^{22}$— or —Y$^{21}$—O—C(=O)—Y$^{22}$— [in the formulae, Y$^{21}$ and Y$^{22}$ each independently represents a divalent hydrocarbon group which may have a substituent, and O represents an oxygen atom; and m' represents an integer of 0 to 3.

The divalent linking group containing a hetero atom represents —C(=O)—NH—, —NH—, or —NH—C(=NH)—, H may be substituted with a substituent such as an alkyl group, an acyl group or the like. The substituent (an alkyl group, an acyl group or the like) preferably has 1 to 10 carbon atoms, more preferably 1 to 8, and most preferably 1 to 5.

In formulae —Y$^{21}$—O—Y$^{22}$—, —Y$^{21}$—O—, —Y$^{21}$—C—(=O), —C(=O)—O—Y$^{21}$, —[Y$^{21}$—C(=O)—O]$_{m'}$—Y$^{22}$— and —Y$^{21}$—O—C(=O)—Y$^{22}$—, Y$^{21}$ and Y$^{22}$ each independently represents a divalent hydrocarbon group which may have a substituent. Examples of the divalent hydrocarbon group include the same groups as those described above as the "divalent hydrocarbon group which may have a substituent" in the explanation of the aforementioned divalent linking group.

As Y$^{21}$, a linear aliphatic hydrocarbon group is preferable, more preferably a linear alkylene group, still more preferably a linear alkylene group of 1 to 5 carbon atoms, and a methylene group or an ethylene group is particularly desirable.

As Y$^{22}$, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula —[Y$^{21}$—C(=O)—O]$_{m'}$—Y$^{22}$—, m' represents an integer of 0 to 3, preferably an integer of 0 to 2, more preferably 0 or 1, and most preferably 1. Namely, it is particularly desirable that the group represented by the formula —[Y$^{21}$—C(=O)—O]$_{m'}$—Y$^{22}$— is a group represented by the formula —Y$^{21}$—C(=O)—O—Y$^{22}$—. Among these, a group represented by the formula —(CH$_2$)$_{a'}$—C(=O)—O—(CH$_2$)$_{b'}$— is preferable. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

In the present invention, $Ya^{21}$ preferably represents an ester bond [—C(=O)—O—], an ether bond (—O—), a linear or branched alkylene group, a combination of these, or a single bond.

In formula (a2-1), $Ra^{21}$ represents an —SO$_2$— containing cyclic group, a lactone-containing cyclic group or a carbonate-containing cyclic group.

An "—SO₂— containing cyclic group" refers to a cyclic group having a ring containing —SO₂— within the ring structure thereof, i.e., a cyclic group in which the sulfur atom (S) within —SO₂— forms part of the ring skeleton of the cyclic group. The ring containing —SO₂— within the ring skeleton thereof is counted as the first ring. A cyclic group in which the only ring structure is the ring that contains —SO₂— in the ring skeleton thereof is referred to as a monocyclic group, and a group containing other ring structures is described as a polycyclic group regardless of the structure of the other rings. The —SO₂— containing cyclic group may be either a monocyclic group or a polycyclic group.

As the —SO₂— containing cyclic group for the cyclic hydrocarbon group represented by $R^1$, a cyclic group containing —O—SO₂— within the ring skeleton thereof, i.e., a cyclic group containing a sultone ring in which —O—S— within the —O—SO₂— group forms part of the ring skeleton thereof is particularly desirable. Specific examples of the —SO₂— containing cyclic group include groups represented by general formulae (a5-r-1) to (a5-r-4) shown below.

[Chemical Formula 37]

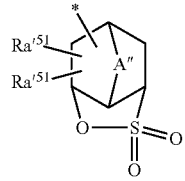
(a5-r-1)

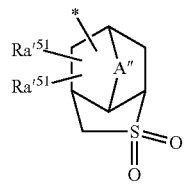
(a5-r-2)

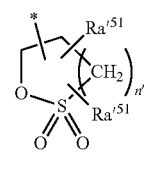
(a5-r-3)

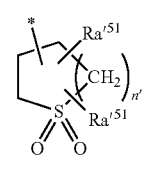
(a5-r-4)

In the formulae, each $Ra'^{51}$ independently represents a hydrogen atom, an alkyl group, an alkoxy group, a halogen atom, a halogenated alkyl group, a hydroxy group, —COOR'', —OC(=O)R'', a hydroxyalkyl group or a cyano group; R'' represents a hydrogen atom or an alkyl group; A'' represents an oxygen atom, a sulfur atom or an alkylene group of 1 to 5 carbon atoms which may contain an oxygen atom or a sulfur atom; and n' represents an integer of 0 to 2.

In general formulae (a5-r-1) to (a5-r-4), A'' is the same as defined for A'' in general formulae (a2-r-1) to (a2-r-7) described later. The alkyl group, alkoxy group, halogen atom, halogenated alkyl group, —COOR'', —OC(=O)R'' and hydroxyalkyl group for $Ra'^{51}$ are the same as defined for $Ra'^{21}$ in general formulae (a2-r-1) to (a2-r-7) described later.

Specific examples of the groups represented by the aforementioned general formulas (a5-r-1) to (a5-r-4) are shown below. In the formulae shown below, "Ac" represents an acetyl group.

[Chemical Formula 38]

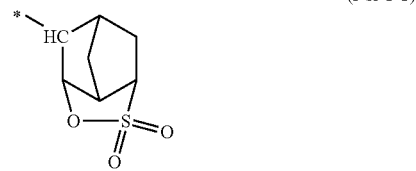
(r-sl-1-1)

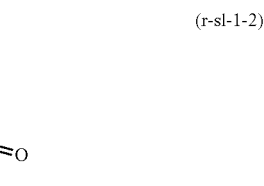
(r-sl-1-2)

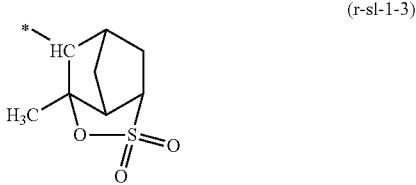
(r-sl-1-3)

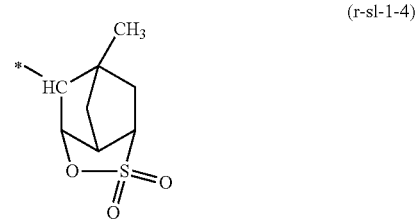
(r-sl-1-4)

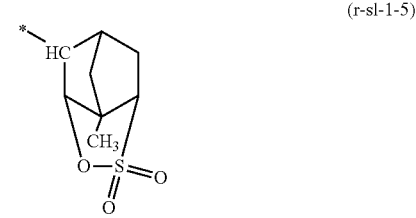
(r-sl-1-5)

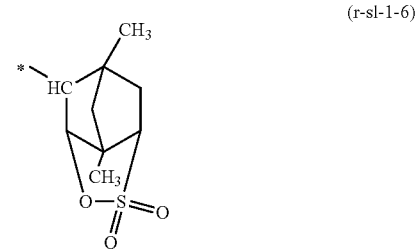
(r-sl-1-6)

-continued
(r-sl-1-7)
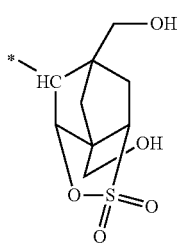
(r-sl-1-8)
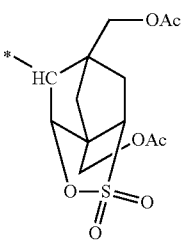
(r-sl-1-9)
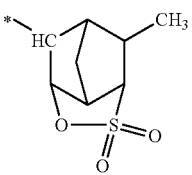
(r-sl-1-10)
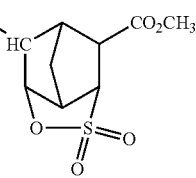
(r-sl-1-11)
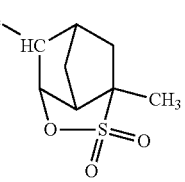
(r-sl-1-12)
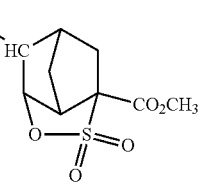
(r-sl-1-13)
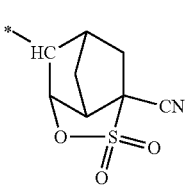
(r-sl-1-14)
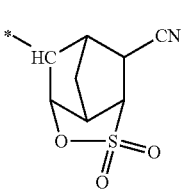
-continued
(r-sl-1-15)
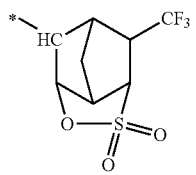
(r-sl-1-16)
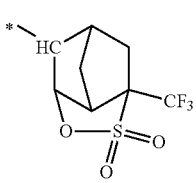
(r-sl-1-17)
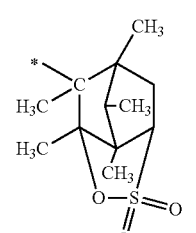
(r-sl-1-18)
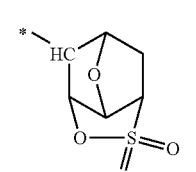
(r-sl-1-19)
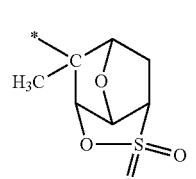
(r-sl-1-20)
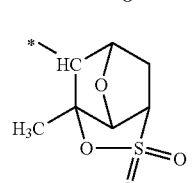
(r-sl-1-21)
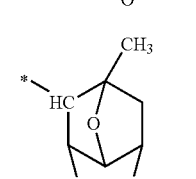
[Chemical Formula 39]
(r-sl-1-22)
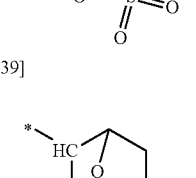

-continued (r-sl-1-23)
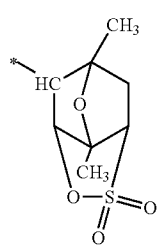

(r-sl-1-24)
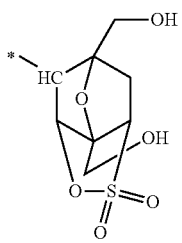

(r-sl-1-25)
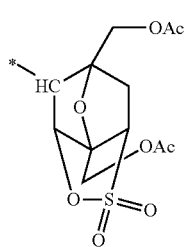

(r-sl-1-26)
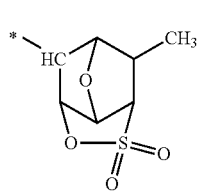

(r-sl-1-27)
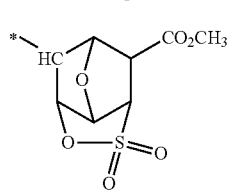

(r-sl-1-28)
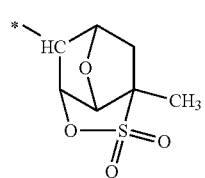

(r-sl-1-29)
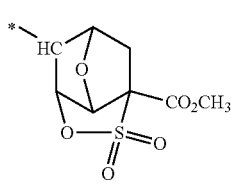

(r-sl-1-30)
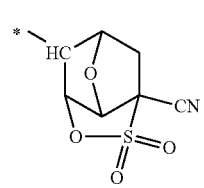

-continued (r-sl-1-31)
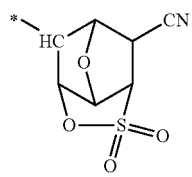

(r-sl-1-32)
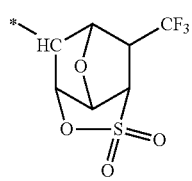

(r-sl-1-33)
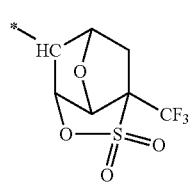

[Chemical Formula 40]

(r-sl-2-1)
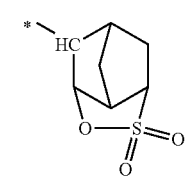

(r-sl-2-2)
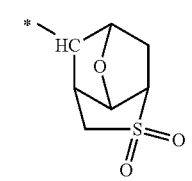

(r-sl-3-1)
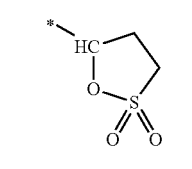

(r-sl-4-1)
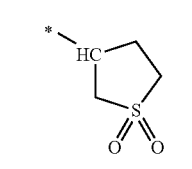

As the —$SO_2$— containing cyclic group, a group represented by the aforementioned general formula (a5-r-1) is preferable, at least one member selected from the group consisting of groups represented by the aforementioned chemical formulas (r-s1-1-1), (r-s1-1-18), (r-s1-3-1) and (r-s1-4-1) is more preferable, and a group represented by chemical formula (r-s1-1-1) is most preferable.

The term "lactone-containing cyclic group" refers to a cyclic group including a ring containing a —O—C(=O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings. The lactone-containing cyclic group may be either a monocyclic group or a polycyclic group.

The lactone-containing cyclic group as the cyclic hydrocarbon group for $R^1$ is not particularly limited, and an arbitrary group may be used. Specific examples include groups represented by general formulas (a2-r-1) to (a2-r-7) shown below. Hereinbelow, "*" represents a valence bond.

[Chemical Formula 41]

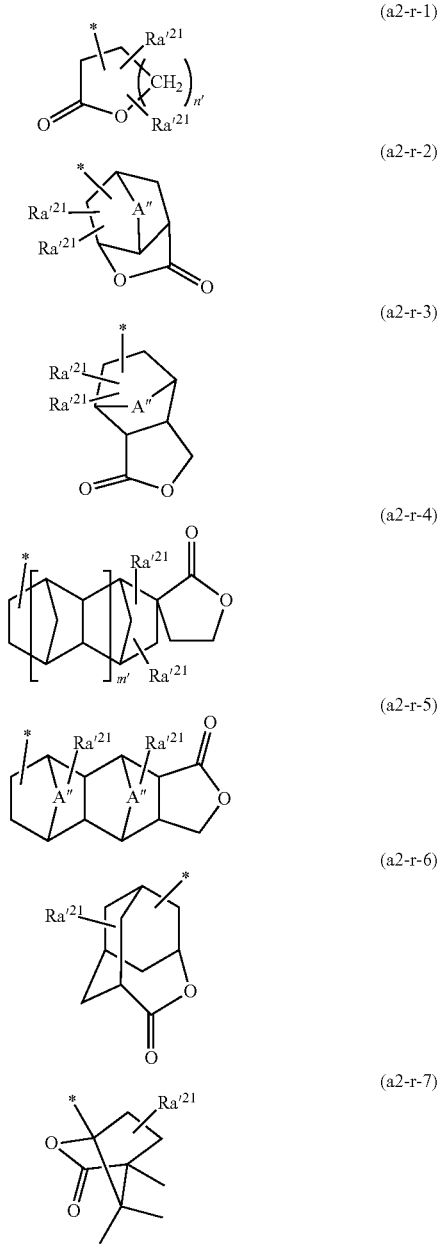

In the formulae, each $Ra'^{21}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom or an alkyl group; A" represents an oxygen atom, a sulfur atom or an alkylene group of 1 to 5 carbon atoms which may contain an oxygen atom or a sulfur atom; n' represents an integer of 0 to 2; and m' represents 0 or 1.

In general formulae (a2-r-1) to (a2-r-7) above, A" represents an oxygen atom (—O—), a sulfur atom (—S—) or an alkylene group of 1 to 5 carbon atoms which may contain an oxygen atom or a sulfur atom. As the alkylene group of 1 to 5 carbon atoms for A", a linear or branched alkylene group is preferable, and examples thereof include a methylene group, an ethylene group, an n-propylene group and an isopropylene group. Examples of alkylene groups that contain an oxygen atom or a sulfur atom include the aforementioned alkylene groups in which —O— or —S— is bonded to the terminal of the alkylene group or present between the carbon atoms of the alkylene group. Specific examples of such alkylene groups include —O—CH$_2$—, —CH$_2$—O—CH$_2$—, —S—CH$_2$— and —CH$_2$—S—CH$_2$—. As A", an alkylene group of 1 to 5 carbon atoms or —O— is preferable, more preferably an alkylene group of 1 to 5 carbon atoms, and most preferably a methylene group. Each $Ra'^{21}$ independently represents an alkyl group, an alkoxy group, a halogen atom, a halogenated alkyl group, —COOR", —OC(=O)R", a hydroxyalkyl group or a cyano group.

The alkyl group for $Ra'^{21}$ is preferably an alkyl group of 1 to 5 carbon atoms.

The alkoxy group for $Ra'^{21}$ is preferably an alkoxy group of 1 to 6 carbon atoms.

Further, the alkoxy group is preferably a linear or branched alkoxy group. Specific examples of the alkoxy groups include the aforementioned alkyl groups for $Ra'^{21}$ having an oxygen atom (—O—) bonded thereto.

As examples of the halogen atom for $Ra'^{21}$, a fluorine atom, chlorine atom, bromine atom and iodine atom can be given. Among these, a fluorine atom is preferable.

Examples of the halogenated alkyl group for $Ra'^{21}$ include groups in which part or all of the hydrogen atoms within the aforementioned alkyl group for $Ra'^{21}$ has been substituted with the aforementioned halogen atoms. As the halogenated alkyl group, a fluorinated alkyl group is preferable, and a perfluoroalkyl group is particularly desirable.

Specific examples of the groups represented by the aforementioned general formulae (a2-r-1) to (a2-r-7) are shown below.

[Chemical Formula 42]

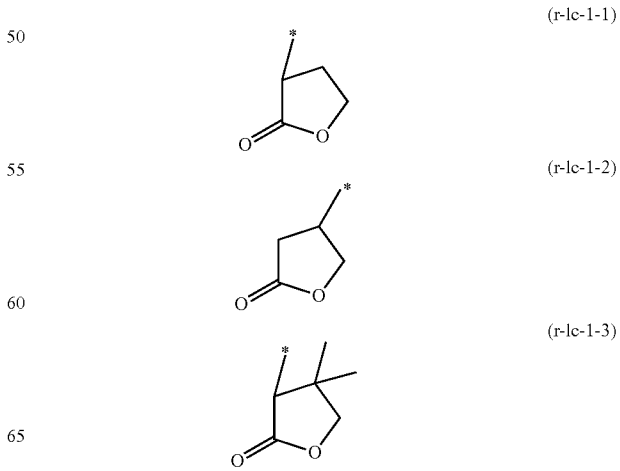

(r-lc-1-4)
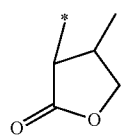
(r-lc-1-5)
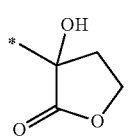
(r-lc-1-6)
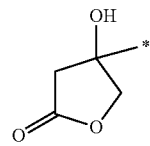
(r-lc-1-7)
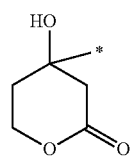
(r-lc-2-1)
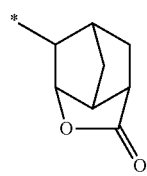
(r-lc-2-2)
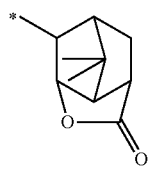
(r-lc-2-3)
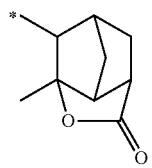
(r-lc-2-4)
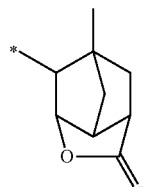
(r-lc-2-5)
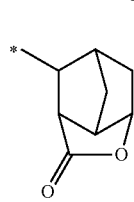
(r-lc-2-6)
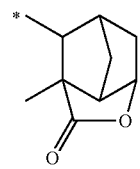
(r-lc-2-7)
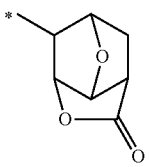
(r-lc-2-8)
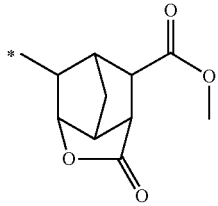
(r-lc-2-9)
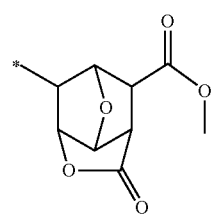
(r-lc-2-10)
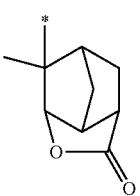
(r-lc-2-11)
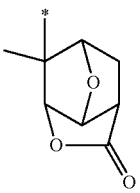
(r-lc-2-12)
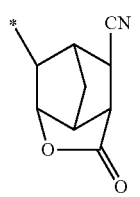
(r-lc-2-13)
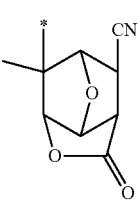

-continued
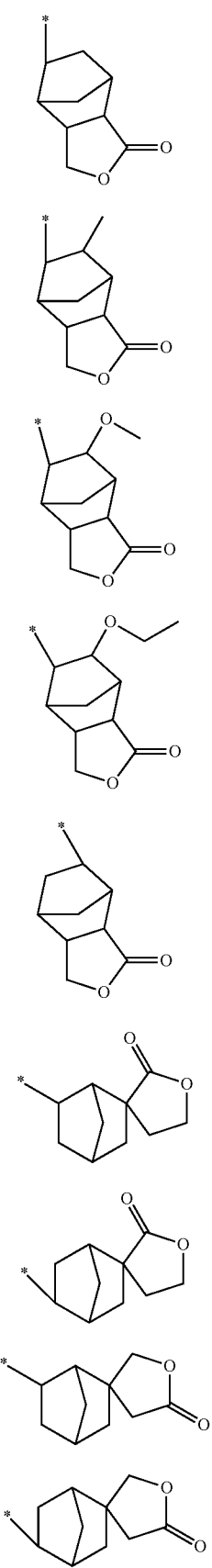
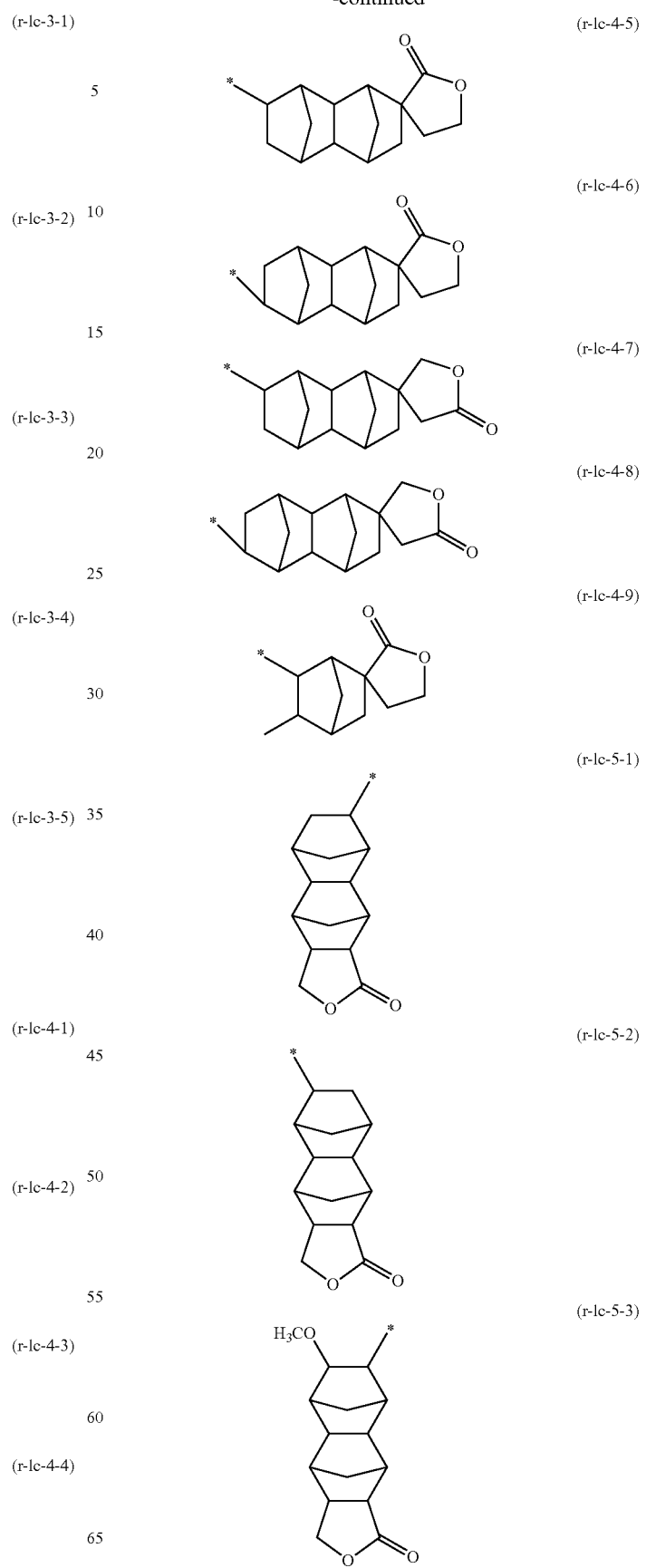

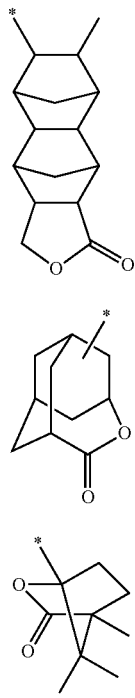

(r-lc-5-4)

(r-lc-6-1)

(r-lc-7-1)

The term "carbonate-containing cyclic group" refers to a cyclic group including a ring containing a —O—C(=O)—O— structure (carbonate ring). The term "carbonate ring" refers to a single ring containing a —O—C(=O)—O— structure, and this ring is counted as the first ring. A carbonate-containing cyclic group in which the only ring structure is the carbonate ring is referred to as a monocyclic group, and groups containing other ring structures are described as polycyclic groups regardless of the structure of the other rings. The carbonate-containing cyclic group may be either a monocyclic group or a polycyclic group.

The carbonate-containing cyclic group as the cyclic hydrocarbon group for $R^1$ is not particularly limited, and an arbitrary group may be used. Specific examples include groups represented by general formulas (ax3-r-1) to (ax3-r-3) shown below.

[Chemical Formula 43]

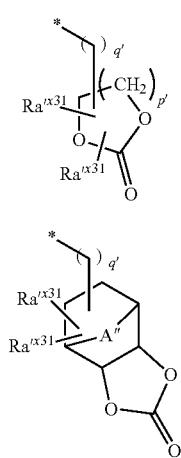

(ax3-r-1)

(ax3-r-2)

(ax3-r-3)

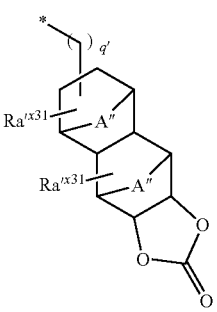

In the formulae, each $Ra'^{x31}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom or an alkyl group; A" represents an oxygen atom, a sulfur atom or an alkylene group of 1 to 5 carbon atoms which may contain an oxygen atom or a sulfur atom; and q' represents 0 or 1.

In general formulae (ax3-r-1) to (ax3-r-3), A" is the same as defined for A" in general formula (a2-r-1).

Examples of the alkyl group, alkoxy group, halogen atom, halogenated alkyl group, —COOR", —OC(=O)R" and hydroxyalkyl group for $Ra'^{31}$ include the same groups as those described above in the explanation of $Ra'^{21}$ in the general formulas (a2-r-1) to (a2-r-7).

Specific examples of the groups represented by the aforementioned general formulae (ax3-r-1) to (ax3-r-3) are shown below.

[Chemical Formula 44]

(r-cr-1-1)

(r-cr-1-2)

(r-cr-1-3)

(r-cr-1-4)

(r-cr-1-5)
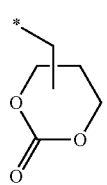
(r-cr-1-6)
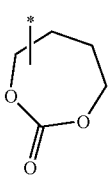
(r-cr-1-6)
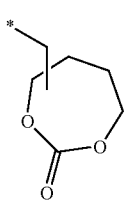
(r-cr-2-1)
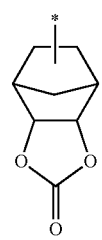
(r-cr-2-2)
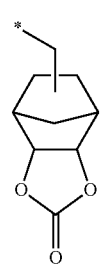
(r-cr-2-3)
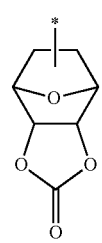
(r-cr-2-4)
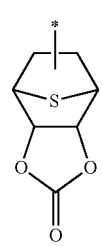
(r-cr-3-1)
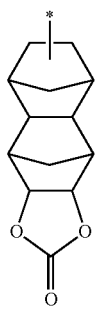
(r-cr-3-2)
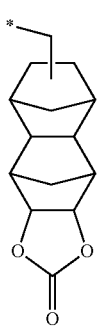
(r-cr-3-3)
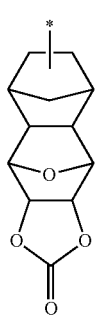
(r-cr-3-4)
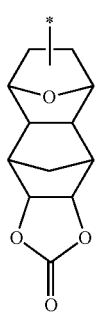
(r-cr-3-5)
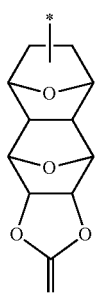
Among these examples, as the lactone-containing cyclic group, a group represented by general formula (a2-r-1) or (a2-r-2) is preferable, and a group represented by the chemical formula (r-1c-1-1) is more preferable.

As the structural unit (a2) contained in the component (A), 1 kind of structural unit may be used, or 2 or more kinds may be used.

When the component (A) contains the structural unit (a2), the amount of the structural unit (a2) based on the combined total of all structural units constituting the component (A) is preferably 1 to 80 mol %, more preferably 5 to 70 mol %, still more preferably 10 to 65 mol %, and most preferably 10 to 60 mol %. When the amount of the structural unit (a2) is at least as large as the lower limit of the above-mentioned range, the effect of using the structural unit (a2) can be satisfactorily achieved. On the other hand, when the amount of the structural unit (a2) is no more than the upper limit of the above-mentioned range, a good balance can be achieved with the other structural units, and various lithography properties and pattern shape can be improved.

(Structural Unit (a3))

The structural unit (a3) is a structural unit containing a polar group-containing aliphatic hydrocarbon group (provided that the structural units that fall under the definition of structural units (a1) and (a2) are excluded).

When the component (A) includes the structural unit (a3), it is presumed that the hydrophilicity of the component (A) is enhanced, thereby contributing to improvement in resolution.

Examples of the polar group include a hydroxyl group, cyano group, carboxyl group, or hydroxyalkyl group in which part of the hydrogen atoms of the alkyl group have been substituted with fluorine atoms, although a hydroxyl group is particularly desirable.

Examples of the aliphatic hydrocarbon group include linear or branched hydrocarbon groups (preferably alkylene groups) of 1 to 10 carbon atoms, and cyclic aliphatic hydrocarbon groups (cyclic groups). These cyclic groups can be selected appropriately from the multitude of groups that have been proposed for the resins of resist compositions designed for use with ArF excimer lasers. The cyclic group is preferably a polycyclic group, more preferably a polycyclic group of 7 to 30 carbon atoms.

Of the various possibilities, structural units derived from an acrylate ester that include an aliphatic polycyclic group that contains a hydroxyl group, cyano group, carboxyl group or a hydroxyalkyl group in which part of the hydrogen atoms of the alkyl group have been substituted with fluorine atoms are particularly desirable. Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

As the structural unit (a3), there is no particular limitation as long as it is a structural unit containing a polar group-containing aliphatic hydrocarbon group, and an arbitrary structural unit may be used.

The structural unit (a3) is preferably a structural unit derived from an acrylate ester which may have the hydrogen atom bonded to the carbon atom on the α-position substituted with a substituent and contains a polar group-containing aliphatic hydrocarbon group.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2) and (a3-3) shown below are preferable.

[Chemical Formula 45]

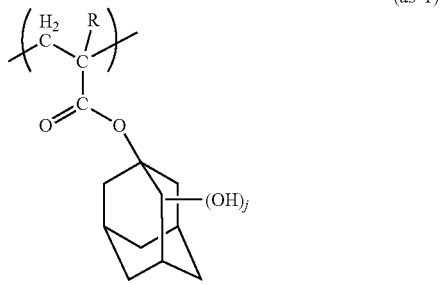

(a3-1)

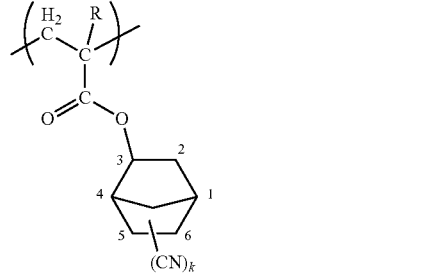

(a3-2)

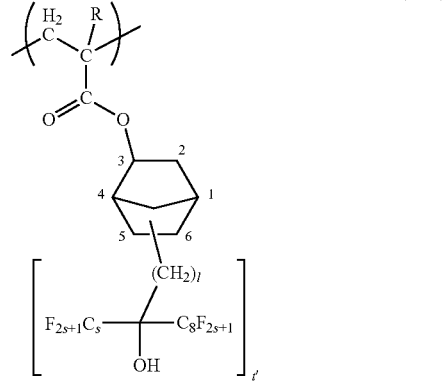

(a3-3)

In the formulas, R is the same as defined above; j is an integer of 1 to 3; k is an integer of 1 to 3; t' is an integer of 1 to 3; l is an integer of 1 to 5; and s is an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbornyl group.

In formula (a3-3), t' is preferably 1. l is preferably 1. s is preferably 1. Further, it is preferable that a 2-norbornyl group or 3-norbornyl group be bonded to the terminal of the carboxy group of the acrylic acid. The fluorinated alkyl alcohol is preferably bonded to the 5th or 6th position of the norbornyl group.

As the structural unit (a3) contained in the component (A), 1 kind of structural unit may be used, or 2 or more kinds may be used.

The amount of the structural unit (a3) within the component (A) based on the combined total of all structural units constituting the component (A) is preferably 5 to 50 mol %, more preferably 5 to 40 mol %, and still more preferably 5 to 25 mol %.

When the amount of the structural unit (a3) is at least as large as the lower limit of the above-mentioned range, the effect of using the structural unit (a3) can be satisfactorily achieved. On the other hand, when the amount of the structural unit (a3) is no more than the upper limit of the above-mentioned range, a good balance can be achieved with the other structural units.

(Structural Unit (a4))

The structural unit (a4) is a structural unit containing an acid non-dissociable cyclic group. When the component (A) includes the structural unit (a4), dry etching resistance of the resist pattern to be formed is improved. Further, the hydrophobicity of the component (A) is further improved. Increase in the hydrophobicity contributes to improvement in terms of resolution, shape of the resist pattern and the like, particularly in an organic solvent developing process.

An "acid non-dissociable, aliphatic cyclic group" in the structural unit (a4) refers to a cyclic group which is not dissociated by the action of acid generated from the component (B) described later upon exposure, and remains in the structural unit.

As the structural unit (a4), a structural unit which contains a non-acid-dissociable aliphatic cyclic group, and is also derived from an acrylate ester is preferable. Examples of this cyclic group include the same groups as those described above in relation to the aforementioned structural unit (a1), and any of the multitude of conventional groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecyl group, adamantyl group, tetracyclododecyl group, isobornyl group, and norbornyl group is particularly desirable. These polycyclic groups may be substituted with a linear or branched alkyl group of 1 to 5 carbon atoms.

Specific examples of the structural unit (a4) include units with structures represented by general formulas (a4-1) to (a4-7) shown below.

[Chemical Formula 46]

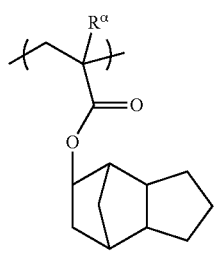
(a4-1)

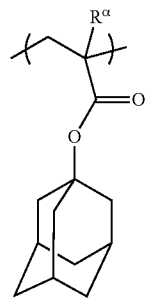
(a4-2)

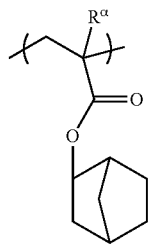
(a4-3)

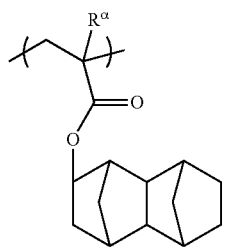
(a4-4)

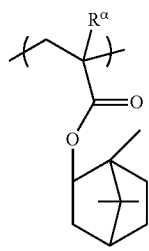
(a4-5)

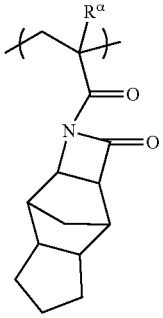
(a4-6)

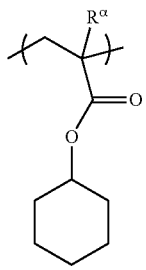

(a4-7)

In the formulae, $R^\alpha$ represents a hydrogen atom, a methyl group or a trifluoromethyl group.

As the structural unit (a4) contained in the component (A), 1 kind of structural unit may be used, or 2 or more kinds may be used.

When the structural unit (a4) is included in the component (A), the amount of the structural unit (a4) based on the combined total of all the structural units that constitute the component (A) is preferably within the range from 1 to 30 mol %, and more preferably from 10 to 20 mol %.

The component (A1) is preferably a copolymer having the structural units (a0) and (st).

The component (A2) is preferably a copolymer having the structural units (a9), (a1) and (a2).

The component (A) can be obtained, for example, by a conventional radical polymerization or the like of the monomers corresponding with each of the structural units, using a radical polymerization initiator such as azobisisobutyronitrile (AIBN) or dimethyl 2,2'-azobis(isobutyrate).

Furthermore, in the component (A1), by using a chain transfer agent such as HS—CH$_2$—CH$_2$—CH$_2$—C(CF$_3$)$_2$—OH, a —C(CF$_3$)$_2$—OH group can be introduced at the terminals of the component (A1). Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

In the present invention, the weight average molecular weight (Mw) (the polystyrene equivalent value determined by gel permeation chromatography) of the component (A) is not particularly limited, but is preferably 1,000 to 50,000, more preferably 1,500 to 30,000, and most preferably 2,000 to 20,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

As the component (A), one type may be used alone, or two or more types may be used in combination.

In the component (A), the amount of the component (A1) based on the total weight of the component (A) is preferably 25% by weight or more, more preferably 50% by weight or more, still more preferably 75% by weight or more, and may be even 100% by weight. When the amount of the component (A1) is 25% by weight or more, various lithography properties are improved.

In the resist composition of the present invention, as the component (A), one type may be used, or two or more types of compounds may be used in combination.

In the resist composition of the present invention, the amount of the component (A) can be appropriately adjusted depending on the thickness of the resist film to be formed, and the like.

<Acid Generator Component; Component (B)>

The resist composition of the present invention includes an acid generator component (B) (hereafter, referred to as "component (B)") which generates acid upon exposure. As the component (B), there is no particular limitation as long as it contains a compound having a cation moiety having an electron withdrawing group, and any of the known acid generators used in conventional chemically amplified resist compositions can be used.

Examples of these acid generators are numerous, and include onium salt acid generators such as iodonium salts and sulfonium salts; oxime sulfonate acid generators; diazomethane acid generators such as bisalkyl or bisaryl sulfonyl diazomethanes and poly(bis-sulfonyl)diazomethanes; nitrobenzylsulfonate acid generators; iminosulfonate acid generators; and disulfone acid generators, each of which having a cation moiety having an electron withdrawing group. Among these, it is preferable to use an onium salt acid generator.

As the onium salt acid generator, a compound represented by general formula (b-1) below (hereafter, sometimes referred to as "component (b-1)"), a compound represented by general formula (b-2) below (hereafter, sometimes referred to as "component (b-2)") or a compound represented by general formula (b-3) below (hereafter, sometimes referred to as "component (b-3)") may be used.

[Chemical Formula 47]

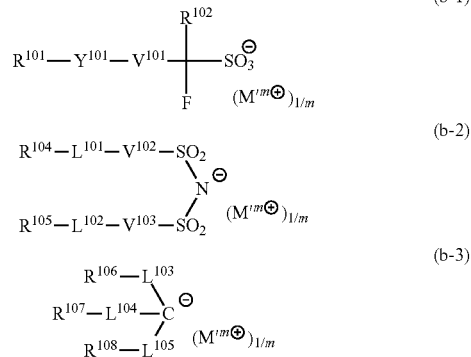

In the formulae, $R^{101}$ and $R^{104}$ to $R^{108}$ each independently represents a cyclic group which may have a substituent, a chain-like alkyl group which may have a substituent or a chain-like alkenyl group which may have a substituent, provided that $R^{104}$ and $R^{105}$ may be mutually bonded to form a ring $R^{106}$ and $R^{107}$ may be mutually bonded to form a ring; $R^{102}$ represents a fluorine atom or a fluorinated alkyl group of 1 to 5 carbon atoms; $Y^{101}$ represents a single bond or a divalent linking group containing an oxygen atom; $V^{101}$ to $V^{103}$ each independently represents a single bond, an alkylene group or a fluorinated alkylene group; $L^{101}$ and $L^{102}$ each independently represents a single bond or an oxygen atom; $L^{103}$ to $L^{105}$ each independently represents a single bond, —CO— or —SO$_2$—; and $M^{m+}$ represents an organic cation having a valency of m and a cation moiety having an electron withdrawing group.

{Anion Moiety}

—Anion Moiety of Component (b-1)

In the formula (b-1), $R^{101}$ represents a cyclic group which may have a substituent, a chain-like alkyl group which may have a substituent or a chain-like alkenyl group which may have a substituent.

(Cyclic Group which May have a Substituent for $R^{101}$)

The cyclic group is preferably a cyclic hydrocarbon group, and the cyclic hydrocarbon group may be either an aromatic hydrocarbon group or an aliphatic hydrocarbon group.

As the aromatic hydrocarbon group for $R^{101}$, groups in which one hydrogen atom has been removed from an aromatic hydrocarbon ring described above in relation to the divalent aromatic hydrocarbon group for $Va^1$ in the formula (a1-1) or an aromatic compound containing two or more aromatic ring can be mentioned, and a phenyl group or a naphthyl group is preferable.

As the cyclic aliphatic hydrocarbon group for $R^{101}$, groups in which one hydrogen atom has been removed from a monocycloalkane or a polycycloalkane exemplified above in the explanation of the divalent aliphatic hydrocarbon group for $Va^1$ in the formula (a1-1) can be mentioned, and an adamantyl group or a norbornyl group is preferable.

Further, the cyclic hydrocarbon group for $R^{101}$ may contain a hetero atom like as a heterocycle, and specific examples thereof include lactone-containing cyclic groups represented by the aforementioned general formulas (a2-r-1) to (a2-r-7), —$SO_2$— containing cyclic groups represented by the aforementioned formulas (a5-r-1) to (a5-r-4) and heterocyclic groups (r-hr-1) to (r-hr-16) shown below.

[Chemical Formula 48]

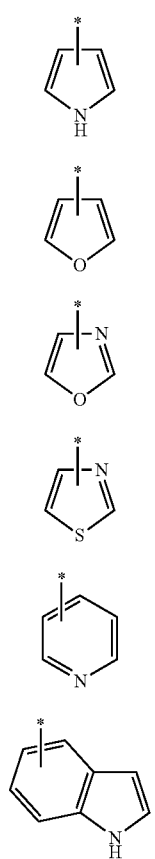

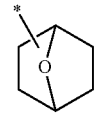
(r-hr-7)

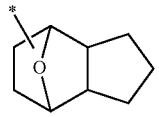
(r-hr-8)

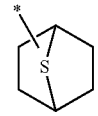
(r-hr-9)

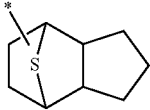
(r-hr-10)

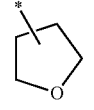
(r-hr-11)

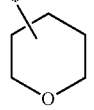
(r-hr-12)

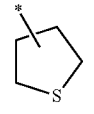
(r-hr-13)

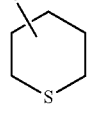
(r-hr-14)

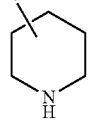
(r-hr-15)

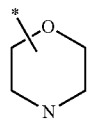
(r-hr-16)

As the substituent for the cyclic hydrocarbon group for $R^{101}$, an alkyl group, an alkoxy group, a halogen atom, a halogenated alkyl group, a hydroxyl group, a carbonyl group, a nitro group or the like can be used.

The alkyl group as the substituent is preferably an alkyl group of 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Example of the aforementioned halogenated alkyl group includes a group in which a part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

(Chain-Like Alkyl Group which May have a Substituent for $R^{101}$)

The chain-like alkyl group for $R^{101}$ may be linear or branched.

The linear alkyl group preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched alkyl group preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

(Chain-Like Alkenyl Group which May have a Substituent for $R^{101}$)

The chain-like alkenyl group for $R^{101}$ may be linear or branched, and preferably has 2 to 10 carbon atoms, more preferably 2 to 5 carbon atoms, still more preferably 2 to 4 carbon atoms, and most preferably 3 carbon atoms. Examples of linear alkenyl groups include a vinyl group, a propenyl group (an allyl group) and a butynyl group. Examples of branched alkenyl groups include a 1-methylpropenyl group and a 2-methylpropenyl group.

Among the above-mentioned examples, as the chain-like alkenyl group, a propenyl group is particularly desirable.

As the substituent for the chain-like alkyl group or alkenyl group for $R^{101}$, an alkoxy group, a halogen atom, a halogenated alkyl group, a hydroxyl group, a carbonyl group, a nitro group, an amino group, a cyclic group for $R^{101}$ or the like can be used.

Among these examples, as $R^{101}$, a cyclic group which may have a substituent is preferable, and a cyclic hydrocarbon group which may have a substituent is more preferable. Specifically, a phenyl group, a naphthyl group, a group in which one or more hydrogen atoms have been removed from a polycycloalkane, a lactone-containing cyclic group represented by any one of the aforementioned formula (a2-r-1) to (a2-r-7), and an —$SO_2$— containing cyclic group represented by any one of the aforementioned formula (a5-r-1) to (a5-r-4).

In formula (b-1), $Y^{101}$ represents a single bond or a divalent linking group containing an oxygen atom.

In the case where $Y^{101}$ is a divalent linking group containing an oxygen atom, $Y^{101}$ may contain an atom other than an oxygen atom. Examples of atoms other than an oxygen atom include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond; —O—), an ester bond (—C(=O)—O—), an oxycarbonyl group (—O—C(=O)—), an amido bond (—C(=O)—NH—), a carbonyl group (—C(=O)—) and a carbonate bond (—O—C(=O)—O—); and combinations of the aforementioned non-hydrocarbon, hetero atom-containing linking groups with an alkylene group. Furthermore, the combinations may have a sulfonyl group (—$SO_2$—) bonded thereto. As the combination, the linking group represented by formulas (y-a1-1) to (y-a1-7) shown below can be mentioned.

[Chemical Formula 49]

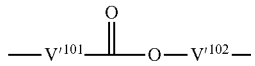
(y-a1-1)

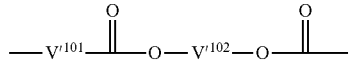
(y-a1-2)

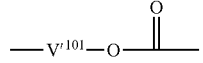
(y-a1-3)

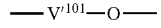
(y-a1-4)

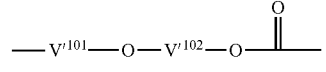
(y-a1-5)

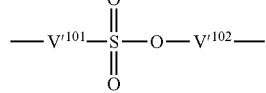
(y-a1-6)

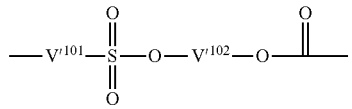
(y-a1-7)

In the formulae, $V'^{101}$ represents a single bond or an alkylene group of 1 to 5 carbon atoms; $V'^{102}$ represents a divalent saturated hydrocarbon group of 1 to 30 carbon atoms.

The divalent saturated hydrocarbon group for $V'^{102}$ is preferably an alkylene group of 1 to 30 carbon atoms.

The alkylene group for $V'^{101}$ and $v'^{102}$ may be a linear alkylene group or a branched alkylene group, and a linear alkylene group is preferable.

Specific examples of the alkylene group for $V'^{101}$ and $V'^{102}$ include a methylene group [—$CH_2$—]; an alkylmethylene group, such as —CH($CH_3$)—, —CH($CH_2CH_3$)—, —C($CH_3$)$_2$—, —C($CH_3$)($CH_2CH_3$), —C($CH_3$)($CH_2CH_2CH_3$)— and —C($CH_2CH_3$)$_2$—; an ethylene group [—$CH_2CH_2$—]; an alkylethylene group, such as —CH($CH_3$)$CH_2$—, —CH($CH_3$)CH($CH_3$)—, —C($CH_3$)$_2$$CH_2$— and —CH($CH_2CH_3$)$CH_2$—; a trimethylene group (n-propylene group) [—$CH_2CH_2CH_2$—]; an alkyltrimethylene group, such as —CH($CH_3$)$CH_2CH_2$— and —$CH_2$CH($CH_3$)$CH_2$—; a tetramethylene group [—$CH_2CH_2CH_2CH_2$—]; an alkyltetramethylene group, such as —CH($CH_3$)$CH_2CH_2CH_2$—, —$CH_2$CH($CH_3$)$CH_2CH_2$—; and a pentamethylene group [—$CH_2CH_2CH_2CH_2CH_2$—].

Further, part of methylene group within the alkylene group for $V'^{101}$ and $v'^{102}$ may be substituted with a divalent aliphatic cyclic group of 5 to 10 carbon atoms. The aliphatic cyclic group is preferably a divalent group in which one hydrogen atom has been removed from the cyclic aliphatic hydrocarbon group for Ra'³ in the aforementioned formula (a1-r-1), and a cyclohexylene group, 1,5-adamantylene group or 2,6-adamantylene group is preferable.

$Y^{101}$ is preferably a divalent linking group containing an ether bond or an ester bond, and groups represented by the aforementioned formulas (y-a1-1) to (y-a1-5) are preferable.

In formula (b-1), $V^{101}$ represents a single bond, an alkylene group or a fluorinated alkylene group. The alkylene group and the fluorinated alkylene group for $V^{101}$ preferably has 1 to 4 carbon atoms. Examples of the fluorinated alkylene group for $V^{101}$ include a group in which part or all of the hydrogen atoms within the alkylene group for $V^{101}$ have been substituted with fluorine. Among these examples, as $V^{101}$, a single bond or a fluorinated alkylene group of 1 to 4 carbon atoms is preferable.

In formula (b-1), $R^{102}$ represents a fluorine atom or a fluorinated alkyl group of 1 to 5 carbon atoms. $R^{102}$ is preferably a fluorine atom or a perfluoroalkyl group of 1 to 5 carbon atoms, and more preferably a fluorine atom.

As specific examples of anion moieties of the formula (b-1), in the case where $Y^{101}$ a single bond, a fluorinated alkylsulfonate anion such as a trifluoromethanesulfonate anion or a perfluorobutanesulfonate anion can be mentioned; and in the case where $Y^{101}$ represents a divalent linking group containing an oxygen atom, anions represented by formulae (an-1) to (an-3) shown below can be mentioned.

[Chemical Formula 50]

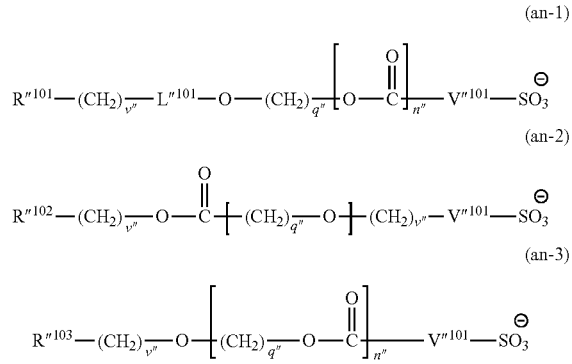

In the formulae, $R'''^{101}$ represents an aliphatic cyclic group which may have a substituent, a group represented by any one of the aforementioned formulae (r-hr-1) to (r-hr-6) or a chain-like alkyl group which may have a substituent; $R'''^{102}$ represents an aliphatic cyclic group which may have a substituent, a lactone-containing cyclic group represented by any one of the aforementioned formulae (a2-r-1) to (a2-r-7) or an —SO₂— containing cyclic group represented by any one of the aforementioned formulae (a5-r-1) to (a5-r-4); $R'''^{103}$ represents an aromatic cyclic group which may have a substituent, an aliphatic cyclic group which may have a substituent or a chain-like alkenyl group which may have a substituent; $V'''^{101}$ represents a fluorinated alkylene group; $L'''^{101}$ represents —C(=O)— or —SO₂—; v" represents an integer of 0 to 3; q" represents an integer of 1 to 20; and n" represents 0 or 1.

As the aliphatic cyclic group for $R'''^{101}$, $R'''^{102}$ and $R'''^{103}$ which may have a substituent, the same groups as the cyclic aliphatic hydrocarbon group for $R^{101}$ described above are preferable. As the substituent, the same groups as those described above for substituting the cyclic aliphatic hydrocarbon group for $R^{101}$ can be mentioned.

As the aromatic cyclic group for $R'''^{103}$ which may have a substituent, the same groups as the aromatic hydrocarbon group for the cyclic hydrocarbon group represented by $R^{101}$ described above are preferable. The substituent is the same as defined for the substituent for the aromatic hydrocarbon group represented by $R^{101}$.

As the chain-like alkyl group for $R'''^{101}$ which may have a substituent, the same groups as those described above for $R^{101}$ are preferable. As the chain-like alkenyl group for $R'''^{103}$ which may have a substituent, the same groups as those described above for $R^{101}$ are preferable. $V'''^{101}$ is preferably a fluorinated alkylene group of 1 to 3 carbon atoms, and most preferably —CF₂—, —CF₂CF₂—, —CHFCF₂—, —CF(CF₃)CF₂— or —CH(CF₃)CF₂—.

—Anion Moiety of Component (b-2)

In formula (b-2), $R^{104}$ and $R^{105}$ each independently represents a cyclic group which may have a substituent, a chain-like alkyl group which may have a substituent or a chain-like alkenyl group which may have a substituent, and is the same as defined for $R^{101}$ in formula (b-1). $R^{104}$ and $R^{105}$ may be mutually bonded to form a ring.

As $R^{104}$ and $R^{105}$, a chain-like alkyl group which may have a substituent is preferable, and a linear or branched alkyl group or a linear or branched fluorinated alkyl group is more preferable.

The chain-like alkyl group preferably has 1 to 10 carbon atoms, more preferably 1 to 7 carbon atoms, and still more preferably 1 to 3 carbon atoms. The smaller the number of carbon atoms of the chain-like alkyl group for $R^{104}$ and $R^{105}$, the more the solubility in a resist solvent is improved. Further, in the chain-like alkyl group for $R^{104}$ and $R^{105}$, it is preferable that the number of hydrogen atoms substituted with fluorine atoms is as large as possible because the acid strength increases and the transparency to high energy radiation of 200 nm or less or electron beam is improved. The fluorination ratio of the chain-like alkyl group is preferably from 70 to 100%, more preferably from 90 to 100%, and it is particularly desirable that the chain-like alkyl group be a perfluoroalkyl group in which all hydrogen atoms are substituted with fluorine atoms.

In formula (b-2), $V^{102}$ and $V^{103}$ each independently represents a single bond, an alkylene group or a fluorinated alkylene group, and is the same as defined for $V^{101}$ in formula (b-1).

In formula (b-2), $L^{101}$ and $L^{102}$ each independently represents a single bond or an oxygen atom.

—Anion Moiety of Component (b-3)

In formula (b-3), $R^{106}$ to $R^{108}$ each independently represents a cyclic group which may have a substituent, a chain-like alkyl group which may have a substituent or a chain-like alkenyl group which may have a substituent, and is the same as defined for $R^{101}$ in formula (b-1).

$L^{103}$ to $L^{105}$ each independently represents a single bond, —CO— or —SO₂—.

{Cation Moiety}

In formulae (b-1), (b-2) and (b-3), $M^{m+}$ represents an organic cation having a valency of m and a cation moiety having an electron withdrawing group, and a sulfonium cation having an electron withdrawing group or an iodonium cation having an electron withdrawing group is preferable.

In the present embodiment, the cation moiety of the component (B) has an electron withdrawing group.

In the present embodiment, the electron withdrawing group for the cation moiety of the component (B) include a halogen atom, a halogenated alkyl group, a halogenated alkoxy group, a halogenated aryloxy group, a halogenated alkylamino group, a halogenated alkylthio group, an alkyloxycarbonyl group, an aryloxycarbonyl group, a cyano group, a nitro group, a dialkylphosphono group, a diarylphosphono group, an alkylsulfonyl group, an arylsulfonyl group, a sulfonyloxy group, acylthio group, a sulfamoyl group, a thiocyanate group and a thiocarbonyl group.

Among these examples, a halogen atom or a halogenated alkyl group is preferable.

As the halogenated alkyl group, a halogenated alkyl group of 1 to 10 carbon atoms is preferable. The halogenated alkyl group of 1 to 10 carbon atoms represented by R is a group in which part or all of the hydrogen atoms of the aforementioned alkyl group of 1 to 10 carbon atoms have been substituted with halogen atoms. Examples of the halogen atom include a fluorine atom, a chlorine atom, a bromine atom and an iodine atom, and a fluorine atom is particularly desirable.

In the present embodiment, as the cation moiety of the component (B), a cation represented by any of general formulae (ca-1) to (ca-4) shown below is particularly desirable.

[Chemical Formula 51]

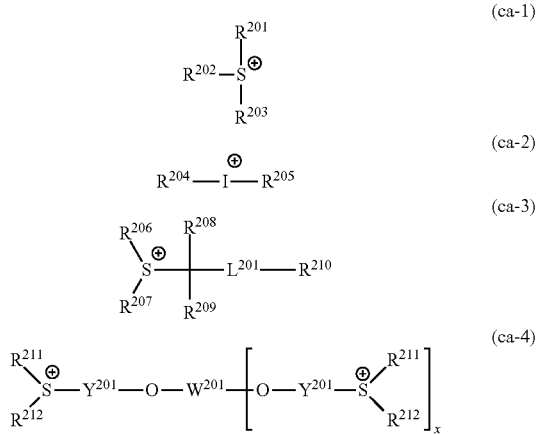

In formula (ca-1), $R^{201}$ to $R^{203}$ each independently represents an aryl group, alkyl group or alkenyl group which may have a substituent. However, at least one of $R^{201}$ to $R^{203}$ has an electron withdrawing group. Further, $R^{202}$ and $R^{203}$ may be mutually bonded to form a ring with the sulfur atom; however, in such a case, $R^{201}$ has an electron withdrawing group.

In formula (ca-2), $R^{204}$ and $R^{205}$ each independently represents an aryl group, alkyl group or alkenyl group which may have a substituent. However, at least one of $R^{204}$ and $R^{205}$ has an electron withdrawing group.

In formula (ca-3), $R^{206}$ and $R^{207}$ each independently represents an aryl group, alkyl group or alkenyl group which may have a substituent. $R^{210}$ represents an aryl group which may have a substituent, an alkyl group which may have a substituent, an alkenyl group which may have a substituent or an —$SO_2$— containing cyclic group which may have a substituent. $R^{206}$ and $R^{207}$ may be mutually bonded to form a ring with the sulfur atom. $R^{208}$ and $R^{209}$ each independently represents a hydrogen atom or an alkyl group of 1 to 5 carbon atoms; and $L^{201}$ represents —C(=O)— or —C(=O)—O—.

In formula (ca-4), $R^{211}$ and $R^{212}$ independently represents an aryl group, alkyl group or alkenyl group which may have a substituent. However, at least one of $R^{211}$ and $R^{212}$ has an electron withdrawing group. each $Y^{201}$ independently represents an arylene group, an alkylene group, or an alkenylene group; x represents 1 or 2; and $W^{201}$ represents a linking group having a valency of (x+1).

[Formula (ca-1)]

The cation moiety represented by general formula (ca-1) is as shown below.

[Chemical Formula 52]

In formula (ca-1), $R^{201}$ to $R^{203}$ each independently represents an aryl group, alkyl group or alkenyl group which may have a substituent. However, at least one of $R^{201}$ to $R^{203}$ has an electron withdrawing group. Further, $R^{202}$ and $R^{203}$ may be mutually bonded to form a ring with the sulfur atom; however, in such a case, $R^{201}$ has an electron withdrawing group.

Examples of the aryl group for $R^{201}$ to $R^{203}$ include an unsubstituted aryl group of 6 to 20 carbon atoms, and a phenyl group or a naphthyl group is preferable.

As the alkyl group for $R^{201}$ to $R^{203}$, a chain-like or cyclic alkyl group having 1 to 30 carbon atoms is preferable.

The alkenyl group for $R^{201}$ to $R^{203}$ preferably has 2 to 10 carbon atoms.

At least one of $R^{201}$ to $R^{203}$ has an electron withdrawing group.

In the case where an electron withdrawing group is present on a terminal of at least one of $R^{201}$ to $R^{203}$, a compound in which at least one of $R^{201}$ to $R^{203}$ is substituted with the aforementioned electron withdrawing group can be used.

As the electron withdrawing group for at least one of $R^{201}$ to $R^{203}$, a halogenated alkyl group is preferable, and a fluorinated alkyl group is more preferable.

Examples of the substituent for $R^{201}$ to $R^{203}$ include groups represented by formulae (ca-r-1) to (ca-r-7) shown below.

[Chemical Formula 53]

[ca-r-1]

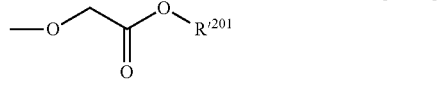

[ca-r-2]

[ca-r-3]

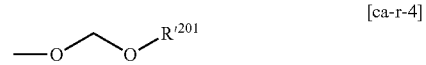

[ca-r-4]

-continued

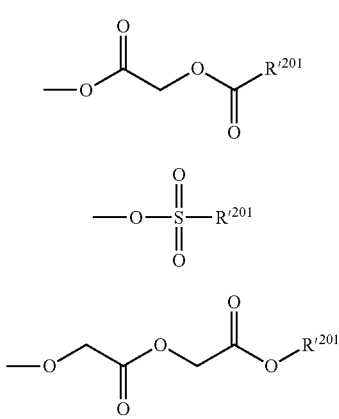

[ca-r-5]

[ca-r-6]

[ca-r-7]

In the formulae, each $R'^{201}$ independently represents a cyclic group which may have a substituent, a chain-like alkyl group which may have a substituent, or a chain-like alkenyl group which may have a substituent.

As the cyclic group which may have a substituent, the chain-like alkyl group which may have a substituent and the chain-like alkenyl group which may have a substituent for $R'^{201}$, the same groups as those described above for $R^{101}$ can be mentioned. As the cyclic group which may have a substituent and chain-like alkyl group which may have a substituent, the same groups as those described above for the acid dissociable group represented by the aforementioned formula (a1-r-2) can be also mentioned.

Further, as the substituent for $R'^{201}$, an electron withdrawing group may be mentioned.

When $R^{202}$ and $R^{203}$ are mutually bonded to form a ring with the sulfur atom, these groups may be mutually bonded via a hetero atom such as a sulfur atom, an oxygen atom or a nitrogen atom, or a functional group such as a carbonyl group, —SO—, —SO$_2$—, —SO$_3$—, —COO—, —CONH— or —N(R$_N$)— (wherein R$_N$ represents an alkyl group of 1 to 5 carbon atoms). The ring containing the sulfur atom in the skeleton thereof is preferably a 3 to 10-membered ring, and most preferably a 5 to 7-membered ring. Specific examples of the ring formed include a thiophene ring, a thiazole ring, a benzothiophene ring, a thianthrene ring, a benzothiophene ring, a dibenzothiophene ring, a 9H-thioxanthene ring, a thioxanthone ring, a phenoxathiin ring, a tetrahydrothiophenium ring, and a tetrahydrothiopyranium ring.

As the cation moiety represented by formula (ca-1), a cation moiety represented by general formula (ca-1-1) shown below is preferable.

[Chemical Formula 54]

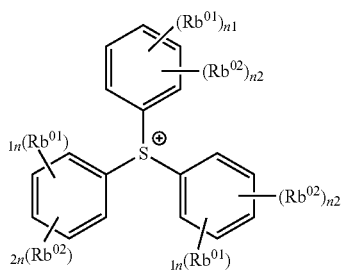

(ca-1-1)

$Rb^{01}$ represents an electron withdrawing group; $Rb^{02}$ represents an alkyl group of 1 to 5 carbon atoms; a plurality of $Rb^{01}$ and $Rb^{02}$ may be the same or different from each other; n2 represents an integer of 0 to 4;

n1 represents an integer of 0 to 4; provided that at least one of n1 represents an integer of 1 to 4.

In formula (ca-1-1), the electron withdrawing group for $Rb^{01}$ is the same as defined above. Among these, a fluorinated alkyl group is preferable. $Rb^{02}$ represents an alkyl group of 1 to 5 carbon atoms, and is preferably a methyl group or an ethyl group. n2 represents an integer of 0 to 4, and is preferably 0 to 2.

Specific examples of cation moieties represented by general formula (ca-1) or (ca-1-1) are shown below.

[Chemical Formula 55]

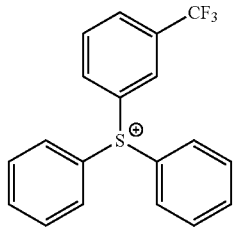

(ca-1-1)

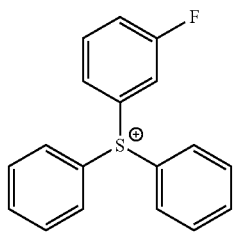

(ca-1-2)

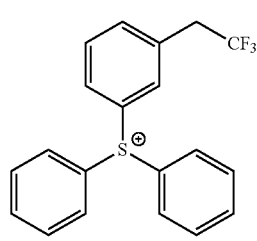

(ca-1-3)

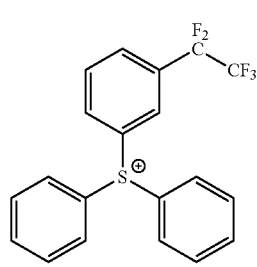

(ca-1-4)

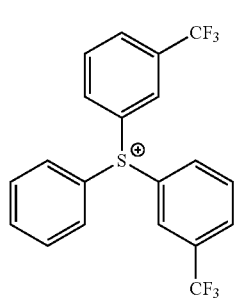 (ca-1-5)
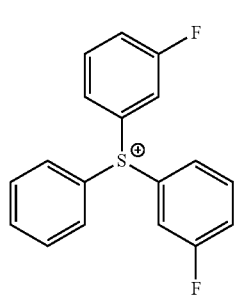 (ca-1-6)
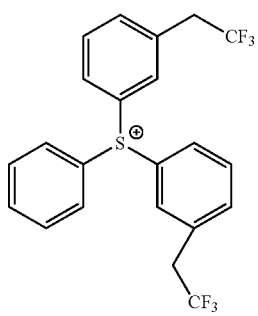 (ca-1-7)
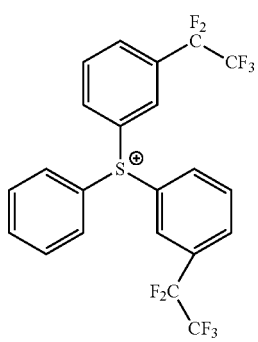 (ca-1-8)
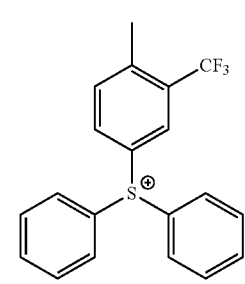 (ca-1-9)
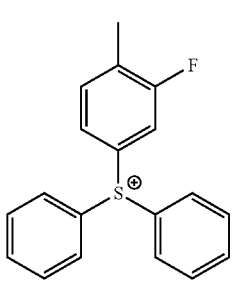 (ca-1-10)
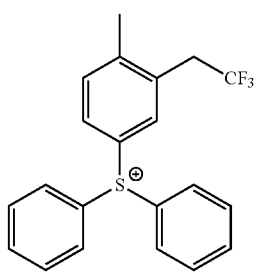 (ca-1-11)
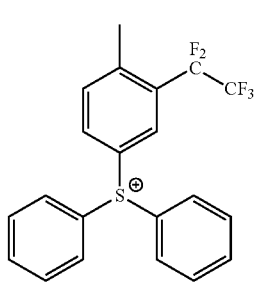 (ca-1-12)
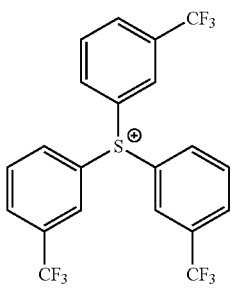 (ca-1-13)
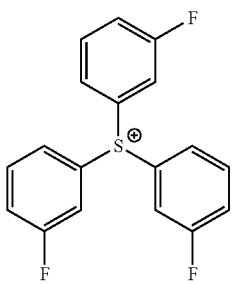 (ca-1-14)

-continued (ca-1-15)
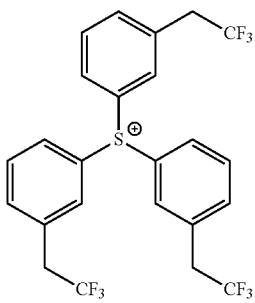

(ca-1-16)
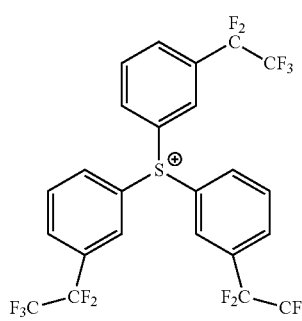

[Chemical Formula 56]

(ca-1-17)
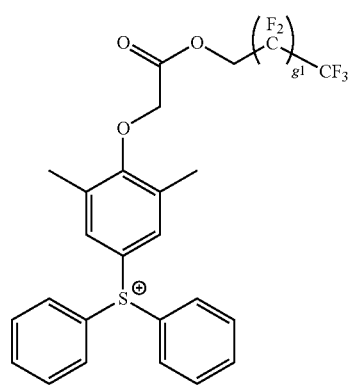

(ca-1-18)
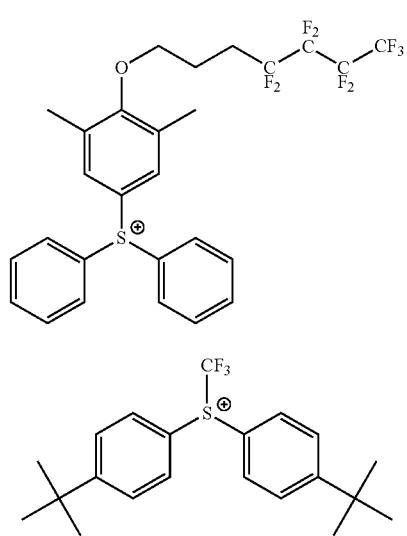

(ca-1-19)

-continued (ca-1-20)
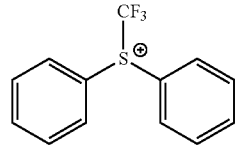

(ca-1-21)
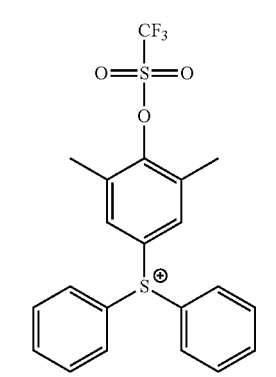

(ca-1-22)

In the formulae, g1, g2 and g3 represent recurring numbers, wherein g1 is an integer of 1 to 5, g2 is an integer of 0 to 20, and g3 is an integer of 0 to 20.

[General Formula (ca-2)]

The cation moiety represented by general formula (ca-2) is as shown below.

[Chemical Formula 57]

$$R^{204} \overset{\oplus}{-} I - R^{205}$$ (ca-2)

In formula (ca-2), $R^{204}$ and $R^{205}$ each independently represents an aryl group, alkyl group or alkenyl group which may have a substituent. However, at least one of $R^{204}$ and $R^{205}$ has an electron withdrawing group.

$R^{204}$ and $R^{205}$ are the same as defined for $R^{201}$ to $R^{203}$ described above.

[General Formula (ca-3)]

The cation moiety represented by general formula (ca-3) is as shown below.

[Chemical Formula 58]

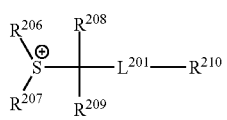 (ca-3)

In formula (ca-3), $R^{206}$ and $R^{207}$ each independently represents an aryl group, alkyl group or alkenyl group which may have a substituent. $R^{210}$ represents an aryl group which may have a substituent, an alkyl group which may have a substituent, an alkenyl group which may have a substituent or an —SO$_2$— containing cyclic group which may have a substituent. R$^{206}$ and R$^{207}$ may be mutually bonded to form a ring with the sulfur atom. R$^{208}$ and R$^{209}$ each independently represents a hydrogen atom or an alkyl group of 1 to 5 carbon atoms; and L$^{201}$ represents —C(=O)— or —C(=O)—O—.

In formula (ca-3), R$^{206}$ and R$^{207}$ are the same as defined for R$^{201}$ to R$^{203}$ described above.

R$^{208}$ and R$^{209}$ each independently represents a hydrogen atom or an alkyl group of 1 to 5 carbon atoms, and preferably a hydrogen atom or an alkyl group of 1 to 3 carbon atoms, provided that, in the case of an alkyl group, the groups may be mutually boned to form a ring.

R$^{210}$ represents an aryl group which may have a substituent, an alkyl group which may have a substituent, an alkenyl group which may have a substituent, or an —SO$_2$— containing cyclic group which may have a substituent.

Examples of the aryl group for R$^{210}$ include an unsubstituted aryl group of 6 to 20 carbon atoms, and a phenyl group or a naphthyl group is preferable.

As the alkyl group for R$^{210}$, a chain-like or cyclic alkyl group having 1 to 30 carbon atoms is preferable.

The alkenyl group for R$^{210}$ preferably has 2 to 10 carbon atoms.

As the —SO$_2$— containing cyclic group for R$^{210}$ which may have a substituent, the same "—SO$_2$— containing cyclic groups" as those described above for Ra$^{21}$ in the aforementioned general formula (a2-1) can be mentioned, and the group represented by the aforementioned general formula (a5-r-1) is preferable.

Each Y$^{201}$ independently represents an arylene group, an alkylene group or an alkenylene group.

Examples of the arylene group for Y$^{201}$ include groups in which one hydrogen atom has been removed from an aryl group given as an example of the aromatic hydrocarbon group for R$^{101}$ in the aforementioned formula (b-1).

The alkylene group and the alkenylene group for Y$^{201}$ is the same as defined for the aliphatic hydrocarbon group as the divalent linking group represented by Va$^{1}$ in the aforementioned general formula (a1-1).

Specific examples of cation moieties represented by general formula (ca-3) are shown below.

[Chemical Formula 60]

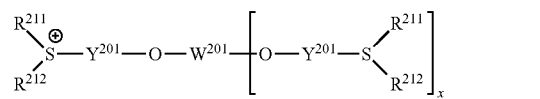

(ca-4)

[General Formula (ca-4)]

The cation moiety represented by general formula (ca-4) is as shown below.

[Chemical Formula 60]

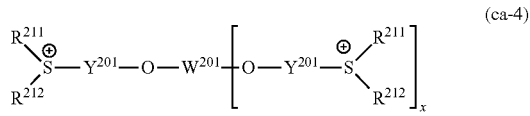

(ca-4)

In formula (ca-4), R$^{211}$ and R$^{212}$ each independently represents aryl group, alkyl group or alkenyl group which may have a substituent. However, at least one of R$^{211}$ and R$^{212}$ has an electron withdrawing group. each Y$^{201}$ independently represents an arylene group, an alkylene group, or an alkenylene group; x represents 1 or 2; and W$^{201}$ represents a linking group having a valency of (x+1).

In formula (ca-4), R$^{211}$ and R$^{212}$ are the same as defined for R$^{201}$ to R$^{203}$ described above.

In the formula (ca-4), x represents 1 or 2.

W$^{201}$ represents a linking group having a valency of (x+1), i.e., a divalent or trivalent linking group.

As the divalent linking group for W$^{201}$, a divalent hydrocarbon group which may have a substituent is preferable, and as examples thereof, the same hydrocarbon groups as those described above for Ya$^{21}$ in the general formula (a2-1) can be mentioned. The divalent linking group for W$^{201}$ may be linear, branched or cyclic, and cyclic is more preferable. Among these, an arylene group having two carbonyl groups, each bonded to the terminal thereof is preferable. Examples of the arylene group include a phenylene group and a naphthylene group, and a phenylene group is particularly desirable.

As the trivalent linking group for W$^{201}$, a group in which one hydrogen atom has been removed from the aforementioned divalent linking group for W$^{201}$ and a group in which the divalent linking group has been bonded to another divalent linking group can be mentioned. The trivalent linking group for W$^{201}$ is preferably a group in which 2 carbonyl groups are bonded to an arylene group.

Specific examples of cation moieties represented by general formula (ca-4) are shown below.

[Chemical Formula 61]

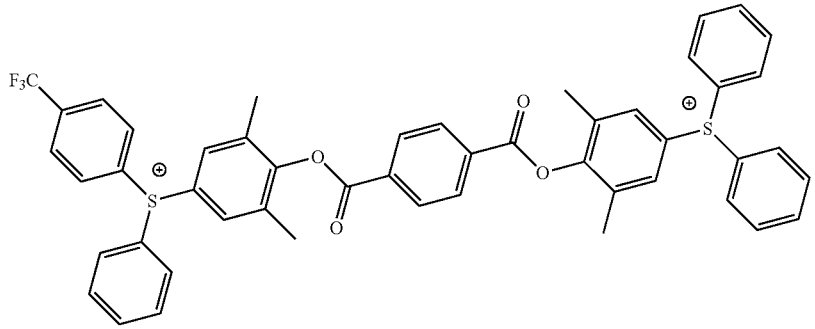

(ca-4-1)

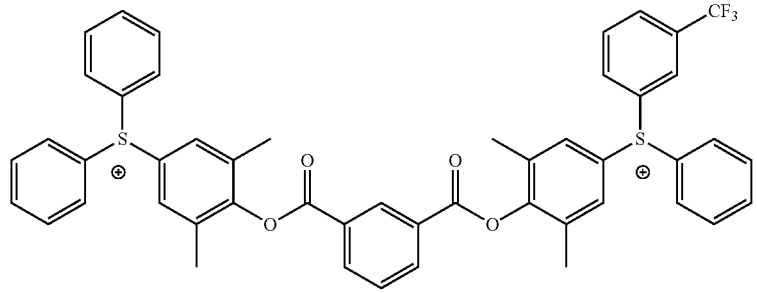

(ca-4-2)

Among the above examples, in the present embodiment, it is preferable to use a cation moiety represented by general formula (ca-1). In the present embodiment, as the acid generator component, a combination of an anion represented by general formula (b-1) and a cation moiety represented by general formula (ca-1) or (ca-1-1) is preferable. That is, in the present embodiment, as the acid generator component, a compound represented by general formula (b-1-1) or (b-1-2) shown below is preferable.

[Chemical Formula 62]

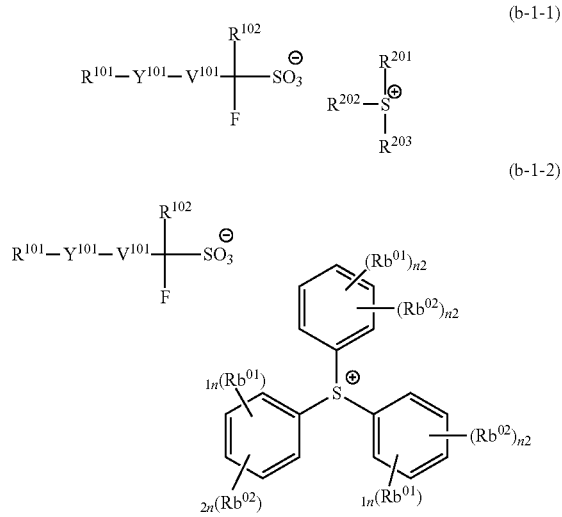

In the formulae, $R^{101}$ represents a cyclic group which may have a substituent, a chain alkyl group which may have a substituent, or a chain alkenyl group which may have a substituent; $R^{102}$ represents a fluorine atom or a fluorinated alkyl group of 1 to 5 carbon atoms; $Y^{101}$ represents a single bond or a divalent linking group containing an oxygen atom; $V^{101}$ represents a single bond, an alkylene group or a fluorinated alkylene group;

$R^{201}$ to $R^{203}$ each independently represents an aryl group, alkyl group or alkenyl group which may have a substituent. However, at least one of $R^{201}$ to $R^{203}$ has an electron withdrawing group. Further, $R^{202}$ and $R^{203}$ may be mutually bonded to form a ring with the sulfur atom; however, in such a case, $R^{201}$ has an electron withdrawing group.

$Rb^{01}$ represents an electron withdrawing group; $Rb^{02}$ represents an alkyl group of 1 to 5 carbon atoms; a plurality of $Rb^{01}$ and $Rb^{02}$ may be the same or different from each other; n2 represents an integer of 0 to 4;

n1 represents an integer of 0 to 4; provided that at least one of n1 represents an integer of 1 to 4.

In general formulae (b-1-1) and (b-1-2), $R^{101}$, $R^{102}$, $Y^{101}$, $V^{101}$, $R^{201}$ to $R^{203}$, $Rb^{01}$, $Rb^{02}$ and n1 are the same as defined above.

As the component (B), one type of these acid generators may be used alone, or two or more types may be used in combination.

When the resist composition of the present invention contains the component (B), the amount of the component (B) relative to 100 parts by weight of the component (A) is preferably within a range from 0.5 to 60 parts by weight, more preferably from 1 to 50 parts by weight, and still more preferably from 1 to 40 parts by weight. When the amount of the component (B) is within the above-mentioned range, formation of a resist pattern can be satisfactorily performed. Further, by virtue of the above-mentioned range, when each of the components are dissolved in an organic solvent, a uniform solution can be obtained and the storage stability becomes satisfactory.

<Basic Compound Component; Component (D)>

Moreover, the resist composition of the present invention may include an acid diffusion control agent component (hereafter, frequently referred to as "component (D)"), in addition to the component (A), or in addition to the component (A) and the component (B).

The component (D) functions as an acid diffusion control agent, i.e., a quencher which traps the acid generated from the component (B) and the like upon exposure.

In the present invention, the component (D) may be a photodecomposable base (D1) (hereafter, referred to as "component (D1)") which is decomposed upon exposure and then loses the ability of controlling of acid diffusion, or a nitrogen-containing organic compound (D2) (hereafter, referred to as "component (D2)") which does not fall under the definition of component (D1).

[Component (D1)]

When a resist pattern is formed using a resist composition containing the component (D1), the contrast between exposed portions and unexposed portions is improved.

The component (D1) is not particularly limited, as long as it is decomposed upon exposure and then loses the ability of controlling of acid diffusion. As the component (D1), at least one compound selected from the group consisting of a compound represented by general formula (d1-1) shown below (hereafter, referred to as "component (d1-1)"), a compound represented by general formula (d1-2) shown below (hereafter, referred to as "component (d1-2)") and a compound represented by general formula (d1-3) shown below (hereafter, referred to as "component (d1-3)") is preferably used.

At exposed portions, the components (d1-1) to (d1-3) are decomposed and then lose the ability of controlling of acid diffusion (i.e., basicity), and therefore the components (d1-1) to (d1-3) cannot function as a quencher, whereas at unexposed portions, the components (d1-1) to (d1-3) functions as a quencher.

[Chemical Formula 63]

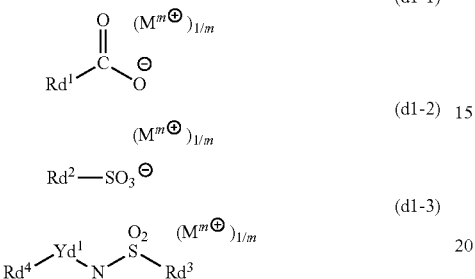

(d1-1)
(d1-2)
(d1-3)

In the formulae, $Rd^1$ to $Rd^4$ represent a cyclic group which may have a substituent, a chain-like alkyl group which may have a substituent or a chain-like alkenyl group which may have a substituent, provided that, the carbon atom adjacent to the sulfur atom within the $Rd^2$ in the formula (d1-2) has no fluorine atom bonded thereto; $Yd^1$ represents a single bond or a divalent linking group; and $M^{m+}$ each independently represents a cation having a valency of m.

{Component (d1-1)}
—Anion Moiety

In formula (d1-1), $Rd^1$ represents a cyclic group which may have a substituent, a chain-like alkyl group which may have a substituent or a chain-like alkenyl group which may have a substituent, and is the same groups as those defined above for $R^{101}$.

Among these, as the group for $Rd^1$, an aromatic hydrocarbon group which may have a substituent, an aliphatic cyclic group which may have a substituent and a chain-like hydrocarbon group which may have a substituent are preferable. As the substituents which these groups may have, a fluorine atom or a fluorinated alkyl group is preferable.

The aromatic hydrocarbon group is preferably a phenyl group or a naphthyl group.

Examples of the aliphatic cyclic group include groups in which one or more hydrogen atoms have been removed from a polycycloalkane such as adamantane, norbornane, isobornane, tricyclodecane or tetracyclododecane.

As the chain-like hydrocarbon group, a chain-like alkyl group is preferable. The chain-like alkyl group preferably has 1 to 10 carbon atoms, and specific examples thereof include a linear alkyl group such as a methyl group, an ethyl group, a propyl group, a butyl group, a pentyl group, a hexyl group, a heptyl group, an octyl group, a nonyl or a decyl group, and a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group or a 4-methylpentyl group.

In the case where the chain-like alkyl group is a fluorinated alkyl group having a fluorine atom or a fluorinated alkyl group, the fluorinated alkyl group preferably has 1 to 11 carbon atoms, more preferably 1 to 8 carbon atoms, and still more preferably 1 to 4 carbon atoms. The fluorinated alkyl group may contain an atom other than fluorine. Examples of the atom other than fluorine include an oxygen atom, a carbon atom, a hydrogen atom, a sulfur atom and a nitrogen atom.

As $Rd^1$, a fluorinated alkyl group in which part or all of the hydrogen atoms constituting a linear alkyl group have been substituted with fluorine atom(s) is preferable, and a fluorinated alkyl group in which all of the hydrogen atoms constituting a linear alkyl group have been substituted with fluorine atoms (i.e., a linear perfluoroalkyl group) is more preferable.

Specific examples of preferable anion moieties for the component (d1-1) are shown below.

[Chemical Formula 64]

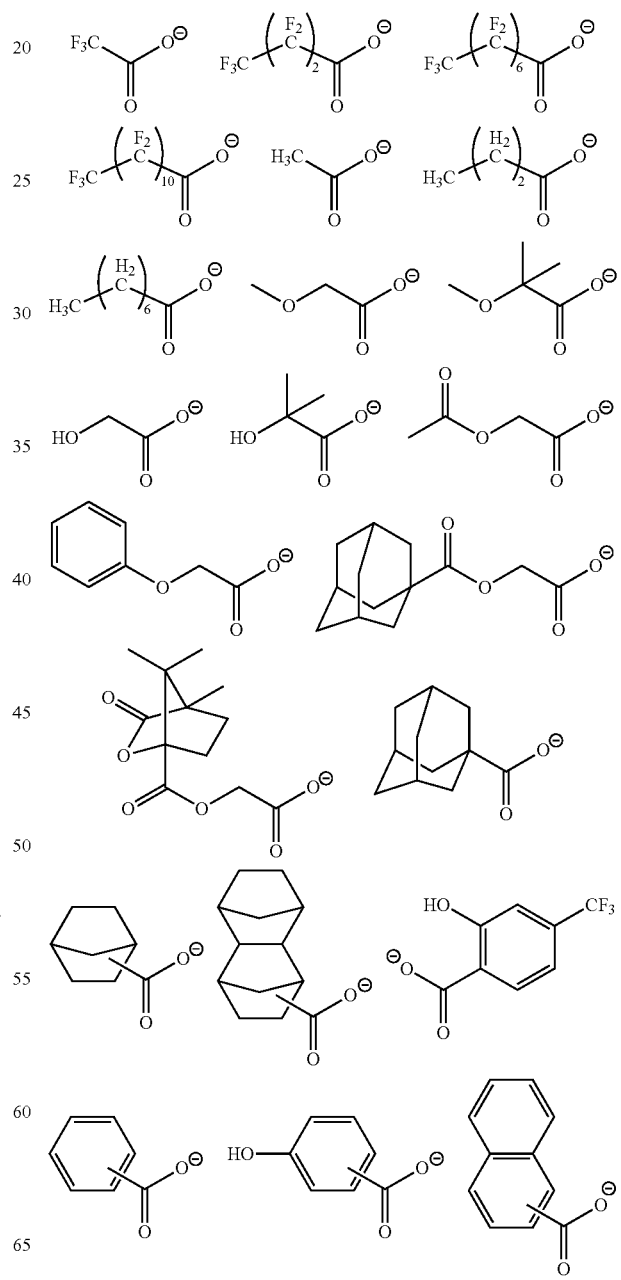

-continued

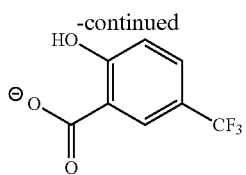

—Cation Moiety

In formula (d1-1), $M^{m+}$ represents an organic cation having a valency of m.

The organic cation for $M^{m+}$ is not particularly limited, and examples thereof include the same cation moieties as those represented by the aforementioned formulas (ca-1) to (ca-4), and cation moieties represented by the aforementioned formulas (ca-1-1) to (ca-1-63) are preferable.

As the component (d1-1), one type of compound may be used, or two or more types of compounds may be used in combination.

{Component (d1-2)}

—Anion Moiety

In formula (d1-2), $Rd^2$ represents a cyclic group which may have a substituent, a chain-like alkyl group which may have a substituent or a chain-like alkenyl group which may have a substituent, and is the same groups as those defined above for $R^{101}$, provided that, the carbon atom adjacent to the sulfur atom within $Rd^2$ group has no fluorine atom bonded thereto (i.e., the carbon atom adjacent to the sulfur atom within $Rd^2$ group does not substituted with a fluorine atom). As a result, the anion of the component (d1-2) becomes an appropriately weak acid anion, thereby improving the quenching ability of the component (D).

As $Rd^2$, an aliphatic cyclic group which may have a substituent is preferable, and a group in which one or more hydrogen atoms have been removed from adamantane, norbornane, isobornane, tricyclodecane, tetracyclododecane or camphor (which may have a substituent) is more preferable.

The hydrocarbon group for $Rd^2$ may have a substituent. As the substituent, the same groups as those described above for substituting the hydrocarbon group (e.g., aromatic hydrocarbon group, aliphatic hydrocarbon group) for $Rd^1$ in the formula (d1-1) can be mentioned.

Specific examples of preferable anion moieties for the component (d1-2) are shown below.

[Chemical Formula 65]

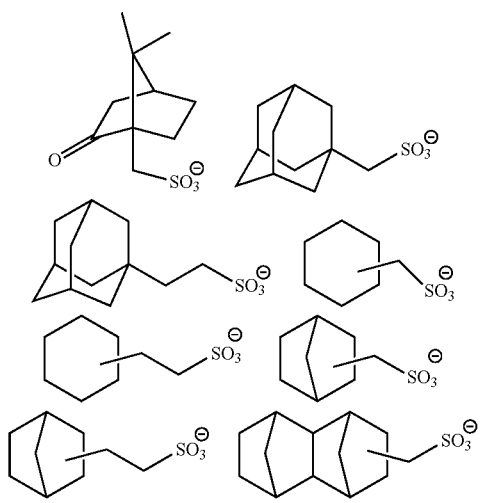

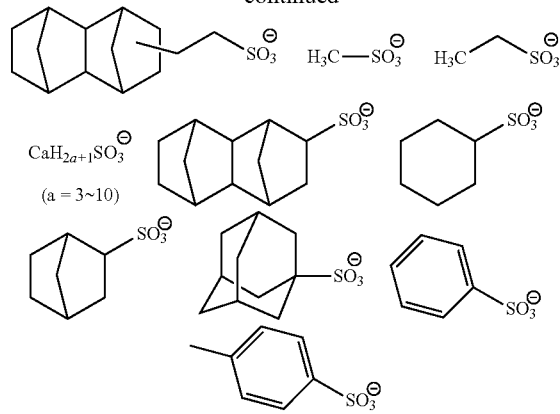

—Cation Moiety

In formula (d1-2), $M^{m+}$ is an organic cation having a valency of m, and is the same as defined for $M^{m+}$ in the aforementioned formula (d1-1).

As the component (d1-2), one type of compound may be used, or two or more types of compounds may be used in combination.

{Component (d1-3)}

—Anion Moiety

In formula (d1-3), $Rd^3$ represents a cyclic group which may have a substituent, a chain-like alkyl group which may have a substituent or a chain-like alkenyl group which may have a substituent, and is the same groups as those defined above for $R^{101}$, and a cyclic group containing a fluorine atom, a chain-like alkyl group or a chain-like alkenyl group is preferable. Among these, a fluorinated alkyl group is preferable, and more preferably the same fluorinated alkyl groups as those described above for Rd'.

In formula (d1-3), $Rd^4$ represents a cyclic group which may have a substituent, a chain-like alkyl group which may have a substituent or a chain-like alkenyl group which may have a substituent, and is the same groups as those defined above for $R^{101}$.

Among these, an alkyl group which may have substituent, an alkoxy group which may have substituent, an alkenyl group which may have substituent or a cyclic group which may have substituent is preferable.

The alkyl group for $Rd^4$ is preferably a linear or branched alkyl group of 1 to 5 carbon atoms, and specific examples include a methyl group, an ethyl group, a propyl group, an isopropyl group, an n-butyl group, an isobutyl group, a tert-butyl group, a pentyl group, an isopentyl group, and a neopentyl group. Part of the hydrogen atoms within the alkyl group for $Rd^4$ may be substituted with a hydroxy group, a cyano group or the like.

The alkoxy group for $Rd^4$ is preferably an alkoxy group of 1 to 5 carbon atoms, and specific examples thereof include a methoxy group, an ethoxy group, an n-propoxy group, an iso-propoxy group, an n-butoxy group and a tert-butoxy group. Among these, a methoxy group and an ethoxy group are preferable.

As the alkenyl group for $Rd^4$, the same groups as those described above for $R^{101}$ can be mentioned, and a vinyl group, a propenyl group (an allyl group), a 1-methylpropenyl group and a 2-methylpropenyl group are preferable. These groups may have an alkyl group of 1 to 5 carbon atoms or a halogenated alkyl group of 1 to 5 carbon atoms as a substituent.

As the cyclic group for $Rd^4$, the same groups as those described above for $R^{101}$ can be mentioned. Among these, as the cyclic group, an alicyclic group (e.g., a group in which one or more hydrogen atoms have been removed from a cycloalkane such as cyclopentane, cyclohexane, adamantane, norbornane, isobornane, tricyclodecane or tetracyclododecane) or an aromatic group (e.g., a phenyl group or a naphthyl group) is preferable. When $Rd^4$ is an alicyclic group, the resist composition can be satisfactorily dissolved in an organic solvent, thereby improving the lithography properties. Alternatively, when $Rd^4$ is an aromatic group, the resist composition exhibits an excellent photoabsorption efficiency in a lithography process using EUV or the like as the exposure source, thereby resulting in the improvement of the sensitivity and the lithography properties.

In formula (d1-3), $Yd^1$ represents a single bond or a divalent linking group.

The divalent linking group for $Yd^1$ is not particularly limited, and examples thereof include a divalent hydrocarbon group (aliphatic hydrocarbon group, or aromatic hydrocarbon group) which may have a substituent and a divalent linking group containing a hetero atom. As such groups, the same divalent linking groups as those described above for $Ya^{21}$ in the formula (a2-1) can be mentioned.

As $Yd^1$, a carbonyl group, an ester bond, an amide bond, an alkylene group or a combination of these is preferable. As the alkylene group, a linear or branched alkylene group is more preferable, and a methylene group or an ethylene group is still more preferable.

Specific examples of preferable anion moieties for the component (d1-3) are shown below.

[Chemical Formula 66]

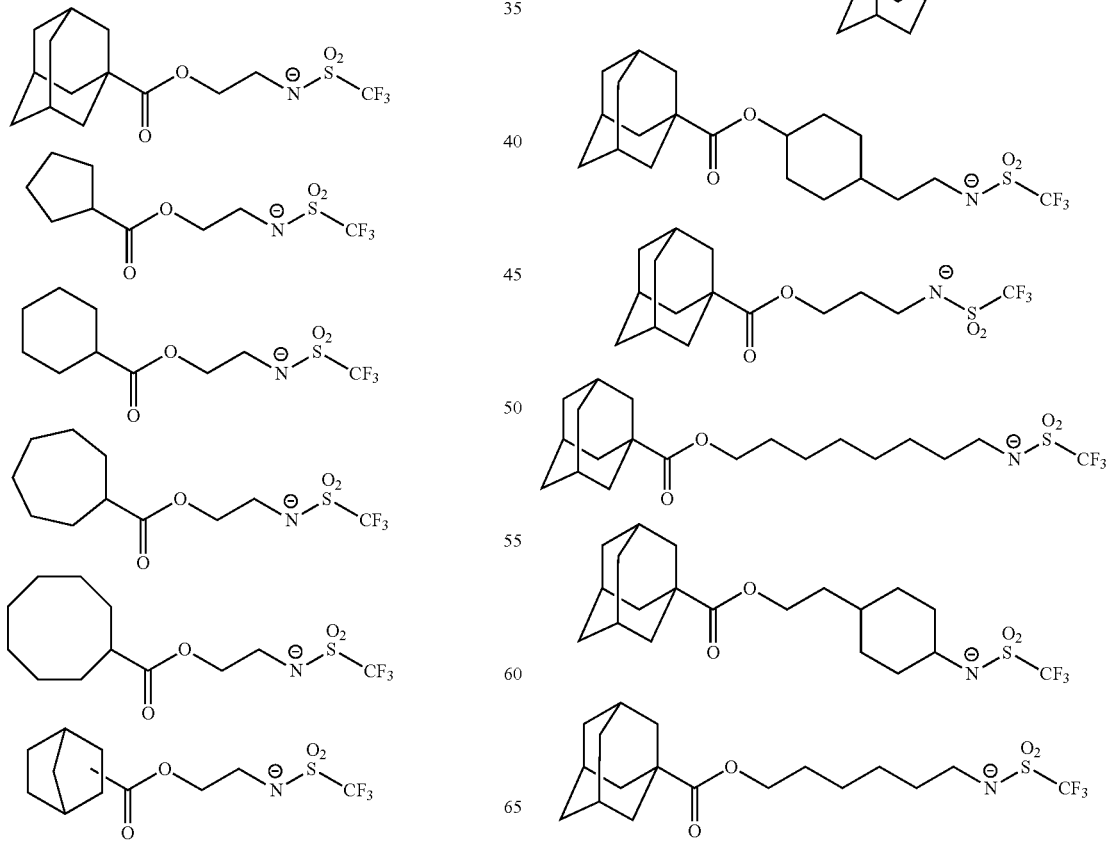

[Chemical Formula 67]

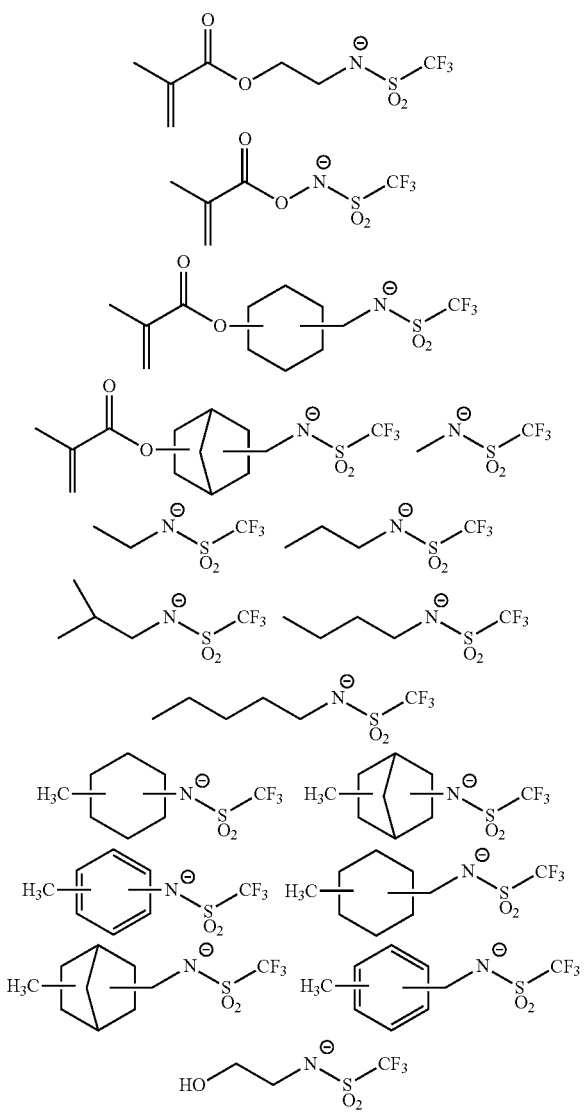

—Cation Moiety

In formula (d1-3), $M^{m+}$ is an organic cation having a valency of m, and is the same as defined for $M^{m+}$ in the aforementioned formula (d1-1).

As the component (d1-3), one type of compound may be used, or two or more types of compounds may be used in combination.

As the component (D1), one type of the aforementioned components (d1-1) to (d1-3), or at least two types of the aforementioned components (d1-1) to (d1-3) can be used in combination.

The amount of the component (D1) relative to 100 parts by weight of the component (A) is preferably within a range from 0.5 to 10 parts by weight, more preferably from 0.5 to 8 parts by weight, and still more preferably from 1 to 8 parts by weight.

When the amount of the component (D1) is at least as large as the lower limit of the above-mentioned range, excellent lithography properties and excellent resist pattern shape can be obtained. On the other hand, when the amount of the component (D1) is no more than the upper limit of the above-mentioned range, sensitivity can be maintained at a satisfactory level, and through-put becomes excellent.

The production methods of the components (d1-1) and (d1-2) are not particularly limited, and the components (d1-1) and (d1-2) can be produced by conventional methods.

The amount of the component (D1) relative to 100 parts by weight of the component (A) is preferably within a range from 0.5 to 10.0 parts by weight, more preferably from 0.5 to 8.0 parts by weight, and still more preferably from 1.0 to 8.0 parts by weight. When the amount of at least as large as the lower limit of the above-mentioned range, excellent lithography properties and excellent resist pattern shape can be obtained. On the other hand, when the amount of the component (D) is no more than the upper limit of the above-mentioned range, sensitivity can be maintained at a satisfactory level, and through-put becomes excellent.

(Component (D2))

The component (D) may contain a nitrogen-containing organic compound (D2) (hereafter, referred to as component (D2)) which does not fall under the definition of component (D1).

The component (D2) is not particularly limited, as long as it functions as an acid diffusion control agent, and does not fall under the definition of the component (D1). As the component (D2), any of the conventionally known compounds may be selected for use. Among these, an aliphatic amine, particularly a secondary aliphatic amine or tertiary aliphatic amine is preferable.

An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of no more than 12 carbon atoms (i.e., alkylamines or alkylalcoholamines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decylamine, and tri-n-dodecylamine; and alkyl alcohol amines such as diethanolamine, triethanolamine, diisopropanolamine, triisopropanolamine, di-n-octanolamine, and tri-n-octanolamine. Among these, trialkylamines of 5 to 10 carbon atoms are preferable, and tri-n-pentylamine and tri-n-octylamine are particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris{2-(2-methoxyethoxy)ethyl}amine, tris {2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)

ethyl}amine, tris[2-{2-(2-hydroxyethoxy)ethoxy}ethyl]amine and triethanolamine triacetate, and triethanolamine triacetate is preferable.

Further, as the component (D2), an aromatic amine may be used.

Examples of aromatic amines include aniline, pyridine, 4-dimethylaminopyridine, pyrrole, indole, pyrazole, imidazole and derivatives thereof, as well as diphenylamine, triphenylamine, tribenzylamine, 2,6-diisopropylaniline and N-tert-butoxycarbonylpyrrolidine.

As the component (D2), one type of compound may be used alone, or two or more types may be used in combination.

The component (D2) is typically used in an amount within a range from 0.01 to 5.0 parts by weight, relative to 100 parts by weight of the component (A). When the amount of the component (D) is within the above-mentioned range, the shape of the resist pattern and the post exposure stability of the latent image formed by the pattern-wise exposure of the resist layer are improved.

As the component (D), one type of compound may be used, or two or more types of compounds may be used in combination.

When the resist composition of the present invention contains the component (D), the amount of the component (D) relative to 100 parts by weight of the component (A) is preferably within a range from 0.1 to 15 parts by weight, more preferably from 0.3 to 12 parts by weight, and still more preferably from 0.5 to 12 parts by weight. When the amount of the component (D) is at least as large as the lower limit of the above-mentioned range, various lithography properties (such as LWR) of the resist composition are improved. Further, a resist pattern having an excellent shape can be obtained. On the other hand, when the amount of the component (D) is no more than the upper limit of the above-mentioned range, sensitivity can be maintained at a satisfactory level, and through-put becomes excellent.

<Optional Components>

[Component (E)]

In the present invention, in the resist composition, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof can be added.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly desirable.

Examples of oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters and phenylphosphinic acid.

As the component (E), one type may be used alone, or two or more types may be used in combination.

The component (E) is typically used in an amount within a range from 0.01 to 5.0 parts by weight, relative to 100 parts by weight of the component (A).

[Component (F)]

In the present invention, the resist composition of the present invention may contain a fluorine additive (hereafter, referred to as "component (F)") for imparting water repellency to the resist film.

As the component (F), for example, a fluorine-containing polymeric compound described in Japanese Unexamined Patent Application, First Publication No. 2010-002870, Japanese Unexamined Patent Application, First Publication No. 2010-032994, Japanese Unexamined Patent Application, First Publication No. 2010-277043, Japanese Unexamined Patent Application, First Publication No. 2011-13569, and Japanese Unexamined Patent Application, First Publication No. 2011-128226 can be used.

Specific examples of the component (F) include polymers having a structural unit (f1) represented by general formula (f1-1) shown below. As the polymer, a polymer (homopolymer) consisting of a structural unit (f1) represented by formula (f1-1) shown below; a copolymer of a structural unit (f1) represented by formula (f1-1) shown below and the aforementioned structural unit (a1); and a copolymer of a structural unit (f1) represented by formula (f1-1) shown below, a structural unit derived from acrylic acid or methacrylic acid and the aforementioned structural unit (a1) are preferable. As the structural unit (a1) to be copolymerized with a structural unit (f1) represented by formula (f1-1) shown below, a structural unit derived from 1-ethyl-1-cyclooctyl (meth)acrylate or a structural unit represented by the aforementioned formula (a1-2-01) is preferable.

[Chemical Formula 68]

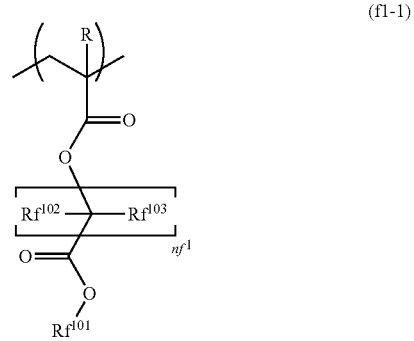

(f1-1)

In the formula, R is the same as defined above; $Rf^{102}$ and $Rf^{103}$ each independently represents a hydrogen atom, a halogen atom, an alkyl group of 1 to 5 carbon atoms, or a halogenated alkyl group of 1 to 5 carbon atoms, provided that $Rf^{102}$ and $Rf^{103}$ may be the same or different; $nf^1$ represents an integer of 1 to 5; and $Rf^{101}$ represents an organic group containing a fluorine atom.

In formula (f1-1), R is the same as defined above. As R, a hydrogen atom or a methyl group is preferable.

In formula (f1-1), examples of the halogen atom for $Rf^{102}$ and $Rf^{103}$ include a fluorine atom, a chlorine atom, a bromine atom and an iodine atom, and a fluorine atom is particularly desirable. Examples of the alkyl group of 1 to 5 carbon atoms for $Rf^{102}$ and $Rf^{103}$ include the same alkyl group of 1 to 5 carbon atoms as those described above for R, and a methyl group or an ethyl group is preferable. Specific examples of the halogenated alkyl group of 1 to 5 carbon atoms represented by $Rf^{102}$ or $Rf^{103}$, include groups in which part or all of the hydrogen atoms of the aforementioned alkyl groups of 1 to 5 carbon atoms have been substituted with halogen atoms. Examples of the halogen atom include a fluorine atom, a chlorine atom, a bromine atom and an iodine atom, and a fluorine atom is particularly desirable. Among these, as $Rf^{102}$ and $Rf^{103}$, a hydrogen atom, a fluorine atom or an alkyl group of 1 to 5 carbon atoms is preferable, and a hydrogen atom, a fluorine atom, a methyl group or an ethyl group is more preferable.

In formula (f1-1), $nf^1$ represents an integer of 1 to 5, preferably an integer of 1 to 3, and more preferably 1 or 2.

In formula (f1-1), $Rf^{101}$ represents an organic group containing a fluorine atom, and is preferably a hydrocarbon group containing a fluorine atom.

The hydrocarbon group containing a fluorine atom may be linear, branched or cyclic, and preferably has 1 to 20 carbon atoms, more preferably 1 to 15 carbon atoms, and most preferably 1 to 10 carbon atoms.

It is preferable that the hydrocarbon group having a fluorine atom has 25% or more of the hydrogen atoms within the hydrocarbon group fluorinated, more preferably 50% or more, and most preferably 60% or more, as the hydrophobicity of the resist film during immersion exposure is enhanced.

Among these, as $Rf^{101}$, a fluorinated hydrocarbon group of 1 to 5 carbon atoms is preferable, and a methyl group, —$CH_2$—$CF_3$, —$CH_2$—$CF_2$—$CF_3$, —$CH(CF_3)_2$, —$CH_2$—$CH_2$—$CF_3$, and —$CH_2$—$CH_2$—$CF_2$—$CF_2$—$CF_2$—$CF_3$ are most preferable.

The weight average molecular weight (Mw) (the polystyrene equivalent value determined by gel permeation chromatography) of the component (F) is preferably 1,000 to 50,000, more preferably 5,000 to 40,000, and most preferably 10,000 to 30,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, the dispersity (Mw/Mn) of the component (F) is preferably 1.0 to 5.0, more preferably 1.0 to 3.0, and most preferably 1.2 to 2.5.

As the component (F), one type may be used alone, or two or more types may be used in combination.

The component (F) is generally used in an amount within a range from 0.5 to 10 parts by weight, relative to 100 parts by weight of the component (A).

In the present invention, if desired, other miscible additives can also be added to the resist composition. Examples of such miscible additives include additive resins for improving the performance of the resist film, dissolution inhibitors, plasticizers, stabilizers, colorants, halation prevention agents, and dyes.

[Component (S)]

In the present invention, the resist composition can be prepared by dissolving the materials for the resist composition in an organic solvent (hereafter, frequently referred to as "component (S)").

The component (S) may be any organic solvent which can dissolve the respective components to give a uniform solution, and one or more kinds of any organic solvent can be appropriately selected from those which have been conventionally known as solvents for a chemically amplified resist.

Examples thereof include lactones such as γ-butyrolactone; ketones such as acetone, methyl ethyl ketone (MEK), cyclohexanone, methyl-n-pentyl ketone (2-heptanone), and methyl isopentyl ketone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene; and dimethylsulfoxide (DMSO).

These solvents can be used individually, or in combination as a mixed solvent.

Among these, PGMEA, PGME, γ-butyrolactone and EL are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL or cyclohexanone is mixed as the polar solvent, the PGMEA:EL or cyclohexanone weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the component (S) is not particularly limited, and is appropriately adjusted to a concentration which enables coating of a coating solution to a substrate In general, the organic solvent is used in an amount such that the solid content of the resist composition becomes within the range from 1 to 20% by weight, and preferably from 2 to 15% by weight.

If desired, other miscible additives can also be added to the resist composition of the present invention. Examples of such miscible additives include additive resins for improving the performance of the resist film, dissolution inhibitors, plasticizers, stabilizers, colorants, halation prevention agents, and dyes.

<<Second Aspect: Method of Forming Resist Pattern>>

The method of forming a resist pattern according to a second aspect of the present invention includes: forming a resist film on a substrate using a resist composition according to the first aspect; conducting exposure of the resist film; and developing the resist film to form a resist pattern.

The method for forming a resist pattern according to the present invention can be performed, for example, as follows.

Firstly, a resist composition of the present invention is applied to a substrate using a spinner or the like, and a bake treatment (post applied bake (PAB)) is conducted at a temperature of 80 to 150° C. for 40 to 120 seconds, preferably 60 to 90 seconds, to form a resist film.

Following selective exposure of the thus formed resist film, either by exposure through a mask having a predetermined pattern formed thereon (mask pattern) using an exposure apparatus such as an ArF exposure apparatus, an electron beam lithography apparatus or an EUV exposure apparatus, or by patterning via direct irradiation with an electron beam without using a mask pattern, baking treatment (post exposure baking (PEB)) is conducted under temperature conditions of 80 to 150° C. for 40 to 120 seconds, and preferably 60 to 90 seconds.

Next, the resist film is subjected to a developing treatment.

The developing treatment is conducted using an alkali developing solution in the case of an alkali developing process, and a developing solution containing an organic solvent (organic developing solution) in the case of a solvent developing process.

After the developing treatment, it is preferable to conduct a rinse treatment. The rinse treatment is preferably conducted using pure water in the case of an alkali developing process, and a rinse solution containing an organic solvent in the case of a solvent developing process.

In the case of a solvent developing process, after the developing treatment or the rinsing, the developing solution or the rinse liquid remaining on the pattern can be removed by a treatment using a supercritical fluid.

After the developing treatment or the rinse treatment, drying is conducted. If desired, bake treatment (post bake) can be conducted following the developing. In this manner, a resist pattern can be obtained.

The substrate is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) and an organic film such as a lower-layer organic film used in a multilayer resist method can be used.

Here, a "multilayer resist method" is method in which at least one layer of an organic film (lower-layer organic film) and at least one layer of a resist film (upper resist film) are provided on a substrate, and a resist pattern formed on the upper resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed.

The multilayer resist method is broadly classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (thin metal film or the like) provided between the upper-layer resist film and the lower-layer organic film (triple-layer resist method).

The wavelength to be used for exposure is not particularly limited and the exposure can be conducted using radiation such as ArF excimer laser, KrF excimer laser, $F_2$ excimer laser, extreme ultraviolet rays (EUV), vacuum ultraviolet rays (VUV), electron beam (EB), X-rays, and soft X-rays. The resist composition of the present invention is effective to KrF excimer laser, ArF excimer laser, EB and EUV.

The exposure of the resist film can be either a general exposure (dry exposure) conducted in air or an inert gas such as nitrogen, or immersion exposure (immersion lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long as it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

As the immersion medium, water is preferable in terms of cost, safety, environment and versatility.

As an example of the alkali developing solution used in an alkali developing process, a 0.1 to 10% by weight aqueous solution of tetramethylammonium hydroxide (TMAH) can be given.

As the organic solvent contained in the organic developing solution used in a solvent developing process, any of the conventional organic solvents can be used which are capable of dissolving the component (A) (prior to exposure). Specific examples of the organic solvent include polar solvents such as ketone solvents, ester solvents, alcohol solvents, amide solvents and ether solvents, and hydrocarbon solvents.

If desired, the organic developing solution may have a conventional additive blended. Examples of the additive include surfactants. The surfactant is not particularly limited, and for example, an ionic or non-ionic fluorine and/or silicon surfactant can be used.

When a surfactant is added, the amount thereof based on the total amount of the organic developing solution is generally 0.001 to 5% by weight, preferably 0.005 to 2% by weight, and more preferably 0.01 to 0.5% by weight.

The developing treatment can be performed by a conventional developing method. Examples thereof include a method in which the substrate is immersed in the developing solution for a predetermined time (a dip method), a method in which the developing solution is cast up on the surface of the substrate by surface tension and maintained for a predetermined period (a puddle method), a method in which the developing solution is sprayed onto the surface of the substrate (spray method), and a method in which the developing solution is continuously ejected from a developing solution ejecting nozzle while scanning at a constant rate to apply the developing solution to the substrate while rotating the substrate at a constant rate (dynamic dispense method).

The rinse treatment using a rinse liquid (washing treatment) can be conducted by a conventional rinse method. Examples of the rinse method include a method in which the rinse liquid is continuously applied to the substrate while rotating it at a constant rate (rotational coating method), a method in which the substrate is immersed in the rinse liquid for a predetermined time (dip method), and a method in which the rinse liquid is sprayed onto the surface of the substrate (spray method).

The resist composition according to the first aspect of the present invention exhibits excellent lithography properties. The reason for this is presumed as follows.

The resist composition according to the first aspect of the present invention has a structural unit (a0) having a bulky structure. Therefore, it is presumed that diffusion of acid can be well controlled. Further, by virtue of employing an acid generator having an electron withdrawing group in the cation moiety, it is presumed that an appropriate acidity can be obtained, thereby contributing to the improvement in the lithography properties.

<<Third Aspect: Resist Composition>>

A third aspect of the present invention is a resist composition which generates acid upon exposure and exhibits changed solubility in a developing solution under action of acid, and which includes a base component (A') which exhibits changed solubility in a developing solution under action of acid and an acid diffusion control agent (D'), the base component (A') including a resin component containing a structural unit (a0) represented by general formula (a0-1) and a structural unit (a2') derived from an acrylate ester monomer having a log P value of less than 1.2, and the acid diffusion control agent (D') having an acid dissociation constant of 1.5 or more.

In the present embodiment, the resist composition contains a base component (A') (hereafter, referred to as "component (A')") which exhibits changed solubility in a developing solution under action of acid, the component (A') containing a resin component having a structural unit (a0) represented by general formula (a0-1) and a structural unit (a2') derived from an acrylate ester having a log P value of less than 1.2.

In the present embodiment, the component (A') may be constituted of a single polymeric compound, or constituted of a plurality of polymeric compounds.

For example, the component (A') may consist of: a polymeric compound (A1') having the structural unit (a0) and the structural unit (a2'); a polymeric compound (A2') having the structural unit (a0) and the structural unit (a2') and a polymeric compound (A3') having the structural unit (a0); or a polymeric compound (A4') having the structural unit (a2') and a structural unit (a9) described later and the polymeric compound (A3').

The polymeric compound (A1') preferably has a structural unit (a9) described later.

When a resist film is formed using the resist composition and the formed resist film is subjected to a selective exposure, acid is generated at exposed portions, and the generated acid acts on the component (A') to change the solubility of the component (A') in a developing solution, whereas the solubility of the component (A') in a developing solution is not changed at unexposed portions, thereby generating difference in solubility in a developing solution between exposed portions and unexposed portions. Therefore, by subjecting the resist film to development, the exposed portions are dissolved and removed to form a positive-tone resist pattern in the case of a positive resist, whereas the unexposed portions are dissolved and removed to form a negative-tone resist pattern in the case of a negative resist.

In the present specification, a resist composition which forms a positive resist pattern by dissolving and removing the exposed portions is called a positive resist composition, and a resist composition which forms a negative resist pattern by dissolving and removing the unexposed portions is called a negative resist composition.

In the present embodiment, the resist composition may be either a positive resist composition or a negative resist composition.

Further, in the present embodiment, the resist composition may be applied to an alkali developing process using an alkali developing solution in the developing treatment, or a solvent developing process using a developing solution containing an organic solvent (organic developing solution) in the developing treatment, and preferably a solvent developing process.

In the present embodiment, the resist composition has a function of generating acid upon exposure, and in the resist composition, the component (A') may generate acid upon exposure, or an additive component other than the component (A') may generate acid upon exposure.

More specifically, in the present embodiment, the resist composition may be a resist composition (1) containing an acid generator component (B') which generates acid upon exposure (hereafter, referred to as "component (B')";

a resist composition (2) in which the component (A') is a component which generates acid upon exposure; or a resist composition (3) in which the component (A') is a component which generates acid upon exposure, and further containing an acid generator component (B').

That is, when the resist composition of the present invention is the aforementioned resist composition (2) or (3), the component (A') is a "base component which generates acid upon exposure and exhibits changed solubility in a developing solution under action of acid". In the case where the component (A') is a base component which generates acid upon exposure and exhibits changed solubility in a developing solution under action of acid, the component (A1') described later is preferably a polymeric compound which generates acid upon exposure and exhibits changed solubility in a developing solution under action of acid. As the polymeric compound, a resin having a structural unit which generates acid upon exposure can be used. As the structural unit which generates acid upon exposure, a conventional structural unit can be used.

In the present embodiment, it is particularly desirable that the resist composition is the aforementioned resist composition (1).

<Component (A')>

In the present invention, the term "base component" refers to an organic compound capable of forming a film, and is preferably an organic compound having a molecular weight of 500 or more. When the organic compound has a molecular weight of 500 or more, the film-forming ability is improved, and a photosensitive resin pattern of nano level can be easily formed.

The organic compound used as the base component is broadly classified into non-polymers and polymers.

In general, as a non-polymer, any of those which have a molecular weight in the range of 500 to less than 4,000 is used. Hereafter, a "low molecular weight compound" refers to a non-polymer having a molecular weight in the range of 500 to less than 4,000.

As a polymer, any of those which have a molecular weight of 1,000 or more is generally used. Hereafter, a "resin" refers to a polymer having a molecular weight of 1,000 or more.

As the molecular weight of the polymer, the weight average molecular weight in terms of the polystyrene equivalent value determined by gel permeation chromatography (GPC) is used.

As the component (A'), a resin, a low molecular weight compound, or a combination thereof may be used.

The component (A) may be a resin that exhibits increased solubility in a developing solution under action of acid or a resin that exhibits decreased solubility in a developing solution under action of acid.

In the present invention, the component (A) may be a component that generates acid upon exposure.

(Structural Unit (a0))

In the present embodiment, the component (A') contains a resin component having a structural unit (a0) represented by the aforementioned general formula (a0-1).

The structural unit (a0) is the same as defined for the structural unit (a0) described in the first aspect.

In the component (A'), the amount of the structural unit (a0) based on the combined total of all structural units constituting the component (A') is preferably 50 to 80 mol %, more preferably 10 to 75 mol %, and still more preferably 10 to 70 mol %. By ensuring the lower limit, various lithography properties such as sensitivity, resolution and LWR are improved. On the other hand, when the amount of the structural unit (a1) is no more than the upper limit of the above-mentioned range, a good balance can be achieved with the other structural units.

(Structural Unit (a2'))

The structural unit (a2') is a structural unit derived from an acrylate ester monomer having a log P value of less than 1.2.

In the present embodiment, log P value is a logarithmic value of n-octanol/water partition coefficient (P), and is an effective parameter for determining the hydrophilicity/hydrophobicity property of a wide variety of compounds. In general, partition coefficient is determined by calculation, not by experiment. In the present embodiment, the partition coefficient indicates a value calculated by CS ChemDrawUltra Ver. 8.0 software package (Crippen's fragmentation method).

The larger the log P value becomes plus 0, it means that the hydrophobicity becomes higher. The larger the absolute value of the log P value becomes minus 0, it means that water solubility becomes higher. The log P value has a negative correlation with water solubility of an organic compound, and is widely used as a parameter for estimating the hydrophilicity/hydrophobicity of an organic compound.

In the present embodiment, the structural unit (a2') preferably has a log P value of less than 1.0, more preferably 0.8 or less, and most preferably 0.7 or less.

Further, the log P value is preferably −3 or more, more preferably −1 or more, and most preferably 0 or more.

The above upper limits and lower limits can be arbitrarily combined.

In the present embodiment, specifically, as the structural unit (a2'), a structural unit derived from an acrylate ester monomer having a log P value of less than 1.2 and containing an —$SO_2$— containing cyclic group, a lactone-containing cyclic group, a heterocyclic group or a carbonate-containing cyclic group can be mentioned as preferable examples.

When the component (A') is used for forming a resist film, the structural unit (a2') containing an —$SO_2$— containing cyclic group, a lactone-containing cyclic group, a heterocyclic group or a carbonate-containing cyclic group is effective in improving the adhesion between the resist film and the substrate.

Further, among structural units containing an —$SO_2$— containing cyclic group, a lactone-containing cyclic group, a heterocyclic group or a carbonate-containing cyclic group, it is considered that using a structural unit derived from an acrylate ester monomer having a log P value of less than 1.2 contributes to improvement in film retention ratio.

A structural unit (a1) (described later) which contains an —$SO_2$— containing cyclic group, a lactone-containing cyclic group or a carbonate-containing cyclic group falls under the definition of the structural unit (a2'); however, such a structural unit is regarded as a structural unit (a1), and does not fall under the definition of the structural unit (a2').

The structural unit (a2') is preferably a structural unit represented by general formula (a2'-1) shown below.

[Chemical Formula 69]

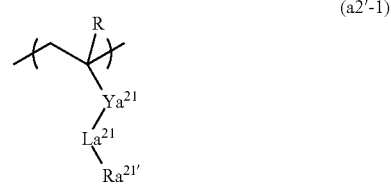

(a2'-1)

In the formula, R represents a hydrogen atom, an alkyl group of 1 to 5 carbon atoms, a halogenated alkyl group of 1 to 5 carbon atoms, a hydroxyalkyl group, an alkoxy group; $Ya^{21}$ represents a single bond or a divalent linking group; $La^{21}$ represents —O—, —COO—, —CON(R')—, —OCO—, —CONHCO— or —CONHCS—; and R' represents a hydrogen atom or a methyl group, provided that, when $La^{21}$ represents —O—, $Ya^{21}$ does not represents —CO—; and $Ra^{21'}$ represents an —$SO_2$— containing cyclic group, a lactone-containing cyclic group, a heterocyclic group or a carbonate-containing cyclic group.

In formula (a2'-1), R, $Ya^{21}$, $La^{21}$ and R' are the same as defined for R, $Ya^{21}$, $La^{21}$ and R' in the aforementioned general formula (a2-1).

In formula (a2'-1), $Ra^{21"}$ represents an —$SO_2$— containing cyclic group, a lactone-containing cyclic group, a heterocyclic group or a carbonate-containing cyclic group.

The —$SO_2$— containing cyclic group, the lactone-containing cyclic group and the carbonate-containing cyclic group for $Ra^{21"}$ are the same as defined for the —$SO_2$— containing cyclic group, the lactone-containing cyclic group and the carbonate-containing cyclic group for $Ra^{21}$ in the aforementioned general formula (a2-1).

In the present embodiment, when the structural unit (a2') contains an —$SO_2$— containing cyclic group, there is no particular limitation as long as the acrylate ester monomer containing an —$SO_2$— containing cyclic group has a log P value of less than 1.2. Among these, a group represented by the aforementioned general formula (a5-r-1) is preferable, at least one member selected from the group consisting of groups represented by the aforementioned chemical formulas (r-s1-1-1), (r-s1-1-18), (r-s1-3-1) and (r-s1-4-1) is more preferable, and a group represented by chemical formula (r-s1-1-1) is most preferable.

In the present embodiment, when the structural unit (a2') contains a lactone-containing cyclic group, there is no particular limitation as long as the acrylate ester monomer containing a lactone-containing cyclic group has a log P value of less than 1.2, but is preferably a group represented by the aforementioned general formula (a2-r-1) or (a2-r-2), and more preferably a group represented by the aforementioned chemical formula (r-1c-1-1) or (r-1c-2-7). In formula (a2-r-1), A" is preferably an oxygen atom or a sulfur atom.

A "heterocyclic group" refers to a cyclic group containing, in addition to carbon, 1 or more atoms other than carbon. Examples of the heterocyclic group include heterocyclic groups represented by the aforementioned formulae (r-hr-1) to (r-hr-16) and nitrogen-containing heterocyclic groups. Examples of the nitrogen-containing heterocyclic groups include cycloalkyl groups of 3 to 8 carbon atoms which may be substituted with 1 or 2 oxo groups. Preferable examples of the cycloalkyl group include 2,5-dioxopyrrolidine and 2,6-dioxopiperidine.

Specific examples of acrylate ester monomers having a log P value of less than 1.2 are shown below with the Log P values.

[Chemical Formula 70]

LogP: 0.54

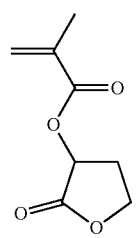

LogP: 0.12

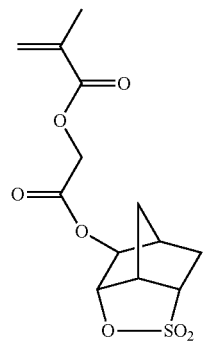

LogP: 0.23

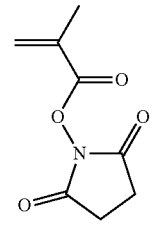

LogP: 0.49

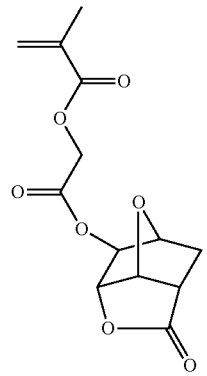

As the structural unit (a2') contained in the component (A'), 1 kind of structural unit may be used, or 2 or more kinds may be used.

When the component (A') contains the structural unit (a2'), the amount of the structural unit (a2') based on the combined total of all structural units constituting the component (A') is preferably 1 to 80 mol %, more preferably 5 to 70 mol %, still more preferably 10 to 65 mol %, and most preferably 10 to 60 mol %. When the amount of the structural unit (a2') is at least as large as the lower limit of the above-mentioned range, the effect of using the structural unit (a2') can be satisfactorily achieved. On the other hand, when the amount of the structural unit (a2') is no more than the upper limit of the above-mentioned range, a good balance can be achieved with the other structural units, and various lithography properties and pattern shape can be improved.

In the present embodiment, the resin component preferably contains a structural unit (a9).

(Structural Unit (a9))

As the structural unit (a9), a structural unit represented by the aforementioned general formula (a9-1) is preferable.

As the structural unit (a9) contained in the component (A'), 1 kind of structural unit may be used, or 2 or more kinds may be used.

When the component (A') contains the structural unit (a9), the amount of the structural unit (a9) based on the combined total of all structural units constituting the component (A') is preferably 1 to 40 mol %, more preferably 3 to 30 mol %, and most preferably 10 to 30 mol %. When the amount of the structural unit (a9) is at least as large as the lower limit of the above-mentioned range, various lithography properties such as development properties and EL margin are improved. On the other hand, when the amount of the structural unit (a9) is no more than the upper limit of the above-mentioned range, a good balance can be reliably achieved with the other structural units.

In the present embodiment, the component (A') preferably has a structural unit (st) (hereafter, referred to as "structural unit (st)") derived from styrene or hydroxystyrene.

In the present embodiment, both the component (A1') and the component (A3') preferably have a structural unit (st).

The structural unit (st) is the same as defined for the structural unit (st) described in the first aspect.

As the structural unit (st) contained in the component (A'), 1 kind of structural unit may be used, or 2 or more kinds may be used.

When the component (A') includes the structural unit (st), the amount of the structural unit (st) based on the combined total of all structural units constituting the component (A') is preferably 1 to 50 mol %, and more preferably 10 to 40 mol %. When the amount of the structural unit (st) is at least as large as the lower limit of the above-mentioned range, various lithography properties such as development properties and EL margin are improved. On the other hand, when the amount of the structural unit (st) is no more than the upper limit of the above-mentioned range, a good balance can be reliably achieved with the other structural units.

In the present embodiment, the component (A') preferably has a structural unit containing an acid decomposable group which exhibits increased polarity by the action of acid (hereafter, referred to as "structural unit (a1)"), a structural unit containing a polar group-containing aliphatic hydrocarbon group (hereafter, referred to as "structural unit (a3)"), a structural unit containing an acid non-dissociable cyclic group (hereafter, referred to as "structural unit (a4)"), a structural unit containing a lactone-containing cyclic group or a carbonate containing cyclic group (hereafter, referred to as "structural unit (a5)").

(Structural Unit (a1))

The structural unit (a1) is a structural unit containing an acid decomposable group that exhibits increased polarity by the action of acid.

The structural unit (a1) is the same as defined for the structural unit (a1) described in the first aspect.

In the component (A'), the amount of the structural unit (a1) based on the combined total of all structural units constituting the component (A') is preferably 20 to 80 mol %, more preferably 20 to 75 mol %, and still more preferably 25 to 70 mol %. By ensuring the lower limit, various lithography properties such as sensitivity, resolution and LWR are improved. On the other hand, when the amount of the structural unit (a1) is no more than the upper limit of the above-mentioned range, a good balance can be achieved with the other structural units.

(Structural Unit (a3))

The structural unit (a3) is a structural unit containing a polar group-containing aliphatic hydrocarbon group (provided that the structural units that fall under the definition of structural units (a1) and (a2) are excluded).

The structural unit (a3) is the same as defined for the structural unit (a3) described in the first aspect.

As the structural unit (a3) contained in the component (A'), 1 kind of structural unit may be used, or 2 or more kinds may be used.

The amount of the structural unit (a3) within the component (A') based on the combined total of all structural units constituting the component (A') is preferably 5 to 50 mol %, more preferably 5 to 40 mol %, and still more preferably 5 to 25 mol %.

When the amount of the structural unit (a3) is at least as large as the lower limit of the above-mentioned range, the effect of using the structural unit (a3) can be satisfactorily achieved. On the other hand, when the amount of the structural unit (a3) is no more than the upper limit of the above-mentioned range, a good balance can be achieved with the other structural units.

(Structural Unit (a4))

The structural unit (a4) is a structural unit containing an acid non-dissociable cyclic group, and is the same as defined for the structural unit (a4) described in the first aspect.

As the structural unit (a4) contained in the component (A'), 1 kind of structural unit may be used, or 2 or more kinds may be used.

When the structural unit (a4) is included in the component (A'), the amount of the structural unit (a4) based on the combined total of all the structural units that constitute the component (A') is preferably within the range from 1 to 30 mol %, and more preferably from 10 to 20 mol %.

The component (A1') is preferably a copolymer having the structural units (a0), (a9), (a2) and (st).

The component (A2') is preferably a copolymer having the structural units (a0), (a2) and (a9).

The component (A3') is preferably a copolymer having the structural units (st) and (a0).

Alternatively, the component (A') may contain a copolymer having the structural units (a0), (a2) and (a3) and a copolymer having the structural units (st) and (a1).

The component (A') can be obtained, for example, by a conventional radical polymerization or the like of the monomers corresponding with each of the structural units, using a radical polymerization initiator such as azobisisobutyronitrile (AIBN) or dimethyl 2,2'-azobis(isobutyrate).

Furthermore, in the component (A1'), by using a chain transfer agent such as HS—$CH_2$—$CH_2$—$CH_2$—$C(CF_3)_2$—OH, a —$C(CF_3)_2$—OH group can be introduced at the terminals of the component (A1'). Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

In the present invention, the weight average molecular weight (Mw) (the polystyrene equivalent value determined by gel permeation chromatography) of the component (A1') is not particularly limited, but is preferably 1,000 to 50,000, more preferably 1,500 to 30,000, and most preferably 2,000 to 20,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

As the component (A'), one type may be used, or two or more types of compounds may be used in combination.

In the component (A'), the amount of components (A1') to (A4') based on the total weight of the component (A') is preferably 25% by weight or more, more preferably 50% by weight or more, still more preferably 75% by weight or more, and may be even 100% by weight. When the amount of the component (A1) is 25% by weight or more, various lithography properties are improved.

In the resist composition of the present invention, as the component (A'), one type may be used, or two or more types of compounds may be used in combination.

In the resist composition of the present invention, the amount of the component (A') can be appropriately adjusted depending on the thickness of the resist film to be formed, and the like.

<Acid Generator Component; Component (B')>

The resist composition of the present invention may further include an acid generator component (B') (hereafter, referred to as "component (B')") which generates acid upon exposure. As the component (B'), there is no particular limitation, and any of the known acid generators used in conventional chemically amplified resist compositions can be used.

As the component (B'), the same as the component (B) in the first aspect can be used. In addition, as the component (B'), compounds given as examples of component (B) which do not have an electron withdrawing group in the cation moiety can also be used.

As the component (B'), one type of these acid generators may be used alone, or two or more types may be used in combination.

When the resist composition of the present invention contains the component (B'), the amount of the component (B') relative to 100 parts by weight of the component (A') is preferably within a range from 0.5 to 60 parts by weight, more preferably from 1 to 50 parts by weight, and still more preferably from 1 to 40 parts by weight. When the amount of the component (B') is within the above-mentioned range, formation of a resist pattern can be satisfactorily performed. Further, by virtue of the above-mentioned range, when each of the components are dissolved in an organic solvent, a uniform solution can be obtained and the storage stability becomes satisfactory.

<Basic Compound Component; Component (D')>

The resist composition of the present embodiment contains an acid diffusion control agent (hereafter, referred to as "component (D')"). In the present embodiment, the component (D') has an acid dissociation constant of 1.5 or more.

In the present invention, "acid dissociation constant" (pKa) refers to a value generally used as a parameter which shows the acid strength of an objective substance. The pKa value of the component (D') can be determined by a conventional method. Alternatively, the pKa value can be calculated by using a conventional software such as "ACD/Labs" (trade name; manufactured by Advanced Chemistry Development, Inc.).

The component (D') functions as an acid diffusion control agent, i.e., a quencher which traps the acid generated from the component (B) and the like upon exposure.

In the present embodiment, as the component (D'), a photodegradable base (D1') (hereafter, referred to as "component (D1')") is decomposable by exposure to lose the ability of controlling of acid diffusion can be mentioned.

[Component (D1')]

When a resist pattern is formed using a resist composition containing the component (D1'), the contrast between exposed portions and unexposed portions is improved.

The component (D1') is not particularly limited as long as it is decomposable by exposure to lose the ability of controlling of acid diffusion and has an acid dissociation constant (hereafter, sometimes referred to as "pKa") of 1.5 or more.

In the present embodiment, the component (D1') preferably has a pKa of 2.0 or more, and more preferably 3.0 or more.

Specifically, as the component (D1'), at least one member selected from the group consisting of a compound (d1-1) represented by the aforementioned general formula (d1-1) (hereafter, referred to as "component (d1-1)"), a compound (d1-2) represented by the aforementioned general formula (d1-2) (hereafter, referred to as "component (d1-2)") and a compound (d1-3) represented by the aforementioned general formula (d1-3) (hereafter, referred to as "component (d1-3)") and has a pKa of 1.5 or more is preferable.

At exposed portions, the components (d1-1) to (d1-3) are decomposed and then lose the ability of controlling of acid diffusion (i.e., basicity), and therefore the components (d1-1) to (d1-3) cannot function as a quencher, whereas at unexposed portions, the components (d1-1) to (d1-3) functions as a quencher.

As the anion moiety of the component (d1-1), an anion moiety represented by formula (d1-1-20) or (d1-1-21) is preferable.

As the anion moiety of the component (d1-2), an anion moiety represented by formula (d1-2-11) is preferable.

As the anion moiety of the component (d1-3) an anion moiety represented by any one of formulae (d1-3-1) to (d1-3-6) is preferable, and an anion moiety represented by formula (d1-3-1) is more preferable.

As the component (D1'), one type of the aforementioned components (d1-1) to (d1-3), or at least two types of the aforementioned components (d1-1) to (d1-3) can be used in combination.

The amount of the component (Dr) relative to 100 parts by weight of the component (A') is preferably within a range from 0.5 to 10 parts by weight, more preferably from 0.5 to 8 parts by weight, and still more preferably from 1 to 8 parts by weight.

When the amount of the component (Dr) is at least as large as the lower limit of the above-mentioned range, excellent lithography properties and excellent resist pattern shape can be obtained. On the other hand, when the amount of the component (D1) is no more than the upper limit of the above-mentioned range, sensitivity can be maintained at a satisfactory level, and through-put becomes excellent.

The production methods of the components (d1-1) and (d1-2) are not particularly limited, and the components (d1-1) and (d1-2) can be produced by conventional methods.

<Optional Components>

[Component (E')]

In the present embodiment, in the resist composition, for preventing any deterioration in sensitivity, and improving the resist pattern shape and the post exposure stability of the latent image formed by the pattern-wise exposure of the resist layer, at least one compound (E') (hereafter referred to as the component (E')) selected from the group consisting of an organic carboxylic acid, or a phosphorus oxo acid or derivative thereof can be added.

The component (E') is the same as defined for the component (E) described in the first aspect.

As the component (E'), one type may be used alone, or two or more types may be used in combination.

The component (E') is typically used in an amount within a range from 0.01 to 5.0 parts by weight, relative to 100 parts by weight of the component (A').

[Component (F')]

In the present embodiment, the resist composition of the present invention may contain a fluorine additive (hereafter, referred to as "component (F')") for imparting water repellency to the resist film.

The component (F') is the same as defined for the component (F) described in the first aspect.

As the component (F'), one type may be used alone, or two or more types may be used in combination.

The component (F') is generally used in an amount within a range from 0.5 to 10 parts by weight, relative to 100 parts by weight of the component (A').

In the present invention, if desired, other miscible additives can also be added to the resist composition. Examples of such miscible additives include additive resins for improving the performance of the resist film, dissolution inhibitors, plasticizers, stabilizers, colorants, halation prevention agents, and dyes.

[Component (S')]

In the present embodiment, the resist composition can be prepared by dissolving the materials for the resist composition in an organic solvent (hereafter, frequently referred to as "component (S')").

The component (S') is the same as defined for the component (S) described in the first aspect.

The amount of the component (S') is not particularly limited, and is appropriately adjusted to a concentration which enables coating of a coating solution to a substrate In general, the organic solvent is used in an amount such that the solid content of the resist composition becomes within the range from 1 to 20% by weight, and preferably from 2 to 15% by weight.

<<Fourth Aspect: Method of Forming Resist Pattern>>

The method of forming a resist pattern according to a fourth aspect of the present invention includes: forming a resist film on a substrate using a resist composition according to the third aspect; conducting exposure of the resist film; and developing the resist film to form a resist pattern.

The explanation of the method of forming a resist pattern according to the fourth aspect is the same as the explanation of the method of forming a resist pattern according to the second aspect.

The resist composition according to the third aspect of the present invention exhibits excellent lithography properties. The reason for this is presumed as follows.

The resist composition according to the third aspect of the present invention has a structural unit (a0) having a bulky structure. Therefore, it is presumed that diffusion of acid can be well controlled. On the other hand, the structural unit (a0) has a tendency of exhibiting low deprotection energy. Therefore, it is presumed that, by using the predetermined component (D'), deprotection at unexposed portions can be controlled, thereby improving the contrast between exposed portions and unexposed portions.

<<Fifth Aspect: Resist Composition>>

A fifth aspect of the present invention is a resist composition which generates acid upon exposure and exhibits changed solubility in a developing solution under action of acid, and which includes a base component (A") which exhibits changed solubility in a developing solution under action of acid, the base component (A") including a resin component having a structural unit (a0) represented by general formula (a0-1) and a structural unit (a9) represented by general formula (a9-1) shown below.

In the present embodiment, the resist composition contains a base component (A") (hereafter, referred to as "component (A")") which exhibits changed solubility in a developing solution under action of acid, the component (A") containing a resin component having a structural unit (a0) represented by general formula (a0-1) and a structural unit (a9) represented by general formula (a9-1).

In the present embodiment, the component (A") may be constituted of a single polymeric compound, or constituted of a plurality of polymeric compounds.

In the present embodiment, for example, the component (A") may consist of a polymeric compound (A1") (hereafter, referred to as "component (A1")") having the structural unit (a0) and the structural unit (a9). Alternatively, the component (A") may consist of a polymeric compound (A2") (hereafter, referred to as "component (A2")") having the structural unit (a0) and a polymeric compound (A3") (hereafter, referred to as "component (A3")") having the structural unit (a9).

When a resist film is formed using the resist composition and the formed resist film is subjected to a selective exposure, acid is generated at exposed portions, and the generated acid acts on the component (A") to change the solubility of the component (A") in a developing solution, whereas the solubility of the component (A") in a developing solution is not changed at unexposed portions, thereby generating difference in solubility in a developing solution between exposed portions and unexposed portions. Therefore, by subjecting the resist film to development, the exposed portions are dissolved and removed to form a positive-tone resist pattern in the case of a positive resist, whereas the unexposed portions are dissolved and removed to form a negative-tone resist pattern in the case of a negative resist.

In the present specification, a resist composition which forms a positive resist pattern by dissolving and removing the exposed portions is called a positive resist composition, and a resist composition which forms a negative resist pattern by dissolving and removing the unexposed portions is called a negative resist composition.

In the present embodiment, the resist composition may be either a positive resist composition or a negative resist composition.

Further, in the present embodiment, the resist composition may be applied to an alkali developing process using an alkali developing solution in the developing treatment, or a solvent developing process using a developing solution containing an organic solvent (organic developing solution) in the developing treatment, and preferably a solvent developing process.

In the present embodiment, the resist composition has a function of generating acid upon exposure, and in the resist composition, the component (A") may generate acid upon exposure, or an additive component other than the component (A") may generate acid upon exposure.

More specifically, in the present embodiment, the resist composition may be a resist composition (1) containing an acid generator component (B") which generates acid upon exposure (hereafter, referred to as "component (B")");

a resist composition (2) in which the component (A") is a component which generates acid upon exposure; or a resist composition (3) in which the component (A") is a component which generates acid upon exposure, and further containing an acid generator component (B").

That is, when the resist composition of the present invention is the aforementioned resist composition (2) or (3), the component (A") is a "base component which generates acid upon exposure and exhibits changed solubility in a developing solution under action of acid". In the case where the component (A") is a base component which generates acid upon exposure and exhibits changed solubility in a developing solution under action of acid, the component (A1") described later is preferably a polymeric compound which generates acid upon exposure and exhibits changed solubility in a developing solution under action of acid. As the polymeric compound, a resin having a structural unit which generates acid upon exposure can be used. As the structural unit which generates acid upon exposure, a conventional structural unit can be used.

In the present embodiment, it is particularly desirable that the resist composition is the aforementioned resist composition (1).

<Component (A")>

In the present invention, the term "base component" refers to an organic compound capable of forming a film, and is preferably an organic compound having a molecular weight of 500 or more. When the organic compound has a molecular weight of 500 or more, the film-forming ability is improved, and a photosensitive resin pattern of nano level can be easily formed.

The organic compound used as the base component is broadly classified into non-polymers and polymers.

In general, as a non-polymer, any of those which have a molecular weight in the range of 500 to less than 4,000 is used. Hereafter, a "low molecular weight compound" refers to a non-polymer having a molecular weight in the range of 500 to less than 4,000.

As a polymer, any of those which have a molecular weight of 1,000 or more is generally used. Hereafter, a "resin" refers to a polymer having a molecular weight of 1,000 or more.

As the molecular weight of the polymer, the weight average molecular weight in terms of the polystyrene equivalent value determined by gel permeation chromatography (GPC) is used.

As the component (A"), a resin, a low molecular weight compound, or a combination thereof may be used.

The component (A") may be a resin that exhibits increased solubility in a developing solution under action of acid or a resin that exhibits decreased solubility in a developing solution under action of acid.

In the present invention, the component (A") may be a component that generates acid upon exposure.

(Structural Unit (a0))

In the present embodiment, the component (A") contains a resin component having a structural unit (a0) represented by general formula (a0-1) shown below.

The structural unit (a0) is the same as defined for the structural unit (a0) described in the first aspect.

In the component (A"), the amount of the structural unit (a0) based on the combined total of all structural units constituting the component (A") is preferably 50 to 80 mol %, more preferably 10 to 75 mol %, and still more preferably 10 to 70 mol %. By ensuring the lower limit, various lithography properties such as sensitivity, resolution and LWR are improved. On the other hand, when the amount of the structural unit (a1) is no more than the upper limit of the above-mentioned range, a good balance can be achieved with the other structural units.

In the present embodiment, the component (A") has a structural unit (a9).

(Structural Unit (a9))

As the structural unit (a9), a structural unit represented by the aforementioned general formula (a9-1) is preferable.

The structural unit (a9) is the same as defined for the structural unit (a9) described in the first aspect.

As the structural unit (a9) contained in the component (A"), 1 kind of structural unit may be used, or 2 or more kinds may be used.

When the component (A") contains the structural unit (a9), the amount of the structural unit (a9) based on the combined total of all structural units constituting the component (A") is preferably 1 to 40 mol %, more preferably 3 to 30 mol %, and most preferably 10 to 30 mol %. When the amount of the structural unit (a9) is at least as large as the lower limit of the above-mentioned range, various lithography properties such as development properties and EL margin are improved. On the other hand, when the amount of the structural unit (a9) is no more than the upper limit of the above-mentioned range, a good balance can be reliably achieved with the other structural units.

In the present embodiment, the component (A") preferably has a structural unit (st) (hereafter, referred to as "structural unit (s0)") derived from styrene or hydroxystyrene.

In the present embodiment, both the component (A1') and the component (A2') preferably have a structural unit (st).

The structural unit (st) is the same as defined for the structural unit (st) described in the first aspect.

As the structural unit (st) contained in the component (A"), 1 kind of structural unit may be used, or 2 or more kinds may be used.

When the component (A") includes the structural unit (st), the amount of the structural unit (st) based on the combined total of all structural units constituting the component (A") is preferably 1 to 50 mol %, and more preferably 10 to 40 mol %. When the amount of the structural unit (st) is at least as large as the lower limit of the above-mentioned range, various lithography properties such as development properties and EL margin are improved. On the other hand, when the amount of the structural unit (st) is no more than the upper limit of the above-mentioned range, a good balance can be reliably achieved with the other structural units.

In the present embodiment, the component (A") preferably has a structural unit containing an acid decomposable group which exhibits increased polarity by the action of acid (hereafter, referred to as "structural unit (a1)"), a structural unit derived from an acrylate ester containing a —$SO_2$— containing cyclic group (hereafter, referred to as "structural unit (a2)"), a structural unit containing a polar group-containing aliphatic hydrocarbon group (hereafter, referred to as "structural unit (a3)"), a structural unit containing an acid non-dissociable cyclic group (hereafter, referred to as "structural unit (a4)"), a structural unit containing a lactone-containing cyclic group or a carbonate containing cyclic group (hereafter, referred to as "structural unit (a5)").

(Structural Unit (a1))

The structural unit (a1) is a structural unit containing an acid decomposable group that exhibits increased polarity by the action of acid.

The structural unit (a1) is the same as defined for the structural unit (a1) described in the first aspect.

In the component (A"), the amount of the structural unit (a1) based on the combined total of all structural units constituting the component (A") is preferably 1 to 60 mol %, more preferably 5 to 50 mol %, and still more preferably 10 to 40 mol %. By ensuring the lower limit, various lithography properties such as sensitivity, resolution and LWR are improved. On the other hand, when the amount of the structural unit (a1) is no more than the upper limit of the above-mentioned range, a good balance can be achieved with the other structural units.

(Structural Unit (a2))

The structural unit (a2) is a structural unit containing an —$SO_2$— containing cyclic group, a lactone-containing cyclic group or a carbonate-containing cyclic group.

When the component (A1") is used for forming a resist film, the structural unit (a2) containing an —$SO_2$— containing cyclic group, a lactone-containing cyclic group or a carbonate-containing cyclic group is effective in improving the adhesion between the resist film and the substrate.

In the present invention, the component (A1") preferably has a structural unit (a2).

The aforementioned structural unit (a1) which contains an —$SO_2$— containing cyclic group, a lactone-containing cyclic group or a carbonate-containing cyclic group falls under the definition of the structural unit (a2); however, such a structural unit is regarded as a structural unit (a1), and does not fall under the definition of the structural unit (a2).

The structural unit (a2) is the same as defined for the structural unit (a2) described in the first aspect.

As the structural unit (a2) contained in the component (A"), 1 kind of structural unit may be used, or 2 or more kinds may be used.

When the component (A") contains the structural unit (a2), the amount of the structural unit (a2) based on the combined total of all structural units constituting the component (A") is preferably 1 to 80 mol %, more preferably 5 to 70 mol %, still more preferably 10 to 65 mol %, and most preferably 10 to 60 mol %. When the amount of the structural unit (a2) is at least as large as the lower limit of the above-mentioned range, the effect of using the structural unit (a2) can be satisfactorily achieved. On the other hand, when the amount of the structural unit (a2) is no more than the upper limit of the above-mentioned range, a good balance can be achieved with the other structural units, and various lithography properties and pattern shape can be improved.

(Structural Unit (a3))

The structural unit (a3) is a structural unit containing a polar group-containing aliphatic hydrocarbon group (provided that the structural units that fall under the definition of structural units (a1) and (a2) are excluded).

When the component (A") includes the structural unit (a3), it is presumed that the hydrophilicity of the component (A") is enhanced, thereby contributing to improvement in resolution.

The structural unit (a3) is the same as defined for the structural unit (a3) described in the first aspect.

As the structural unit (a3) contained in the component (A), 1 kind of structural unit may be used, or 2 or more kinds may be used.

The amount of the structural unit (a3) within the component (A") based on the combined total of all structural units constituting the component (A") is preferably 5 to 50 mol %, more preferably 5 to 40 mol %, and still more preferably 5 to 25 mol %.

When the amount of the structural unit (a3) is at least as large as the lower limit of the above-mentioned range, the effect of using the structural unit (a3) can be satisfactorily achieved. On the other hand, when the amount of the structural unit (a3) is no more than the upper limit of the above-mentioned range, a good balance can be achieved with the other structural units.

(Structural Unit (a4))

The structural unit (a4) is a structural unit containing an acid non-dissociable cyclic group. When the component (A") includes the structural unit (a4), dry etching resistance of the resist pattern to be formed is improved. Further, the hydrophobicity of the component (A") is further improved. Increase in the hydrophobicity contributes to improvement in terms of resolution, shape of the resist pattern and the like, particularly in an organic solvent developing process.

The structural unit (a4) is the same as defined for the structural unit (a4) described in the first aspect.

As the structural unit (a4) contained in the component (A"), 1 kind of structural unit may be used, or 2 or more kinds may be used.

When the structural unit (a4) is included in the component (A"), the amount of the structural unit (a4) based on the combined total of all the structural units that constitute the component (A") is preferably within the range from 1 to 30 mol %, and more preferably from 10 to 20 mol %.

The component (A1") is preferably a copolymer having the structural units (a0), (a9), (a1) and (a2).

The component (A2") is preferably a copolymer having the structural units (a0) and (st).

The component (A3") is preferably a copolymer containing the structural units (a0), (a9) and (a2), or a copolymer containing the structural units (a1), (a9) and (a2).

The component (A") can be obtained, for example, by a conventional radical polymerization or the like of the monomers corresponding with each of the structural units, using a radical polymerization initiator such as azobisisobutyronitrile (AIBN) or dimethyl 2,2'-azobis(isobutyrate).

Furthermore, in the component (A1"), by using a chain transfer agent such as HS—$CH_2$—$CH_2$—$CH_2$—$C(CF_3)_2$—OH, a —$C(CF_3)_2$—OH group can be introduced at the terminals of the component (A1"). Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

In the present invention, the weight average molecular weight (Mw) (the polystyrene equivalent value determined by gel permeation chromatography) of the component (A") is not particularly limited, but is preferably 1,000 to 50,000, more preferably 1,500 to 30,000, and most preferably 2,000 to 20,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

As the component (A"), one type may be used alone, or two or more types may be used in combination.

In the component (A"), the amount of the component (A1") based on the total weight of the component (A") is preferably 25% by weight or more, more preferably 50% by weight or more, still more preferably 75% by weight or more, and may be even 100% by weight. When the amount of the component (A1) is 25% by weight or more, various lithography properties are improved.

In the resist composition of the present invention, as the component (A"), one type may be used, or two or more types of compounds may be used in combination.

In the resist composition of the present invention, the amount of the component (A") can be appropriately adjusted depending on the thickness of the resist film to be formed, and the like.

<Acid Generator Component; Component (B")>

The resist composition of the present invention may further include an acid generator component (B") (hereafter, referred to as "component (B")") which generates acid upon exposure. As the component (B"), there is no particular limitation, and any of the known acid generators used in conventional chemically amplified resist compositions can be used.

As the component (B"), the same as the component (B) in the first aspect can be used. In addition, as the component (B"), compounds given as examples of component (B) which do not have an electron withdrawing group in the cation moiety can also be used.

As the component (B"), one type of these acid generators may be used alone, or two or more types may be used in combination.

When the resist composition of the present invention contains the component (B"), the amount of the component (B") relative to 100 parts by weight of the component (A") is preferably within a range from 0.5 to 60 parts by weight, more preferably from 1 to 50 parts by weight, and still more preferably from 1 to 40 parts by weight. When the amount of the component (B") is within the above-mentioned range, formation of a resist pattern can be satisfactorily performed. Further, by virtue of the above-mentioned range, when each of the components are dissolved in an organic solvent, a uniform solution can be obtained and the storage stability becomes satisfactory.

<Basic Compound Component; Component (D")>

Moreover, the resist composition of the present invention may include an acid diffusion control agent component (hereafter, frequently referred to as "component (D")"), in addition to the component (A"), or in addition to the component (A") and the component (B").

The component (D") functions as an acid diffusion control agent, i.e., a quencher which traps the acid generated from the component (B") and the like upon exposure.

In the present invention, the component (D") may be a photodecomposable base (D1") (hereafter, referred to as "component (D1")") which is decomposed upon exposure and then loses the ability of controlling of acid diffusion, or a nitrogen-containing organic compound (D2") (hereafter, referred to as "component (D2")") which does not fall under the definition of component (D1").

The components (D1") and (D2") are the same as defined for the components (D1") and (D2") described in the first aspect.

As the component (D1"), one type of the aforementioned components (d1-1) to (d1-3), or at least two types of the aforementioned components (d1-1) to (d1-3) can be used in combination.

The amount of the component (D1") relative to 100 parts by weight of the component (A") is preferably within a range from 0.5 to 10 parts by weight, more preferably from 0.5 to 8 parts by weight, and still more preferably from 1 to 8 parts by weight.

When the amount of the component (D1") is at least as large as the lower limit of the above-mentioned range, excellent lithography properties and excellent resist pattern shape can be obtained. On the other hand, when the amount of the component (D1) is no more than the upper limit of the above-mentioned range, sensitivity can be maintained at a satisfactory level, and through-put becomes excellent.

As the component (D2"), one type of compound may be used alone, or two or more types may be used in combination.

The component (D2") is typically used in an amount within a range from 0.01 to 5.0 parts by weight, relative to 100 parts by weight of the component (A"). When the amount of the component (D) is within the above-mentioned range, the shape of the resist pattern and the post exposure stability of the latent image formed by the pattern-wise exposure of the resist layer are improved.

As the component (D"), one type of compound may be used, or two or more types of compounds may be used in combination.

When the resist composition of the present invention contains the component (D"), the amount of the component (D") relative to 100 parts by weight of the component (A") is preferably within a range from 0.1 to 15 parts by weight, more preferably from 0.3 to 12 parts by weight, and still more preferably from 0.5 to 12 parts by weight. When the amount of the component (D) is at least as large as the lower limit of the above-mentioned range, various lithography properties (such as LWR) of the resist composition are improved. Further, a resist pattern having an excellent shape can be obtained. On the other hand, when the amount of the component (D) is no more than the upper limit of the above-mentioned range, sensitivity can be maintained at a satisfactory level, and through-put becomes excellent.

<Optional Components>

[Component (E")]

In the present invention, in the resist composition, for preventing any deterioration in sensitivity, and improving the resist pattern shape and the post exposure stability of the latent image formed by the pattern-wise exposure of the resist layer, at least one compound (E") (hereafter referred to as the component (E")) selected from the group consisting of an organic carboxylic acid, or a phosphorus oxo acid or derivative thereof can be added.

The component (E") is the same as defined for the component (E") described in the first aspect.

As the component (E"), one type may be used alone, or two or more types may be used in combination.

The component (E") is typically used in an amount within a range from 0.01 to 5.0 parts by weight, relative to 100 parts by weight of the component (A").

[Component (F")]

In the present embodiment, the resist composition of the present invention may contain a fluorine additive (hereafter, referred to as "component (F")") for imparting water repellency to the resist film.

As the component (F"), one type may be used alone, or two or more types may be used in combination.

The component (F") is generally used in an amount within a range from 0.5 to 10 parts by weight, relative to 100 parts by weight of the component (A").

In the present invention, if desired, other miscible additives can also be added to the resist composition. Examples of such miscible additives include additive resins for improving the performance of the resist film, dissolution inhibitors, plasticizers, stabilizers, colorants, halation prevention agents, and dyes.

[Component (S")]

In the present invention, the resist composition can be prepared by dissolving the materials for the resist composition in an organic solvent (hereafter, frequently referred to as "component (S")").

The component (S") is the same as defined for the component (S) described in the first aspect.

The amount of the component (S") is not particularly limited, and is appropriately adjusted to a concentration which enables coating of a coating solution to a substrate In general, the organic solvent is used in an amount such that the solid content of the resist composition becomes within the range from 1 to 20% by weight, and preferably from 2 to 15% by weight.

119

<<Sixth Aspect: Method of Forming Resist Pattern>>

The method of forming a resist pattern according to a sixth aspect of the present invention includes: forming a resist film on a substrate using a resist composition according to the fifth aspect; conducting exposure of the resist film; and developing the resist film to form a resist pattern.

The explanation of the method of forming a resist pattern according to the sixth aspect is the same as the explanation of the method of forming a resist pattern according to the second aspect.

The resist composition according to the fifth aspect of the present invention exhibits excellent lithography properties. The reason for this is presumed as follows.

The resist composition according to the fifth aspect of the present invention has a structural unit (a0) having a bulky structure. Therefore, it is presumed that diffusion of acid can be well controlled. On the other hand, by including the structural unit (a0), it may be considered that the Tg (glass transition temperature) is high and the hydrophobicity tends to become higher, thereby decreasing the solubility in a developing solution. However, by including the structural unit (a9), it is presumed that a fine solubility in a developing solution could be achieved.

EXAMPLES

The present invention will be described more specifically with reference to the following examples, although the scope of the present invention is by no way limited by these examples.

<<First Aspect: Preparation of Resist Composition>>

Example 1

100 parts by weight of polymeric compound (A) (polymeric compound (A)-1 shown below/polymeric compound (A)-2 shown below=5/5), 15 parts by weight of compound (B)-1 shown below, 2.0 parts by weight of polymeric compound (D)-1 shown below, 1.56 parts by weight of salicylic acid and 4000 parts by weight of a solvent (a mixed solvent of PGMEA/PGME (weight ratio: 60/40)) were mixed together, so as to prepare a resist composition.

[Chemical Formula 71]

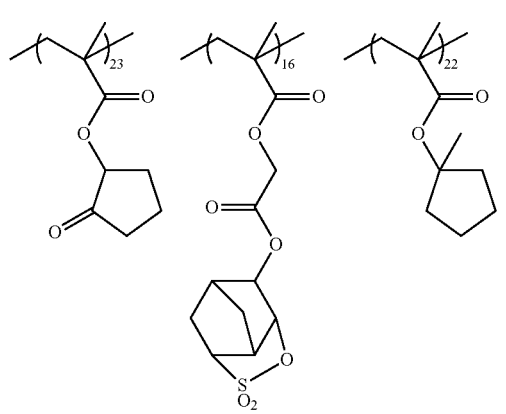

(A)-1

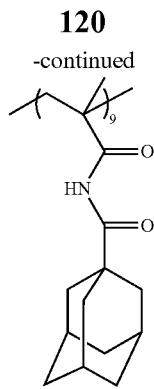

(A)-2

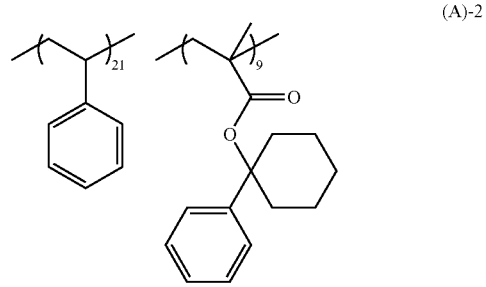

(B)-1

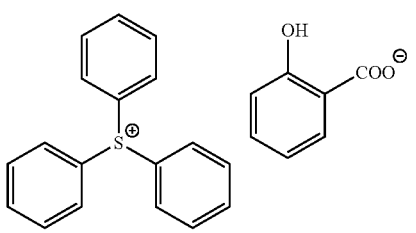

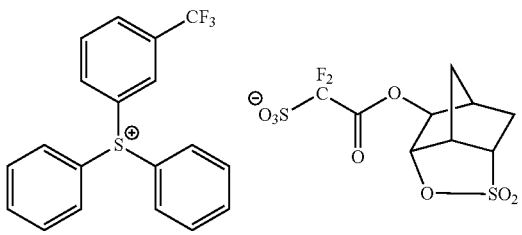

(D)-1

Comparative Example 1

A resist composition was prepared in the same manner as in Example 1, except that a compound (B)-2 shown below was used instead of compound (B)-1.

[Chemical Formula 72]

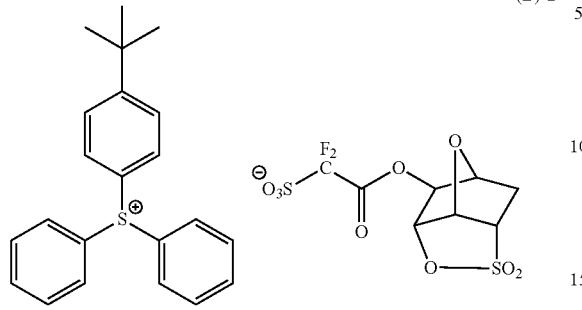

(B)-2

Example 2

100 parts by weight of polymeric compound (A') shown below (polymeric compound (A)-3 shown below/polymeric compound (A)-4 shown below=5/5), 15.23 parts by weight of above compound (B)-1, 4.70 parts by weight of above compound (D)-1 and 4000 parts by weight of a solvent (a mixed solvent of PGMEA/PGME (weight ratio: 60/40)), so as to prepare a resist composition.

[Chemical Formula 73]

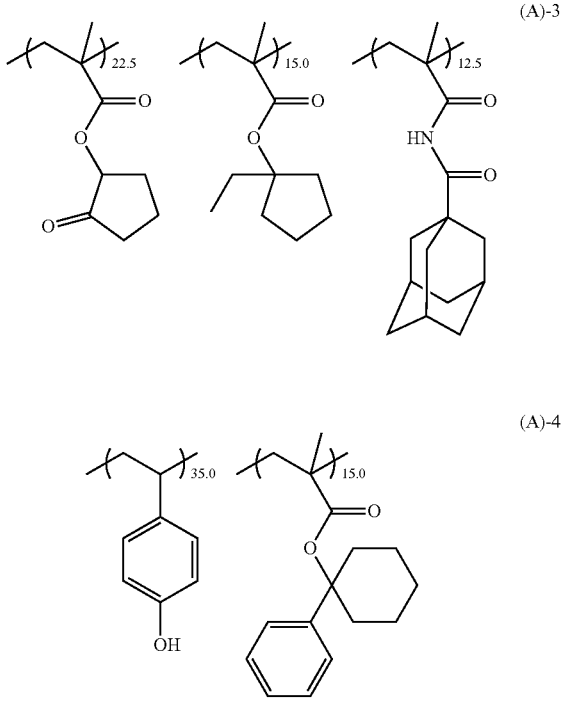

Comparative Example 2

A resist composition was prepared in the same manner as in Example 2, except that polymeric compound (A)-5 shown below was used instead of polymeric compound (A)-4.

[Chemical Formula 74]

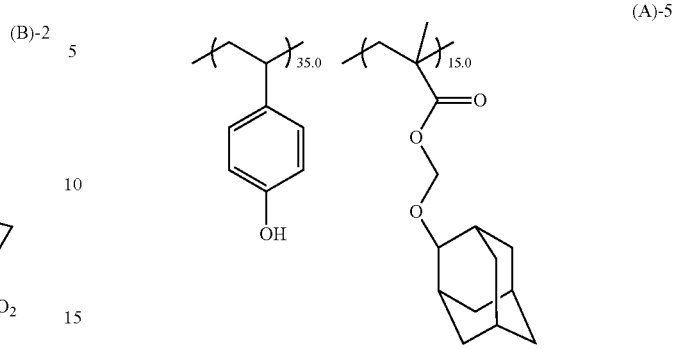

(A)-5

<<Second Aspect: Formation of Resist Pattern>>

Each of the resist compositions of Examples 1 to 14 and Comparative Examples 1 to 6 was applied to an 8-inch silicon substrate which had been treated with hexamethyldisilazane (HMDS) using a spinner, and was then prebaked (PAB) on a hot plate at 110° C. for 60 seconds and dried, thereby forming a resist film having a film thickness of 40 nm.

Subsequently, the resist film was subjected to drawing (exposure) using an electron beam lithography apparatus NXE3100 (manufactured by ASML; Dipole 75) at an acceleration voltage of 100 kV, targeting a 1:1 line and space pattern (hereafter, referred to as "LS pattern") having lines with a width of 50 to 26 nm.

Thereafter, alkali developing was conducted for 60 seconds at 23° C. in a 2.38% by weight aqueous solution of tetramethylammonium hydroxide (TMAH) (product name: NMD-3; manufactured by Tokyo Ohka Kogyo Co., Ltd.).

Thereafter, water rinsing was conducted for 60 seconds using pure water, followed by post exposure bake at 110° C. (PEB (° C.)) for 60 seconds.

As a result, a 1:1 line and space pattern (hereafter, referred to as "LS pattern") having a line width of 50 to 26 nm was formed.

[Evaluation of Line Edge Roughness (LER)]

With respect to each of the above LS patterns formed in the above "formation of resist pattern", the line width at 400 points in the lengthwise direction of the line were measured using a length measuring scanning electron microscope (SEM) (product name: S-9380, manufactured by Hitachi High-Technologies Corporation; acceleration voltage: 300V). From the results, the value of 3 times the standard deviation s (i.e., 3s) was determined, and the average of the 3s values at 400 points was calculated as a yardstick of LWR.

[Evaluation of Optimum Exposure Dose (Eop)]

The optimum exposure dose Eop (mJ/cm$^2$) with which the target resist pattern was formed in the above "formation of resist pattern" was determined. The results are indicated under "Eop (mJ/cm$^2$)" in Table 1.

TABLE 1

| | Eop (mJ/cm$^2$) | LWR (nm) |
|---|---|---|
| Example 1 | 16.1 | 6.9 |
| Comparative Example 1 | 25 | 6.5 |

TABLE 1-continued

|  | Eop (mJ/cm$^2$) | LWR (nm) |
|---|---|---|
| Example 2 | 28.5 | 3.4 |
| Comparative Example 2 | 33 | 3.6 |

As seen from the results shown above, the resist composition of the present invention exhibited high sensitivity, and good LWR.

[Third Aspect: Polymer Synthesis Example]

Polymers 1 to 15 having the structures shown in Tables 2 and 3 below were synthesized using the following monomers which derived the structural units constituting each polymeric compound with the molar ratios indicated in Tables 2 and 3 by a conventional method. With respect to monomers (1), (5) to (7) and (10), the Log P values are also indicated.

[Chemical Formula 75]

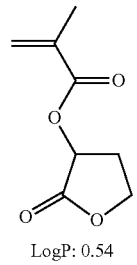

(1)

LogP: 0.54

TABLE 2

|  |  | Polymeric compound | | | | | | |
|---|---|---|---|---|---|---|---|---|
|  |  | 1 | 2 | 3 | 4 | 5 | 6 | 7 |
| Monomer | (1) | 9 |  |  |  |  | 2 | 9 |
|  | (2) | 6 | 3 | 6 | 6 | 6 | 3 |  |
|  | (3) | 5 |  | 5 | 5 | 5 | 2 | 5 |
|  | (4) |  | 7 |  |  |  | 4 |  |
|  | (5) |  |  | 9 |  |  |  |  |
|  | (6) |  |  |  | 9 |  |  |  |
|  | (7) |  |  |  |  | 9 |  |  |
|  | (8) |  |  |  |  |  |  | 6 |
|  | (9) |  |  |  |  |  |  |  |
|  | (10) |  |  |  |  |  |  |  |
|  | (11) |  |  |  |  |  |  |  |
|  | (12) |  |  |  |  |  |  |  |
| Mw |  | 7000 | 6000 | 7000 | 7000 | 7000 | 6000 | 7000 |
| Mw/Mn |  | 1.6 | 1.5 | 1.6 | 1.5 | 1.4 | 1.5 | 1.5 |

TABLE 3

|  |  | Polymeric compound | | | | | | |
|---|---|---|---|---|---|---|---|---|
|  |  | 8 | 9 | 10 | 11 | 12 | 13 | 14 |
| Monomer | (1) |  | 9 |  | 9 |  | 9 |  |
|  | (2) |  |  |  | 6 | 6 |  |  |
|  | (3) |  | 5 |  |  | 5 | 5 |  |
|  | (4) | 7 |  | 7 |  |  |  | 7 |
|  | (5) |  |  |  |  |  |  |  |
|  | (6) |  |  |  |  |  |  |  |
|  | (7) |  |  |  |  |  |  |  |
|  | (8) | 3 |  |  |  |  |  |  |
|  | (9) |  | 6 | 3 |  |  |  |  |
|  | (10) |  |  |  |  | 9 |  |  |
|  | (11) |  |  |  | 5 |  |  |  |
|  | (12) |  |  |  |  |  | 6 | 3 |
| Mw |  | 6000 | 7000 | 6000 | 7000 | 7000 | 7000 | 6000 |
| Mw/Mn |  | 1.5 | 1.5 | 1.4 | 1.5 | 1.6 | 1.6 | 1.4 |

(2)
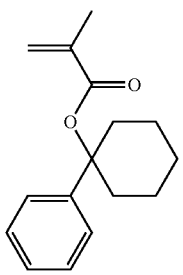
(3)
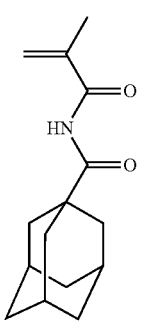
(4)
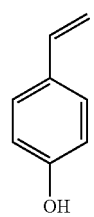
(5)
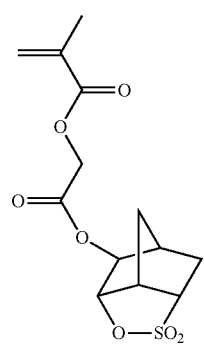
LogP: 0.12
(6)
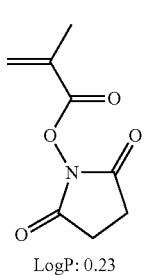
LogP: 0.23
(7)
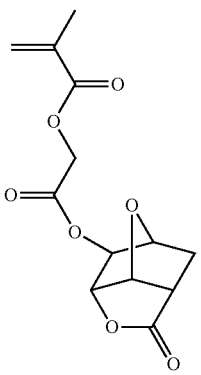
LogP: 0.49
(8)
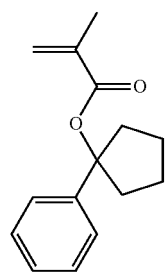
(9)
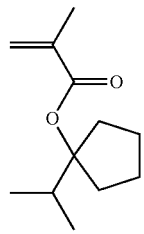
(10)
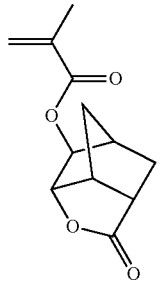
LogP: 1.24
(11)
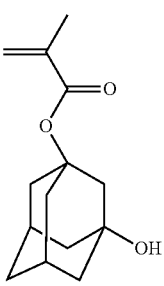

-continued (12)

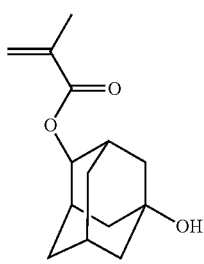

<<Third Aspect: Preparation of Resist Composition>>
The components shown in Tables 4 to 6 were mixed together and dissolved to obtain resist compositions.

TABLE 4

|  | Component (A') | Component (B') | Component (D') | Component (S') |
| --- | --- | --- | --- | --- |
| Ex. 3 | (A)-1/(A')-2 = 5/5 [100] | (B')-1 [20] | (0)-1 [1.54] | (S')-1 [6000] |
| Ex. 4 | (A)-1/(A')-2 = 5/5 [100] | (B')-1 [20] | (0)-1 [2.31] | (S')-1 [6000] |
| Ex. 5 | (A)-1/(A')-2 = 5/5 [100] | (B')-1 [20] | (0)-1 [3.08] | (S')-1 [6000] |
| Ex. 6 | (A')-3/(A')-2 = 5/5 [100] | (B')-1 [20] | (0)-1 [2.31] | (S')-1 [6000] |
| Ex. 7 | (A')-4/(A')-2 = 5/5 [100] | (B')-1 [20] | (0)-1 [2.31] | (S')-1 [6000] |
| Ex. 8 | (A')-5/(A')-2 = 5/5 [100] | (B')-1 [20] | (0)-1 [2.31] | (S')-1 [6000] |
| Ex. 9 | (A)-1/(A')-2 = 5/5 [100] | (B')-1 [20] | (0)-14 [2.31] | (S')-1 [6000] |
| Ex. 10 | (A)-1/(A')-2 = 5/5 [100] | (B')-1 [20] | (D')-2 [2.31] | (S')-1 [6000] |
| Ex. 11 | (A)-1/(A')-2 = 5/5 [100] | (B')-1 [20] | (D')-3 [2.31] | (S')-1 [6000] |
| Ex. 12 | (A')-6 [100] | (B')-1 [20] | (0)-1 [2.31] | (S')-1 [6000] |
| Ex. 13 | (A)-1 [100] | (B')-1 [20] | (0)-1 [2.31] | (S')-1 [6000] |
| Ex. 14 | (A')-7/(A')-8 = 5/5 [100] | (B')-1 [20] | (0)-1 [2.31] | (S')-1 [6000] |
| Ex. 15 | (A')-9/(A')-2 = 5/5 [100] | (B')-1 [20] | (0)-1 [2.31] | (S')-1 [6000] |
| Ex. 16 | (A)-1/(A)-10 = 5/5 [100] | (B')-1 [20] | (0)-1 [2.31] | (S')-1 [6000] |

TABLE 5

|  | Component (A') | Component (B') | Component (D') | Component (S') |
| --- | --- | --- | --- | --- |
| Ex. 17 | (A')-11/(A)-10 = 5/5 [100] | (B')-1 [20] | (0)-1 [2.31] | (S')-1 [6000] |
| Ex. 18 | (A')-11/(A)-10 = 5/5 [100] | (B')-2 [20] | (0)-1 [2.31] | (S')-1 [6000] |
| Ex. 19 | (A')-1/(A')-2 = 5/5 [100] | (B')-3 [20] | (0)-1 [2.31] | (S')-1 [6000] |
| Ex. 20 | (A')-1/(A')-2 = 5/5 [100] | (B')-4 [20] | (0)-1 [2.31] | (S')-1 [6000] |
| Ex. 21 | (A')-1/(A')-2 = 5/5 [100] | (B')-1 [20] | (D')-4 [2.31] | (S')-1 [6000] |
| Ex. 22 | (A')-1/(A')-2 = 5/5 [100] | (B')-1 [20] | (D')-5 [2.31] | (S')-1 [6000] |
| Ex. 23 | (A')-1/(A')-2 = 5/5 [100] | (B')-1 [20] | (D')-6 [2.31] | (S')-1 [6000] |
| Ex. 24 | (A')-1/(A')-2 = 5/5 [100] | (B')-1 [20] | (D')-7 [2.31] | (S')-1 [6000] |
| Ex. 25 | (A)-1/(A)-2 = 5/5 [100] | (B')-1 [20] | (D')-8 [2.31] | (S')-1 [6000] |
| Ex. 26 | (A')-1/(A')-2 = 5/5 [100] | (B')-1 [20] | (D')-9 [2.31] | (S')-1 [6000] |

TABLE 5-continued

|  | Component (A') | Component (B') | Component (D') | Component (S') |
| --- | --- | --- | --- | --- |
| Ex. 27 | (A')-1/(A')-2 = 5/5 [100] | (B')-1 [20] | (0)-10 [2.31] | (S')-1 [6000] |

TABLE 6

|  | Component (A') | Component (B') | Component (D') | Component (S') |
| --- | --- | --- | --- | --- |
| Comp. Ex. 3 | (A)-1/(A')-2 = 5/5 [100] | (B')-1 [20] | (D')-11 [2.00] | (S')-1 [6000] |
| Comp. Ex. 4 | (A)-1/(A')-2 = 5/5 [100] | (B')-1 [20] | (D')-12 [2.31] | (S')-1 [6000] |
| Comp. Ex. 5 | (A)-1/(A')-2 = 5/5 [100] | (B')-1 [20] | (D')-13 [2.31] | (S')-1 [6000] |
| Comp. Ex. 6 | (A')-12/(A')-2 = 5/5 [100] | (B')-1 [20] | (D')-1 [2.31] | (S')-1 [6000] |
| Comp. Ex. 7 | (A)-13/(A)-14 = 5/5 [100] | (B')-1 [20] | (D')-1 [2.31] | (S')-1 [6000] |
| Comp. Ex. 8 | (A)-9/(A)-10 = 5/5 [100] | (B')-1 [20] | (D')-1 [2.31] | (S')-1 [6000] |

In the above tables, the reference characters indicate the following. Further, the values in brackets [ ] indicate the amount (in terms of parts by weight) of the component added.
(A')-1 to (A')-14: the aforementioned polymeric compounds 1 to 14
(B')-1 to (B')-4: compounds (B')-1 to (B')-4 shown below
(D')-1 to 10, 12 to 14: compounds (D')-1 to 10, 12 to 14 shown below
(D')-11: tri-n-octylamine.
(S')-1: a mixed solvent of PGMEA/PGME=60/40 (weight ratio)

[Chemical Formula 76]

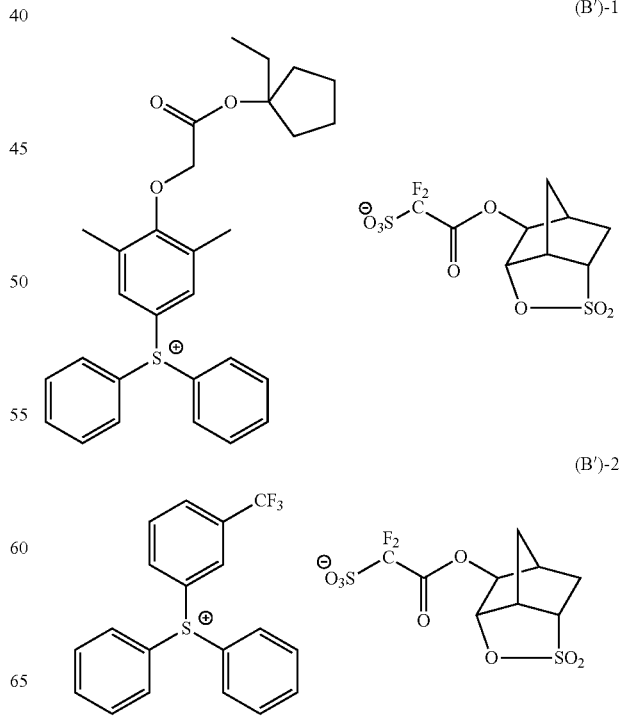

(B')-3
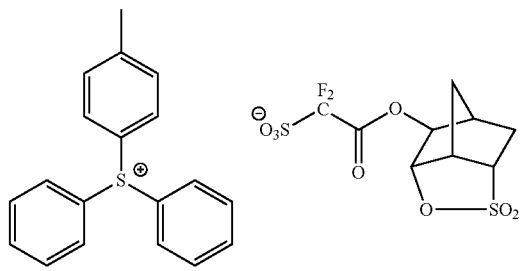
(D')-3
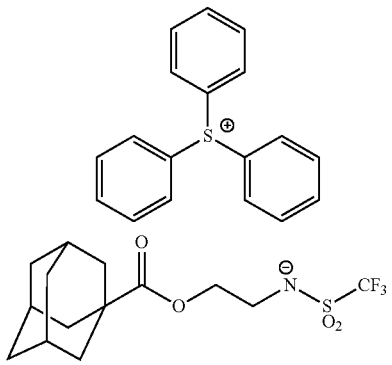
pka: 5.58
(B')-4
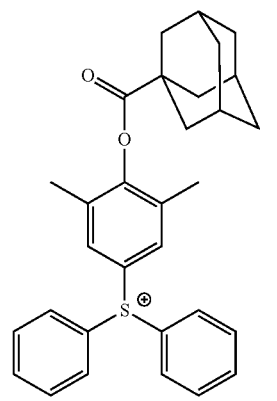 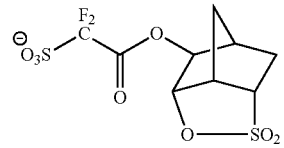
[Chemical Formula 77]
(D')-4
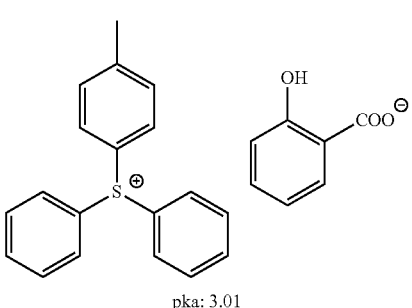
pka: 3.01
[Chemical Formula 78]
(D')-1
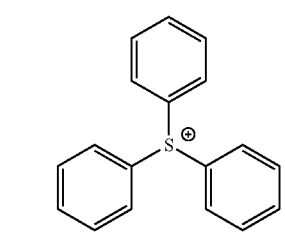
pka: 3.01
(D')-5
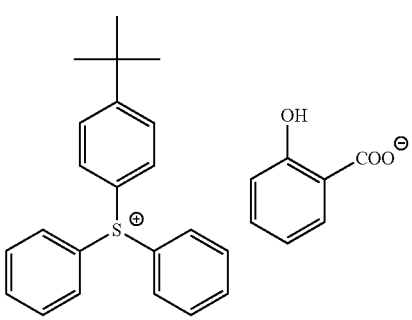
pka: 3.01
(D')-2
pka: 4.68
(D')-6
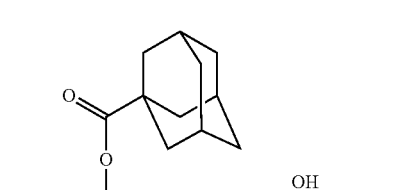
pka: 3.01

-continued

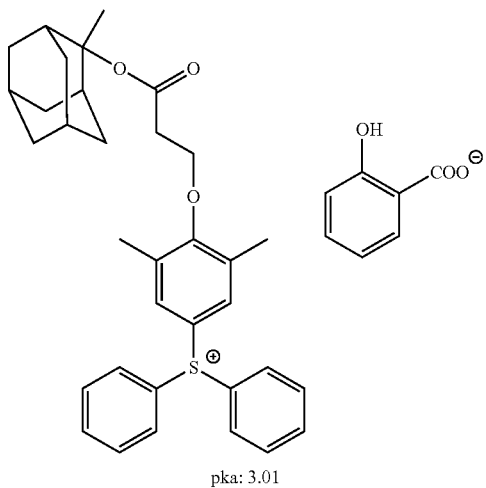
(D')-7
pka: 3.01

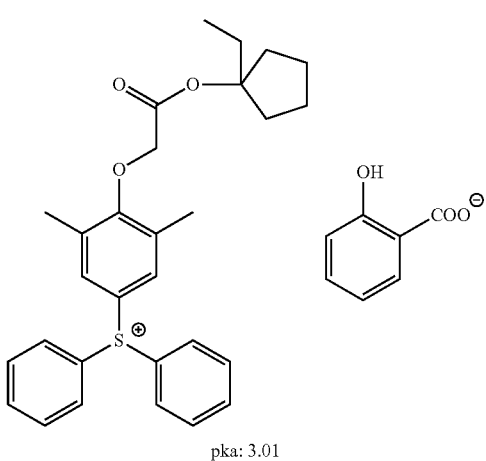
(D')-8
pka: 3.01

[Chemical Formula 79]

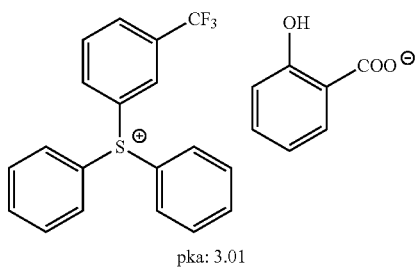
(D')-9
pka: 3.01

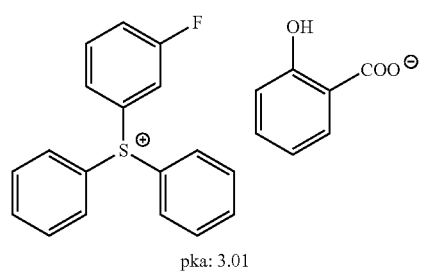
(D')-10
pka: 3.01

-continued

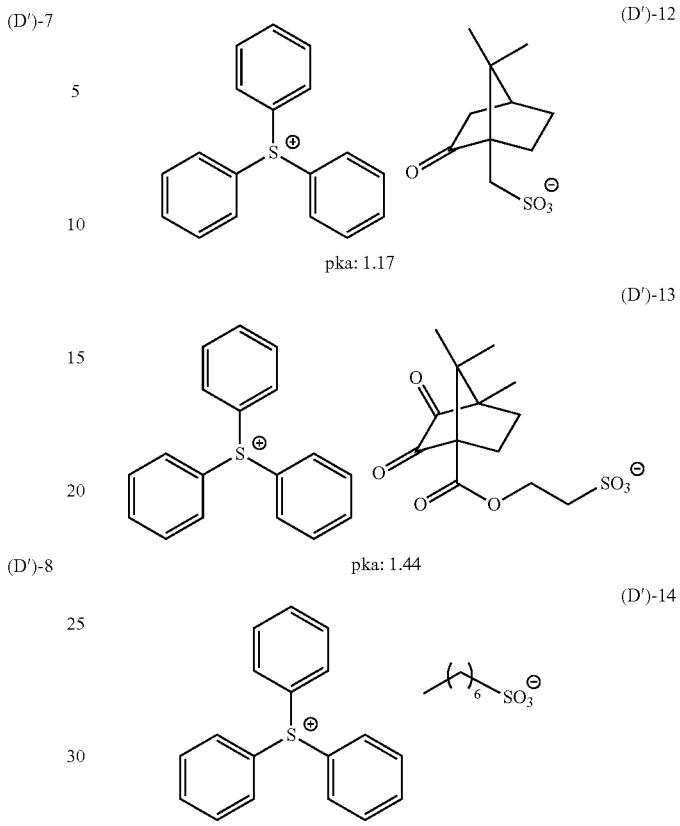
(D')-12
pka: 1.17

(D')-13
pka: 1.44

(D')-14
pka: 1.89

<Fourth Aspect: Formation of Resist Pattern>

Each of the resist compositions of Examples 3 to 27 and Comparative Examples 3 to 8 was applied to an 8-inch silicon substrate which had been treated with hexamethyldisilazane (HMDS) using a spinner, and was then prebaked (PAB) on a hot plate at 100° C. for 60 seconds and dried, thereby forming a resist film having a film thickness of 30 nm.

Subsequently, the resist film was subjected to drawing (exposure) using an electron beam lithography apparatus JEOL-JBX-9300FS (manufactured by JEOL Ltd.) at an acceleration voltage of 100 kV, targeting a 1:1 line and space pattern (hereafter, referred to as "LS pattern") having lines with a width of 50 to 26 nm.

Thereafter, alkali developing was conducted for 60 seconds at 23° C. in a 2.38% by weight aqueous solution of tetramethylammonium hydroxide (TMAH) (product name: NMD-3; manufactured by Tokyo Ohka Kogyo Co., Ltd.).

Thereafter, water rinsing was conducted for 60 seconds using pure water, followed by post exposure bake at 110° C. (PEB (° C.)) for 60 seconds.

As a result, a 1:1 line and space pattern (hereafter, referred to as "LS pattern") having a line width of 50 to 26 nm was formed.

[Evaluation of Optimum Exposure Dose (Eop)]

The optimum exposure dose Eop ($\mu C/cm^2$) with which the LS pattern was formed in the above formation of resist pattern was determined. The results are indicated under "Sensitivity ($\mu C/cm^2$)" in Tables 7 to 9.

[Evaluation of Resolution]

The critical resolution (nm) with the above Eop was determined using a scanning electron microscope (product name: S-9380, manufactured by Hitachi High-Technologies Corporation). Specifically, the exposure dose was gradually increased from the optimum exposure dose Eop, and the minimum size of the pattern which resolves without collapse was determined.

The results are indicated under "resolution (nm)" in Tables 7 to 9.

[Evaluation of Line Edge Roughness (LER)]

With respect to the LS pattern formed in the above "formation of resist pattern", 3σ was determined as a yardstick for indicating LER.

"3σ" indicates a value of 3 times the standard deviation (σ) (i.e., 3σ) (unit: nm) determined by measuring the line positions at 400 points in the lengthwise direction of the line using a scanning electron microscope (product name: S-9380, manufactured by Hitachi High-Technologies Corporation; acceleration voltage: 800V).

The smaller this 3σ value is, the lower the level of roughness on the side walls of the line, indicating that an LS pattern with a uniform width was obtained. The results are indicated under "LER (nm)" in Tables 7 to 9.

[Evaluation of Shape]

The state of the LS pattern formed in the above "formation of resist pattern" was evaluated in accordance with the following criteria. The results are indicated under "Shape" in Tables 7 to 9.

(Criteria)

A: High resolution LS pattern formed over the entire substrate

B: Line portion partially broken, and poor resolution observed

TABLE 7

| | PAB [° C.] | PEB [° C.] | Eop [uC/cm²] | Resolution performance [nm] | LWR (nm) | Shape |
|---|---|---|---|---|---|---|
| Ex. 3 | 110 | 110 | 45 | 32 | 5.5 | A |
| Ex. 4 | 110 | 110 | 60 | 28 | 4.5 | A |
| Ex. 5 | 110 | 110 | 80 | 26 | 3.5 | A |
| Ex. 6 | 110 | 110 | 67 | 28 | 4.2 | A |
| Ex. 7 | 110 | 110 | 58 | 28 | 4.3 | A |
| Ex. 8 | 110 | 110 | 60 | 28 | 4.4 | A |
| Ex. 9 | 110 | 110 | 56 | 30 | 4.2 | A |
| Ex. 10 | 110 | 110 | 62 | 30 | 3.7 | A |
| Ex. 11 | 110 | 110 | 70 | 28 | 3.7 | A |
| Ex. 12 | 110 | 110 | 62 | 28 | 4.6 | A |
| Ex. 13 | 110 | 110 | 65 | 30 | 4.2 | A |
| Ex. 14 | 110 | 110 | 60 | 28 | 4.5 | A |
| Ex. 15 | 110 | 110 | 58 | 26 | 4.2 | A |
| Ex. 16 | 110 | 110 | 58 | 28 | 4.1 | A |

TABLE 8

| | PAB [° C.] | PEB [° C.] | Eop [uC/cm²] | Resolution performance [nm] | LWR (nm) | Shape |
|---|---|---|---|---|---|---|
| Ex. 17 | 110 | 110 | 60 | 28 | 4.6 | A |
| Ex. 18 | 110 | 110 | 55 | 28 | 4.2 | A |
| Ex. 19 | 110 | 110 | 58 | 28 | 4.1 | A |
| Ex. 20 | 110 | 110 | 67 | 28 | 3.9 | A |
| Ex. 21 | 110 | 110 | 58 | 28 | 4.1 | A |
| Ex. 22 | 110 | 110 | 67 | 28 | 3.8 | A |
| Ex. 23 | 110 | 110 | 65 | 28 | 3.7 | A |
| Ex. 24 | 110 | 110 | 63 | 28 | 3.9 | A |
| Ex. 25 | 110 | 110 | 60 | 28 | 4.0 | A |
| Ex. 26 | 110 | 110 | 56 | 24 | 4.0 | A |
| Ex. 27 | 110 | 110 | 58 | 26 | 3.9 | A |

TABLE 9

| | PAB [° C.] | PEB [° C.] | Eop [uC/cm²] | Resolution performance [nm] | LWR (nm) | Shape |
|---|---|---|---|---|---|---|
| Comp. Ex. 3 | 110 | 110 | 65 | 32 | 7.5 | B |
| Comp. Ex. 4 | 110 | 110 | >30 | 50 | 4.0 | B |
| Comp. Ex. 5 | 110 | 110 | 45 | 50 | 7.4 | B |
| Comp. Ex. 6 | 110 | 110 | 55 | 45 | 5.5 | B |
| Comp. Ex. 7 | 110 | 110 | 60 | 30 | 5.6 | B |
| Comp. Ex. 8 | 110 | 110 | 60 | 32 | 4.0 | B |

As seen from the results shown above, the resist composition of the present invention exhibited good lithography properties.

[Fifth Aspect: Polymer Synthesis Example]

Polymers 15 to 30 having the structures shown in Tables 10 to 12 below were synthesized using the following monomers which derived the structural units constituting each polymeric compound with the molar ratios indicated in Tables 10 to 12 by a conventional method.

TABLE 10

| | | Polymeric compound | | | | |
|---|---|---|---|---|---|---|
| | | 15 | 16 | 17 | 18 | 19 |
| Monomer | (13) | | 3 | | | |
| | (14) | | | | | |
| | (15) | | | | | |
| | (16) | 6 | | 6 | 6 | 6 |
| | (17) | | | | | |
| | (18) | 5 | | 5 | | |
| | (19) | | | | 5 | |
| | (20) | | | | | 5 |
| | (21) | 9 | | | 9 | 9 |
| | (22) | | | 9 | | |
| | (23) | | 7 | | | |
| | (24) | | | | | |
| Mw | | 6000 | 6000 | 6000 | 6000 | 7000 |
| Mw/Mn | | 1.5 | 1.4 | 1.4 | 1.4 | 1.6 |

TABLE 11

| | | Polymeric compound | | | | | |
|---|---|---|---|---|---|---|---|
| | | 20 | 21 | 22 | 23 | 24 | 25 |
| Monomer | (13) | | | | 6 | 15 | |
| | (14) | 3 | | | | | |
| | (15) | | 6 | | | | |
| | (16) | | | | | 15 | 6 |
| | (17) | | | 6 | | | |
| | (18) | | 5 | 5 | 5 | 25 | |
| | (19) | | | | | | |
| | (20) | | | | | | 5 |
| | (21) | | 9 | 9 | 9 | 45 | 9 |
| | (22) | | | | | | |
| | (23) | 7 | | | | | |
| | (24) | | | | | | |
| Mw | | 6000 | 7000 | 6000 | 6000 | 7000 | 6000 |
| Mw/Mn | | 1.4 | 1.5 | 1.5 | 1.5 | 1.5 | 1.6 |

TABLE 12
|  |  | Polymeric compound | | | |
|---|---|---|---|---|---|
|  |  | 26 | 27 | 28 | 29 |
| Monomer | (13) |  | 6 |  |  |
|  | (14) |  |  |  |  |
|  | (15) |  |  |  |  |
|  | (16) | 6 |  |  | 3 |
|  | (17) |  |  | 3 |  |
|  | (18) |  |  |  |  |
|  | (19) |  |  |  |  |
|  | (20) |  |  |  |  |
|  | (21) | 9 | 9 |  |  |
|  | (22) |  |  |  |  |
|  | (23) |  |  | 7 | 7 |
|  | (24) | 5 | 5 |  |  |
| Mw |  | 6000 | 6000 | 6000 | 6000 |
| Mw/Mn |  | 1.5 | 1.4 | 1.4 | 1.6 |
[Chemical Formula 80]
(13)
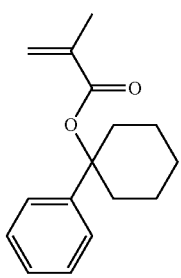
(14)
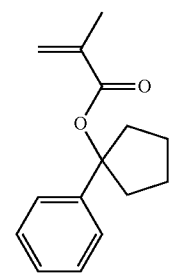
(15)
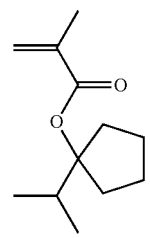
(16)
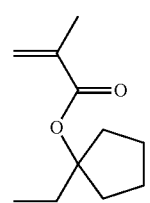
(17)
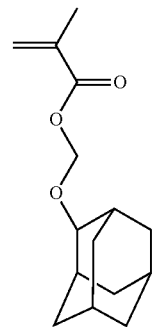
(18)
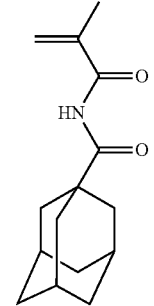
(19)
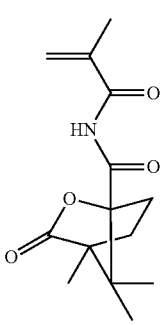
(20)
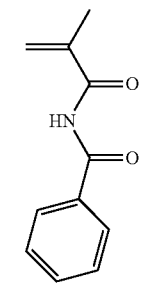
(21)
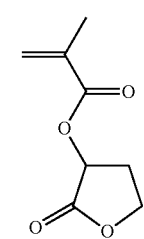

(22)

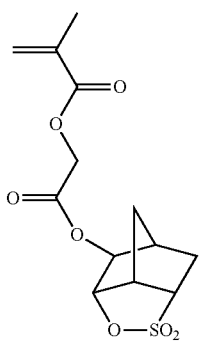

(23)

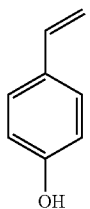

(24)

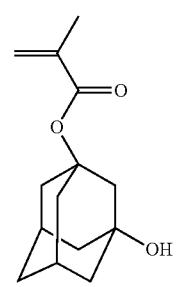

<<Fifth Aspect: Preparation of Resist Composition>>

The components shown in Tables 13 and 14 were mixed together and dissolved to obtain resist compositions.

TABLE 13

|  | Component (A") | Component (B") | Component (D") | Component (E") | Component (S") |
|---|---|---|---|---|---|
| Ex. 28 | (A")-1/(A")-2 = 5/5 [100] | (B")-1 [14] | (D")-1 [1.5] | (E")-1 [0.64] | (S")-1 [9500] |
| Ex. 29 | (A")-3/(A")-2 = 5/5 [100] | (B")-1 [14] | (D")-1 [1.5] | (E")-1 [0.64] | (S")-1 [9500] |
| Ex. 30 | (A")-4/(A")-2 = 5/5 [100] | (B")-1 [14] | (D")-1 [1.5] | (E")-1 [0.64] | (S")-1 [9500] |
| Ex. 31 | (A")-5/(A")-2 = 5/5 [100] | (B")-1 [14] | (D")-1 [1.5] | (E")-1 [0.64] | (S")-1 [9500] |
| Ex. 32 | (A")-1/(A")-6 = 5/5 [100] | (B")-1 [14] | (D")-1 [1.5] | (E")-1 [0.64] | (S")-1 [9500] |
| Ex. 33 | (A")-4/(A")-6 = 5/5 [100] | (B")-1 [14] | (D")-1 [1.5] | (E")-1 [0.64] | (S")-1 [9500] |
| Ex. 34 | (A")-5/(A")-6 = 5/5 [100] | (B")-1 [14] | (D")-1 [1.5] | (E")-1 [0.64] | (S")-1 [9500] |
| Ex. 35 | (A")-7/(A")-2 = 5/5 [100] | (B")-1 [14] | (D")-1 [1.5] | (E")-1 [0.64] | (S")-1 [9500] |
| Ex. 36 | (A")-8/(A")-2 = 5/5 [100] | (B")-1 [14] | (D")-1 [1.5] | (E")-1 [0.64] | (S")-1 [9500] |
| Ex. 37 | (A")-9/(A")-14 = 5/5 [100] | (B")-1 [14] | (D")-1 [1.5] | (E")-1 [0.64] | (S")-1 [9500] |
| Ex. 38 | (A)-10 [100] | (B")-1 [14] | (D")-1 [1.5] | (E")-1 [0.64] | (S")-1 [9500] |
| Ex. 39 | (A")-1/(A")-2 = 5/5 [100] | (B")-2 [18.3] | (D")-1 [1.5] | (E")-1 [0.64] | (S")-1 [9600] |
| Ex. 40 | (A)-1/(A)-2 = 5/5 [100] | (B")-3 [18.1] | (D")-1 [1.5] | (E")-1 [0.64] | (S")-1 [9600] |
| Ex. 41 | (A")-1/(A")-2 = 5/5 [100] | (B")-1 [14] | (D")-3 [2.3] | — | (S")-1 [9500] |

TABLE 14

|  | Component (A") | Component (B") | Component (D") | Component (E") | Component (S") |
|---|---|---|---|---|---|
| Comp. Ex. 9 | (A")-12/(A")-2 = 5/5 [100] | (B")-1 [14] | (D")-1 [1.5] | (E")-1 [0.64] | (S")-1 [9500] |
| Comp. Ex. 10 | (A")-13/(A")-14 = 5/5 [100] | (B")-1 [14] | (D")-1 [1.5] | (E")-1 [0.64] | (S")-1 [9500] |
| Comp. Ex. 11 | (A")-12/(A")-6 = 5/5 [100] | (B")-1 [14] | (D")-1 [1.5] | (E")-1 [0.64] | (S")-1 [9500] |
| Comp. Ex. 12 | (A")-1/(A")-15 = 5/5 [100] | (B")-1 [14] | (D")-1 [1.5] | (E")-1 [0.64] | (S")-1 [9500] |

TABLE 14-continued

| | Component (A") | Component (B") | Component (D") | Component (E") | Component (S") |
|---|---|---|---|---|---|
| Comp. Ex. 13 | (A")-4/(A")-15 = 5/5 [100] | (B")-1 [14] | (D")-1 [1.5] | (E")-1 [0.64] | (S")-1 [9500] |
| Comp. Ex. 14 | (A")-11/(A")-15 = 5/5 [100] | (B")-1 [14] | (D")-1 [1.5] | (E")-1 [0.64] | (S")-1 [9500] |

In the above tables, the reference characters indicate the following. Further, the values in brackets [ ] indicate the amount (in terms of parts by weight) of the component added.

(A")-1 to (A")-16: the aforementioned polymeric compounds 15 to 30

(B")-1 to (B")-4: compounds (B")-1 to (B")-4 shown below (D")-1: tri-n-octylamine.

(E")-1: salicylic acid (S")-1: a mixed solvent of PGMEA/PGME=60/40 (weight ratio)

[Chemical Formula 81]

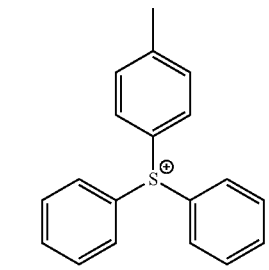

(B")-1

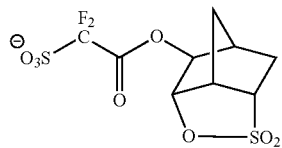

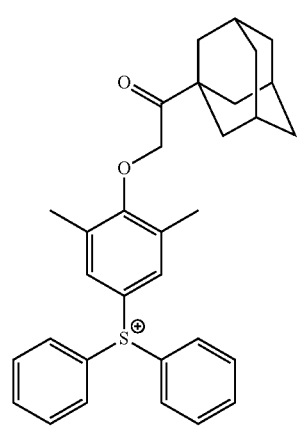

(B")-2

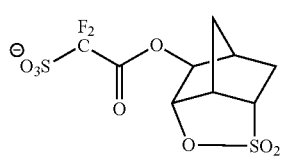

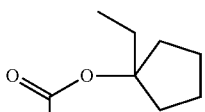

(B")-3

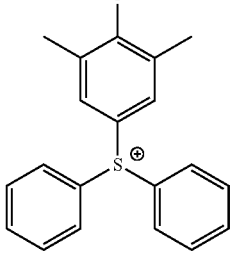

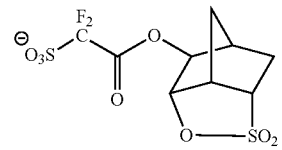

(B")-4

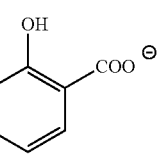

<Sixth Aspect: Formation of Resist Pattern>

Each of the resist compositions of Examples 28 to 41 and Comparative Examples 9 to 14 was applied to an 8-inch silicon substrate which had been treated with hexamethyldisilazane (HMDS) using a spinner, and was then prebaked (PAB) on a hot plate at 100° C. for 60 seconds and dried, thereby forming a resist film having a film thickness of 30 nm.

Subsequently, the resist film was subjected to drawing (exposure) using an electron beam lithography apparatus JEOL-JBX-9300FS (manufactured by JEOL Ltd.) at an acceleration voltage of 100 kV, targeting a 1:1 line and space pattern (hereafter, referred to as "LS pattern") having lines with a width of 50 to 26 nm.

Thereafter, alkali developing was conducted for 60 seconds at 23° C. in a 2.38% by weight aqueous solution of tetramethylammonium hydroxide (TMAH) (product name: NMD-3; manufactured by Tokyo Ohka Kogyo Co., Ltd.).

Thereafter, water rinsing was conducted for 60 seconds using pure water, followed by post exposure bake at 110° C. (PEB (° C.)) for 60 seconds.

As a result, a 1:1 line and space pattern (hereafter, referred to as "LS pattern") having a line width of 50 to 26 nm was formed.

[Evaluation of Optimum Exposure Dose (Eop)]

The optimum exposure dose Eop ($\mu C/cm^2$) with which the LS pattern was formed in the above formation of resist pattern was determined. The results are indicated under "Sensitivity (μC/cm²)" in Tables 15 and 16.

[Evaluation of Resolution]

The critical resolution (nm) with the above Eop was determined using a scanning electron microscope (product name: S-9380, manufactured by Hitachi High-Technologies Corporation). Specifically, the exposure dose was gradually increased from the optimum exposure dose Eop, and the minimum size of the pattern which resolves without collapse was determined.

The results are indicated under "resolution (nm)" in Tables 15 and 16.

[Evaluation of Line Edge Roughness (LER)]

With respect to the LS pattern formed in the above "formation of resist pattern", 3σ was determined as a yardstick for indicating LER.

"3σ" indicates a value of 3 times the standard deviation (σ) (i.e., 3σ) (unit: nm) determined by measuring the line positions at 400 points in the lengthwise direction of the line using a scanning electron microscope (product name: S-9380, manufactured by Hitachi High-Technologies Corporation; acceleration voltage: 800V).

The smaller this 3σ value is, the lower the level of roughness on the side walls of the line, indicating that an LS pattern with a uniform width was obtained. The results are indicated under "LER (nm)" in Tables 15 and 16.

[Evaluation of Shape]

The state of the LS pattern formed in the above "formation of resist pattern" was evaluated in accordance with the following criteria. The results are indicated under "Shape" in Tables 15 and 16.

(Criteria)

A: High resolution LS pattern formed over the entire substrate

B: Line portion partially broken, and poor resolution observed

TABLE 15

| | PAB [° C.] | PEB [° C.] | Eop [uC/cm²] | Resolution performance [nm] | LWR (nm) | Shape |
|---|---|---|---|---|---|---|
| Ex. 28 | 110 | 110 | 62 | 32 | 4.7 | A |
| Ex. 29 | 110 | 110 | 64 | 34 | 5.5 | A |
| Ex. 30 | 110 | 110 | 52 | 32 | 5.5 | A |
| Ex. 31 | 110 | 110 | 61 | 34 | 4.9 | A |
| Ex. 32 | 110 | 110 | 60 | 30 | 4.8 | A |
| Ex. 33 | 110 | 110 | 50 | 32 | 5.3 | A |
| Ex. 34 | 110 | 110 | 58 | 32 | 5.3 | A |
| Ex. 35 | 110 | 110 | 63 | 32 | 4.7 | A |
| Ex. 36 | 110 | 110 | 72 | 36 | 6.1 | A |
| Ex. 37 | 110 | 110 | 68 | 36 | 5.9 | A |
| Ex. 38 | 110 | 110 | 70 | 32 | 6.4 | A |
| Ex. 39 | 110 | 110 | 88 | 34 | 5.9 | A |
| Ex. 40 | 110 | 110 | 65 | 32 | 5.8 | A |
| Ex. 41 | 110 | 110 | 68 | 30 | 4 | A |

TABLE 16

| | PAB [° C.] | PEB [° C.] | Eop [uC/cm²] | Resolution performance [nm] | LWR (nm) | Shape |
|---|---|---|---|---|---|---|
| Comp. Ex. 9 | 110 | 110 | 61 | 38 | 7.5 | B |
| Comp. Ex. 10 | 110 | 110 | 70 | 38 | 8.8 | B |
| Comp. Ex. 11 | 110 | 110 | 58 | 36 | 7.3 | B |
| Comp. Ex. 12 | 110 | 110 | 60 | 45 | 8.9 | B |
| Comp. Ex. 13 | 110 | 110 | 57 | 45 | 8.5 | B |
| Comp. Ex. 14 | 110 | 110 | 61 | 42 | 8.5 | B |

As seen from the results shown above, the resist composition of the present invention exhibited good lithography properties.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A resist composition which generates acid upon exposure and exhibits changed solubility in a developing solution under action of acid, the resist composition comprising a base component (A) which exhibits changed solubility in a developing solution under action of acid and an acid generator (B) which generates acid upon exposure, the base component (A) comprising a resin component comprising a structural unit (a0) represented by general formula (a0-1) shown below, and the acid generator component (B) comprising a compound represented by general formula (b-1), (b-2) or (b-3), having a cation moiety having an electron withdrawing group:

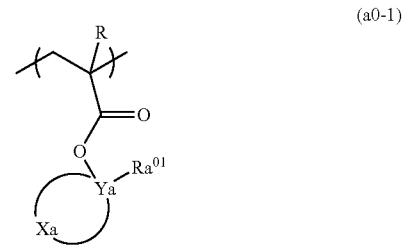

(a0-1)

wherein R represents a hydrogen atom, an alkyl group of 1 to 5 carbon atoms or a halogenated alkyl group of 1 to 5 carbon atoms; Ya represents a carbon atom; Xa represents an atomic group required to form an alicyclic hydrocarbon group with Ya; and $Ra^{01}$ represents an aromatic hydrocarbon group optionally having a substituent,

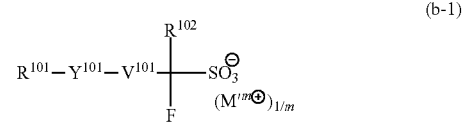

(b-1)

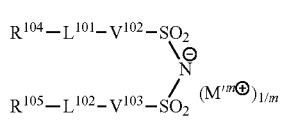  (b-2)

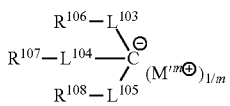  (b-3)

wherein, $R^{101}$ and $R^{104}$ to $R^{108}$ each independently represents a cyclic group which may have a substituent, a chain-like alkyl group which may have a substituent or a chain-like alkenyl group which may have a substituent, provided that $R^{104}$ and $R^{105}$ may be mutually bonded to form a ring; $R^{106}$ and $R^{107}$ may be mutually bonded to form a ring; $R^{102}$ represents a fluorine atom or a fluorinated alkyl group of 1 to 5 carbon atoms; $Y^{101}$ represents a divalent linking group containing an oxygen atom; $V^{101}$ to $V^{103}$ each independently represents a single bond, an alkylene group or a fluorinated alkylene group; $L^{101}$ and $L^{102}$ each independently represents a single bond or an oxygen atom; $L^{103}$ to $L^{105}$ each independently represents a single bond, —CO— or —SO$_2$—; and $M'^{m+}$ represents an organic cation having a valency of m and a cation moiety having an electron withdrawing group, wherein the cation moiety having an electron withdrawing group is represented by formula (ca-1), (ca-1-1), (ca-3) or (ca-4):

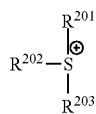  (ca-1)

in formula (ca-1), $R^{202}$ and $R^{203}$ each independently represents an aryl group, alkyl group or alkenyl group which may have a substituent, and are mutually bonded directly or via a hetero atom, an oxygen atom or a nitrogen atom, a carbonyl group, —SO—, —SO$_2$—, —SO$_3$—, —COO—, —CONH— or —N(R$_N$)—, wherein R$_N$ represents an alkyl group of 1 to 5 carbon atoms, to form a ring with the sulfur atom, $R^{201}$ represents an optionally substituted aryl group having a halogenated alkyl group as an electron withdrawing group,

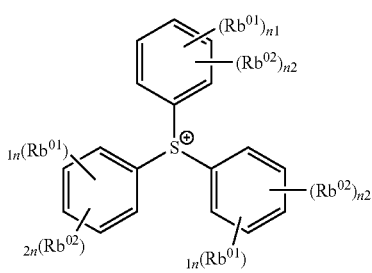  (ca-1-1)

in formula (ca-1-1), $Rb^{01}$ represents a halogenated alkyl group being an electron withdrawing group, $Rb^{02}$ represents an alkyl group of 1 to 5 carbon atoms, a plurality of $Rb^{01}$ and $Rb^{02}$ may be the same or different from each other, n2 represents an integer of 0 to 4, n1 represents an integer of 0 to 4; provided that at least one of n1 represents an integer of 1 to 4,

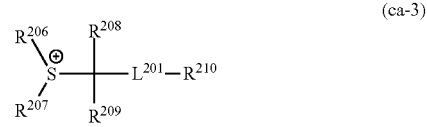  (ca-3)

in formula (ca-3), $R^{206}$ and $R^{207}$ each independently represents an aryl group, alkyl group or alkenyl group which may have a substituent, $R^{210}$ represents an aryl group which may have a substituent, an alkyl group which may have a substituent, an alkenyl group which may have a substituent or an —SO$_2$— containing cyclic group which may have a substituent, $R^{208}$ and $R^{209}$ each independently represents a hydrogen atom or an alkyl group of 1 to 5 carbon atoms, and $L^{201}$ represents —C(=O)— or —C(=O)—O—,

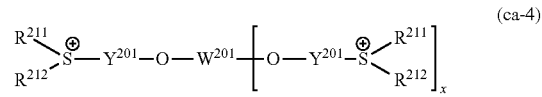  (ca-4)

in formula (ca-4), $R^{211}$ and $R^{212}$ each independently represents an aryl group, alkyl group or alkenyl group which may have a substituent, at least one of $R^{211}$ and $R^{212}$ has an electron withdrawing group, each $Y^{201}$ independently represents an arylene group, an alkylene group, or an alkenylene group, x represents 1 or 2, and $W^{201}$ represents a linking group having a valency of (x+1).

2. The resist composition according to claim 1, wherein the resin component comprises a polymeric compound (A1) comprising the structural unit (a0) and a polymeric compound (A2) comprising a structural unit (a9) represented by general formula (a9-1) shown below:

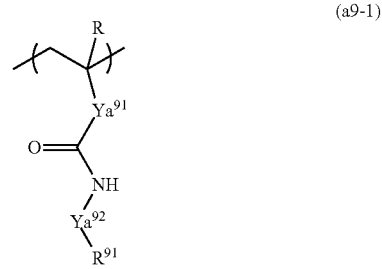  (a9-1)

wherein R represents a hydrogen atom, an alkyl group of 1 to 5 carbon atoms or a halogenated alkyl group of 1 to 5 carbon atoms; $Ya^{91}$ represents a single bond or a divalent linking group; $R^{91}$ represents a hydrocarbon group optionally having a substituent; and $Ya^{92}$ represents a divalent linking group.

3. The resist composition according to claim 2, wherein the polymeric compound (A1) further comprises a structural unit derived from hydroxystyrene or a hydroxystyrene derivative.

4. A method of forming a resist pattern, comprising:
   forming a resist film on a substrate using the resist composition according to claim 1;
   exposing the resist film; and
   developing the resist film to form a resist pattern.

5. A resist composition which generates acid upon exposure and exhibits changed solubility in a developing solution under action of acid,
   the resist composition comprising a base component (A') which exhibits changed solubility in a developing solution under action of acid and an acid diffusion control agent (D'),
   the base component (A') comprising a resin component comprising a structural unit (a0) represented by general formula (a0-1) shown below and a structural unit (a2') derived from an acrylate ester monomer having a log P value of 0.7 or less, and
   the acid diffusion control agent (D') has an acid dissociation constant of 1.5 or more:

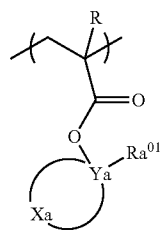
(a0-1)

wherein R represents a hydrogen atom, an alkyl group of 1 to 5 carbon atoms or a halogenated alkyl group of 1 to 5 carbon atoms; Ya represents a carbon atom; Xa represents an atomic group required to form an alicyclic hydrocarbon group with Ya; and $Ra^{01}$ represents an aromatic hydrocarbon group optionally having a substituent,
   wherein the acid diffusion control agent (D') is at least one selected from the group consisting of a compound represented by general formula (d1-1), a compound represented by general formula (d1-2) and a compound represented by general formula (d1-3):

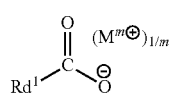
(d1-1)

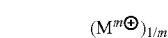
(d1-2)

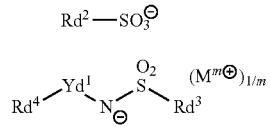
(d1-3)

wherein $Rd^1$ to $Rd^4$ represent a cyclic group which may have a substituent, a chain-like alkyl group which may have a substituent or a chain-like alkenyl group which may have a substituent, provided that, the carbon atom adjacent to the sulfur atom within the $Rd^2$ in the formula (d1-2) has no fluorine atom bonded thereto; Yd' represents a single bond or a divalent linking group; and $M^{m+}$ each independently represents a cation having a valency of m represented by general formulas (ca-1) to (ca-4),

(ca-1)

wherein $R^{201}$ to $R^{203}$ each independently represents an aryl group, alkyl group or alkenyl group which may have a substituent, and at least one of $R^{201}$ to $R^{203}$ has an electron withdrawing group, $R^{202}$ and $R^{203}$ may be mutually bonded to form a ring with the sulfur atom; however, in such a case, $R^{201}$ has an electron withdrawing group,

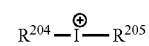
(ca-2)

wherein $R^{204}$ and $R^{205}$ each independently represents an aryl group, alkyl group or alkenyl group which may have a substituent, and at least one of $R^{204}$ and $R^{205}$ has an electron withdrawing group,

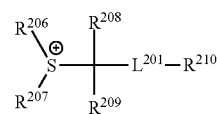
(ca-3)

wherein $R^{206}$ and $R^{207}$ each independently represents an aryl group, alkyl group or alkenyl group which may have a substituent, $R^{210}$ represents an aryl group which may have a substituent, an alkyl group which may have a substituent, an alkenyl group which may have a substituent or an —$SO_2$— containing cyclic group which may have a substituent, $R^{206}$ and $R^{207}$ may be mutually bonded to form a ring with the sulfur atom, $R^{208}$ and $R^{209}$ each independently represents a hydrogen atom or an alkyl group of 1 to 5 carbon atoms; and $L^{201}$ represents —C(=O)— or —C(=O)—O—,

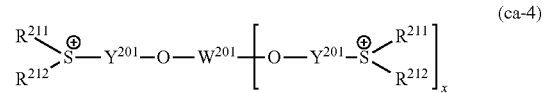
(ca-4)

wherein $R^{211}$ and $R^{212}$ each independently represents an aryl group, alkyl group or alkenyl group which may have a substituent, and at least one of $R^{211}$ and $R^{212}$ has an electron withdrawing group, each $Y^{201}$ independently represents an arylene group, an alkylene group, or an alkenylene group, x represents 1 or 2; and $W^{201}$ represents a linking group having a valency of (x+1).

6. The resist composition according to claim 5, wherein the resin component further comprises a structural unit (a9) represented by general formula (a9-1) shown below:

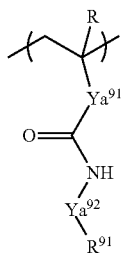

(a9-1)

wherein R represents a hydrogen atom, an alkyl group of 1 to 5 carbon atoms or a halogenated alkyl group of 1 to 5 carbon atoms; $Ya^{91}$ represents a single bond or a divalent linking group; $R^{91}$ represents a hydrocarbon group optionally having a substituent; and $Ya^{92}$ represents a divalent linking group.

7. The resist composition according to claim 6, wherein the resin component comprises:
   a polymeric compound (A4') comprising the structural unit (a2') and the structural unit (a9); and
   a polymeric compound (A3') comprising the structural unit (a0).

8. The resist composition according to claim 5, wherein the resin component comprises a polymeric compound (A1') comprising the structural unit (a0) and the structural unit (a2').

9. The resist composition according to claim 8, wherein the polymeric compound (A1') further comprises a structural unit (a9) represented by general formula (a9-1) shown below:

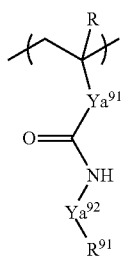

(a9-1)

wherein R represents a hydrogen atom, an alkyl group of 1 to 5 carbon atoms or a halogenated alkyl group of 1 to 5 carbon atoms; $Ya^{91}$ represents a single bond or a divalent linking group; $R^{91}$ represents a hydrocarbon group optionally having a substituent; and $Ya^{92}$ represents a divalent linking group.

10. The resist composition according to claim 8, wherein the polymeric compound (A1') further comprises a structural unit derived from hydroxystyrene or a hydroxystyrene derivative.

11. A method of forming a resist pattern, comprising:
   forming a resist film on a substrate using a resist composition according to claim 5;
   exposing the resist film; and
   developing the resist film to form a resist pattern.

12. A resist composition which generates acid upon exposure and exhibits changed solubility in a developing solution under action of acid, comprising:
   a base component (A') which exhibits changed solubility in a developing solution under action of acid and an acid diffusion control agent (D'), wherein the base component (A') comprises a resin component comprising a structural unit (a0) represented by general formula (a0-1) shown below:

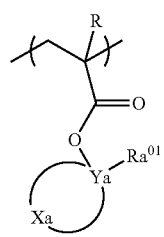

(a0-1)

wherein R represents a hydrogen atom, an alkyl group of 1 to 5 carbon atoms or a halogenated alkyl group of 1 to 5 carbon atoms; Ya represents a carbon atom; Xa represents an atomic group required to form an alicyclic hydrocarbon group with Ya; and $Ra^{01}$ represents an aromatic hydrocarbon group optionally having a substituent;
   and a structural unit (a2') derived from an acrylate ester monomer having a log P value of less than 1.2, wherein the acid diffusion control agent (D') has an acid dissociation constant of 1.5 or more, wherein the resin component comprises:
      a polymeric compound (A2') comprising the structural unit (a0) and the structural unit (a2'); and
      a polymeric compound (A3') comprising the structural unit (a0).

13. The resist composition according to claim 12, wherein the polymeric compound (A3') further comprises a structural unit derived from hydroxystyrene or a hydroxystyrene derivative.

14. A method of forming a resist pattern, comprising:
   forming a resist film on a substrate using the resist composition according to claim 12;
   exposing the resist film; and
   developing the resist film to form a resist pattern.

15. A resist composition which generates acid upon exposure and exhibits changed solubility in a developing solution under action of acid,
   the resist composition comprising a base component (A'') which exhibits changed solubility in a developing solution under action of acid,
   the base component (A'') comprising a resin component comprising a structural unit (a0) represented by general formula (a0-1) shown below, a structural unit (a9) represented by general formula (a9-1) shown below and a structural unit (a1) represented by general formula (a1-1) or (a1-2):

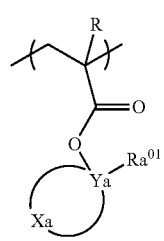

(a0-1)

wherein R represents a hydrogen atom, an alkyl group of 1 to 5 carbon atoms or a halogenated alkyl group of 1 to 5 carbon atoms; Ya represents a carbon atom; Xa represents an atomic group required to form an alicyclic hydrocarbon group with Ya; and $Ra^{01}$ represents an aromatic hydrocarbon group optionally having a substituent;

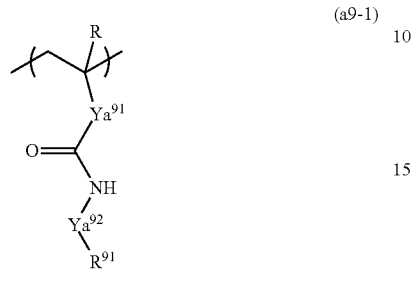

(a9-1)

wherein R represents a hydrogen atom, an alkyl group of 1 to 5 carbon atoms or a halogenated alkyl group of 1 to 5 carbon atoms; $Ya^{91}$ represents a single bond or a divalent linking group; $R^{91}$ represents a hydrocarbon group optionally having a substituent; and $Ya^{92}$ represents a divalent linking group;

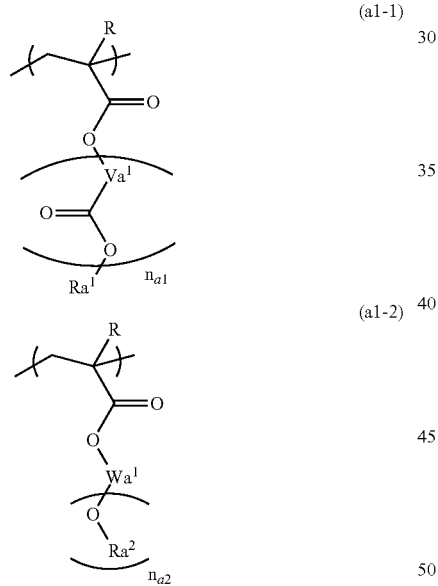

(a1-1)

(a1-2)

wherein R represents a hydrogen atom, an alkyl group of 1 to 5 carbon atoms or a halogenated alkyl group of 1 to 5 carbon atoms; $Va^1$ represents a divalent hydrocarbon group which may have an ether bond, a urethane bond or an amide bond; $n_{a1}$ represents an integer of 0 to 2; $Ra^1$ represents an acid dissociable group represented by the formula (a1-r-1); $Wa^1$ represents a hydrocarbon group having a valency of $n_{a2}+1$; $n_{a2}$ represents an integer of 1 to 3; and $Ra^2$ represents an acid dissociable group represented by the formula (a1-r-1) or (a1-r-3);

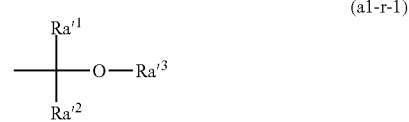

(a1-r-1)

wherein $Ra'^1$ and $Ra'^2$ represents a hydrogen atom or an alkyl group; and $Ra'^3$ represents a hydrocarbon group, provided that $Ra'^3$ may be bonded to $Ra'^1$ or $Ra'^2$;

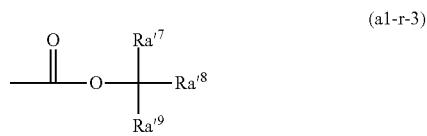

(a1-r-3)

wherein $Ra'^7$ to $Ra'^9$ each independently represents an alkyl group.

16. The resist composition according to claim 15, wherein the base component (A″) comprises a polymeric compound (A1″) comprising the structural unit (a0) and the structural unit (a9).

17. The resist composition according to claim 16, wherein the polymeric compound (A1″) further comprises a structural unit derived from hydroxystyrene or a hydroxystyrene derivative.

18. The resist composition according to claim 15, wherein the base component (A″) comprises:
a polymeric compound (A2″) comprising the structural unit (a0); and
a polymeric compound (A3″) comprising the structural unit (a9).

19. The resist composition according to claim 18, wherein the polymeric compound (A2″) further comprises a structural unit derived from hydroxystyrene or a hydroxystyrene derivative.

20. A method of forming a resist pattern, comprising:
forming a resist film on a substrate using the resist composition according to claim 15;
exposing the resist film; and
developing the resist film to form a resist pattern.

* * * * *